United States Patent
Farjad-rad et al.

(10) Patent No.: US 7,319,345 B2
(45) Date of Patent: Jan. 15, 2008

(54) WIDE-RANGE MULTI-PHASE CLOCK GENERATOR

(75) Inventors: Ramin Farjad-rad, Mountain View, CA (US); John W. Poulton, Chapel Hill, NC (US); John Eble, Chapel Hill, NC (US); Thomas H. Greer, III, Chapel Hill, NC (US); Robert Palmer, Carrboro, NC (US)

(73) Assignee: Rambus Inc., Los Altos, CA (US)

( * ) Notice: Subject to any disclaimer, the term of this patent is extended or adjusted under 35 U.S.C. 154(b) by 34 days.

(21) Appl. No.: 11/001,865

(22) Filed: Dec. 1, 2004

(65) Prior Publication Data

US 2005/0258883 A1 Nov. 24, 2005

Related U.S. Application Data

(60) Provisional application No. 60/572,508, filed on May 18, 2004.

(51) Int. Cl.
*H03K 17/00* (2006.01)

(52) U.S. Cl. .................. 327/99; 327/145; 327/158; 327/295

(58) Field of Classification Search .................. 327/99, 327/144–145, 238, 255, 158
See application file for complete search history.

(56) References Cited

U.S. PATENT DOCUMENTS

| | | | | |
|---|---|---|---|---|
| 5,126,691 A | * | 6/1992 | Mijuskovic et al. | 331/1 A |
| 5,268,656 A | * | 12/1993 | Muscavage | 331/45 |
| 5,708,382 A | * | 1/1998 | Park | 327/277 |
| 6,031,401 A | * | 2/2000 | Dasgupta | 327/116 |
| 6,104,228 A | * | 8/2000 | Lakshmikumar | 327/407 |
| 6,483,886 B1 | | 11/2002 | Sung et al. | |
| 6,864,752 B2 | * | 3/2005 | Caresosa et al. | 331/16 |
| 2002/0196883 A1 | | 12/2002 | Best et al. | |

OTHER PUBLICATIONS

PCT/US2005/017188 International Search Report and Written Opinion of the International Searching Authority Issued Oct. 10, 2005 by the International Searching Authority, European Patent Office, D-80298 Munich.
Search Report, European Patent Office in application No. EP 05 753 127.9 - 2206; Jun. 27, 2007; 2 pgs.

* cited by examiner

*Primary Examiner*—Dinh T. Le
(74) *Attorney, Agent, or Firm*—Shemwell Mahamedi LLP

(57) ABSTRACT

A wide-range multi-phase clock generator having a first clock generating circuit, a frequency divider circuit, and a plurality of multiplexers. The first clock generating circuit generates a plurality of first clock signals, each having a first frequency and a respective one of a plurality of different phase angles. The frequency divider circuit receives the plurality of first clock signals from the first clock generating circuit, and generates a plurality of second clock signals, each having a second frequency and a respective one of the plurality of different phase angles. The multiplexers each have a first input coupled to receive a respective one of the first clock signals and a second input coupled to receive a respective one of the second clock signals having substantially the same phase angle as the one of the first clock signals.

27 Claims, 24 Drawing Sheets

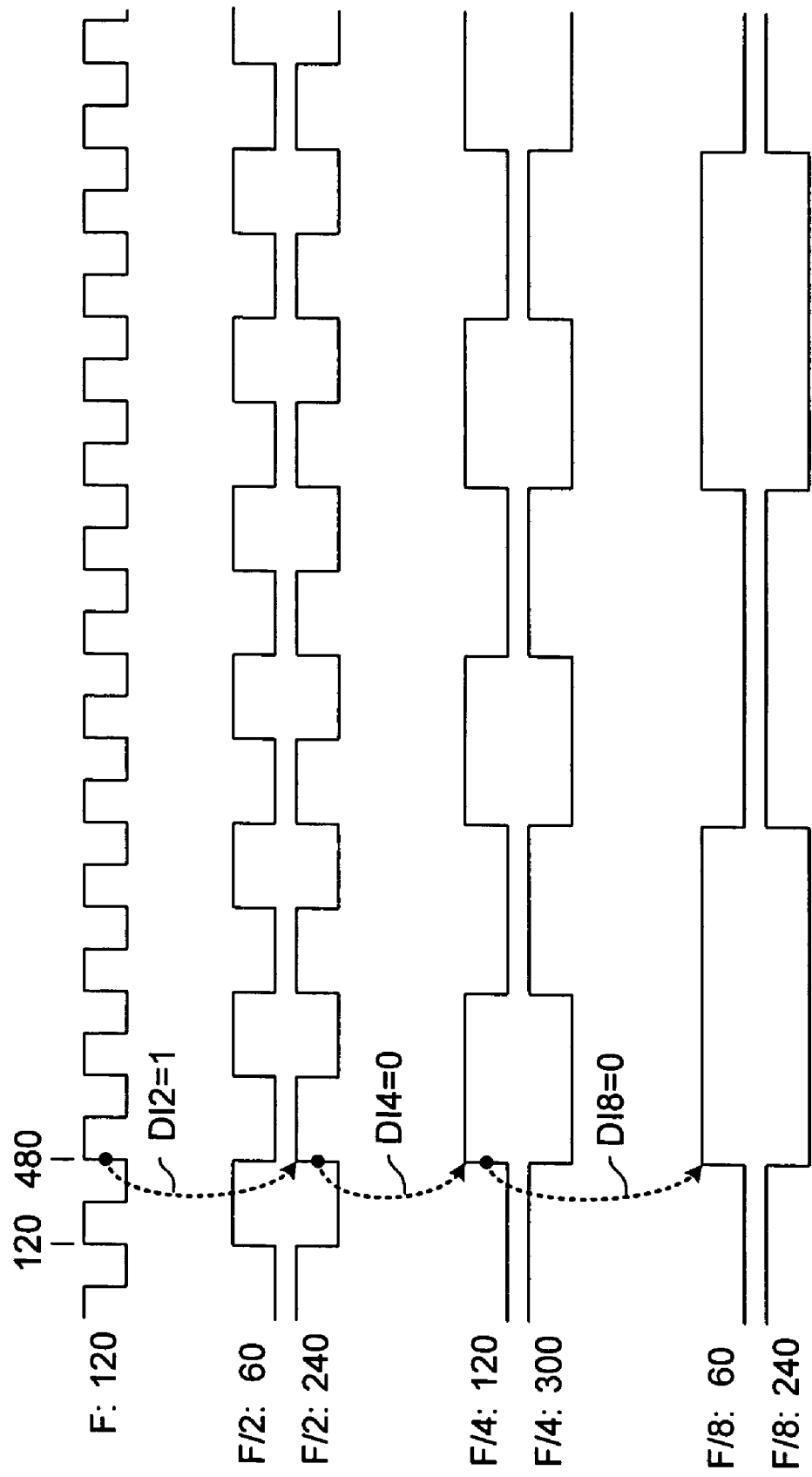

FIG. 13

| RS[1:0] | QS[1:0] | CLK₀ | CLK₀₋₉₀ | CLK₉₀ | CLK₉₀₋₁₈₀ | CLK₁₈₀ | CLK₁₈₀₋₂₇₀ | CLK₂₇₀ | CLK₂₇₀₋₀ |
|---|---|---|---|---|---|---|---|---|---|
| 0 0 | x x | $V1_F$ | $V12_F$ | $V2_F$ | $V41_F$ | $V3_F$ | $V12_F$ | $V4_F$ | $V41_F$ |
| 0 1 | 0 0 | $V1_{F/2(0)}$ | $V12_{F/2}$ | $V3_{F/2(90)}$ | $V41_{F/2}$ | $V1_{F/2(0)}$ | $V12_{F/2}$ | $N3_{F/2(90)}$ | $V41_{F/2}$ |
| 0 1 | 0 1 | $V1_{F/2(0)}$ | $V23_{F/2}$ | $V3_{F/2(90)}$ | $V34_{F/2}$ | $V1_{F/2(0)}$ | $V23_{F/2}$ | $N3_{F/2(90)}$ | $V34_{F/2}$ |
| 1 0 | 0 0 | $V1_{F/4(0)}$ | $V12_{F/4}$ | $V1_{F/4(90)}$ | $V41_{F/4}$ | $V1_{F/4(0)}$ | $V12_{F/4}$ | $N1_{F/4(90)}$ | $V41_{F/4}$ |
| 1 0 | 0 1 | $V1_{F/4(0)}$ | $V23_{F/4}$ | $V1_{F/4(90)}$ | $V34_{F/4}$ | $V1_{F/4(0)}$ | $V23_{F/4}$ | $N1_{F/4(90)}$ | $V34_{F/4}$ |
| 1 0 | 1 0 | $V1_{F/4(0)}$ | $V34_{F/4}$ | $V1_{F/4(90)}$ | $V23_{F/4}$ | $V1_{F/4(0)}$ | $V34_{F/4}$ | $N1_{F/4(90)}$ | $V23_{F/4}$ |
| 1 1 | 0 0 | $V1_{F/8(0)}$ | $V12_{F/8}$ | $V1_{F/8(90)}$ | $V41_{F/8}$ | $V1_{F/8(0)}$ | $V12_{F/8}$ | $N1_{F/8(90)}$ | $V41_{F/8}$ |
| 1 1 | 0 1 | $V1_{F/8(0)}$ | $V23_{F/8}$ | $V1_{F/8(90)}$ | $V34_{F/8}$ | $V1_{F/8(0)}$ | $V23_{F/8}$ | $N1_{F/8(90)}$ | $V34_{F/8}$ |
| 1 1 | 1 0 | $V1_{F/8(0)}$ | $V34_{F/8}$ | $V1_{F/8(90)}$ | $V23_{F/8}$ | $V1_{F/8(0)}$ | $V34_{F/8}$ | $N1_{F/8(90)}$ | $V23_{F/8}$ |
| 1 1 | 1 1 | $V1_{F/8(0)}$ | $V41_{F/8}$ | $V1_{F/8(90)}$ | $V12_{F/8}$ | $V1_{F/8(0)}$ | $V41_{F/8}$ | $N1_{F/8(90)}$ | $V12_{F/8}$ |

500

WIDE-RANGE MULTI-PHASE CLOCK GENERATOR

CROSS-REFERENCE TO RELATED APPLICATIONS

This application claims priority from, and hereby incorporates by reference, U.S. Provisional Application No. 60/572,508, filed May 18, 2004 and entitled "Multi-Phase and Multi-Rate Clock Generation."

FIELD OF THE INVENTION

The present invention relates to the field of high-speed signaling.

BACKGROUND

Multi-phase clock generators are commonly used in high-speed signaling systems to generate clock signals that are phase-aligned with points of interest in an incoming signal. For example, in a clock-data recovery system, one or more clock signals are typically aligned with the midpoints of data eyes and used to control a data sampling instant, while one or more other clock signals are aligned with edges of data eyes and used to recover timing information. Clock generators typically include a reference loop for generating a set of phase-distributed reference clock signals, referred to herein as phase vectors, and one or more clock interpolators for interpolating between selected phase vectors to generate output clock signals having an arbitrary phase.

In many signaling applications, the frequency of the phase vectors and output clock signals is fixed at a nominal operating frequency so that the reference loop and clock interpolators may be constructed with appropriate circuit elements and bias points particularly suited to the nominal operating frequency. As signaling rates progress further into the gigahertz range, however, signaling applications increasingly call for high speed devices that provide legacy support for lower signaling rates, with upper- and lower-end signaling rates sometimes differing by a factor of 10 or more. Traditionally, such wide-range operation has been achieved by adjusting the control voltage provided to a voltage-controlled oscillator within the reference loop, thereby adjusting the frequency of the phase vectors supplied to the clock interpolators and therefore the frequency of the output clock signals. Unfortunately, voltage-controlled oscillators designed to accommodate wide frequency ranges tend to include high-gain amplifiers that exhibit relatively high noise susceptibility and therefore increase jitter in the output clock signals. Also, time-consuming frequency re-locking is often required within the voltage-controlled oscillator when changing from one operating frequency to another.

BRIEF DESCRIPTION OF THE DRAWINGS

The present invention is illustrated by way of example, and not by way of limitation, in the figures of the accompanying drawings and in which like reference numerals refer to similar elements and in which:

FIG. 8A illustrates an exemplary set of phase vectors generated within the clock generator of FIG. 6;

FIG. 13 is a table illustrating the operation of the selector circuit of FIG. 9 according to one embodiment;

DETAILED DESCRIPTION

Figure 1:
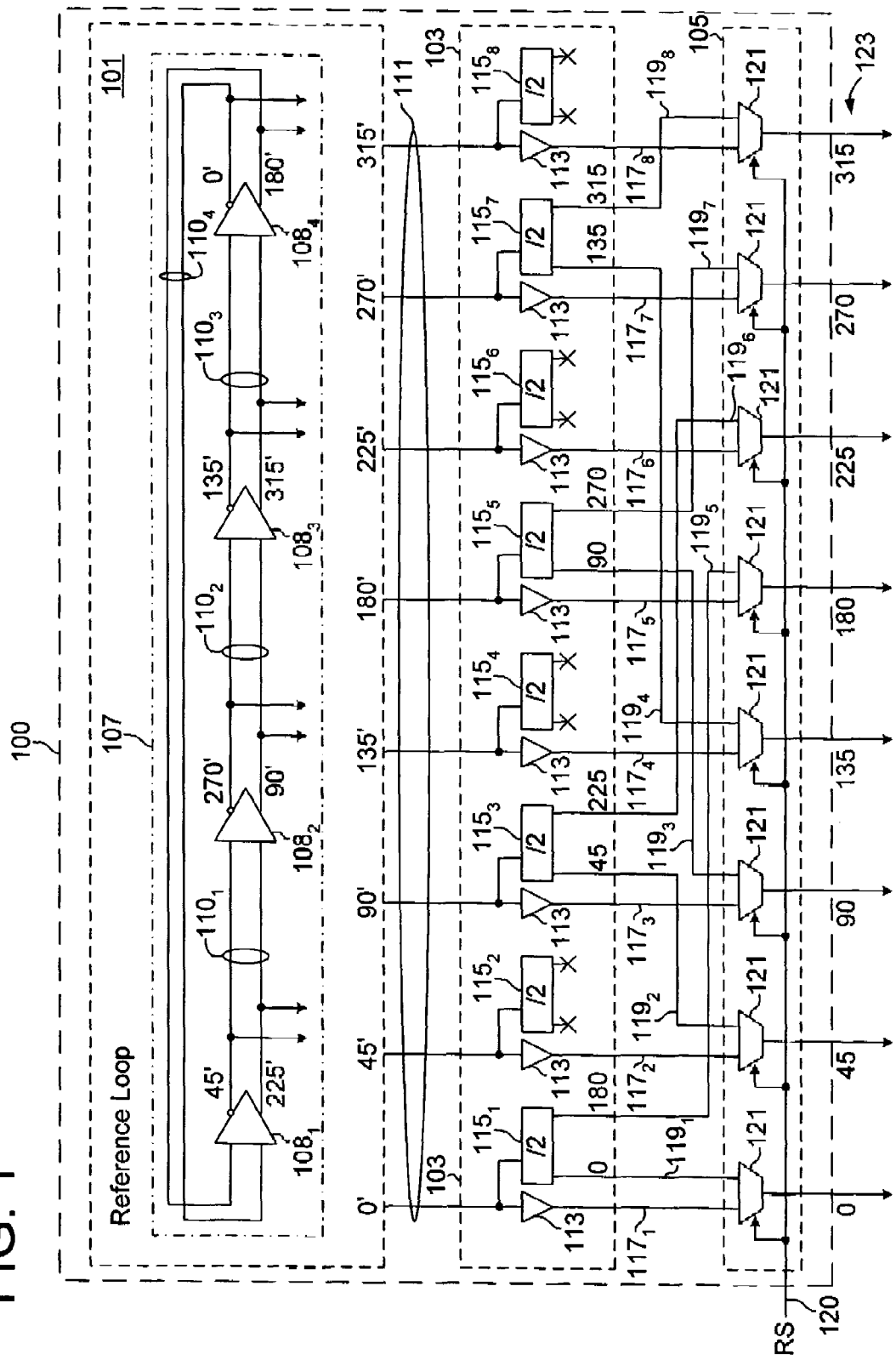
FIG. 1 illustrates an embodiment of a wide-range multi-phase clock generator.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "exemplary" is used herein to express but an example, and not a preference or requirement.

A clock generator for generating clock signals that span a wide range of operating frequencies is disclosed in various embodiments. In one embodiment, a frequency divider circuit generates multiple sets of output clock signals by dividing the frequency of reference-loop-generated phase vectors by a set of divisor values. The divisor value, N, used to generate each set of output clock signals may be virtually any value, thereby allowing for generation output clock signals that range from a reference loop output frequency, F, to F/N. In one embodiment, for example, divisor values of 1, 2, 4 and 8 are used to provide respective sets of phase vectors having operating frequencies that range from F to F/8, without having to change the frequency of the phase vectors generated by the reference loop. Accordingly, the frequency divider circuit may be used in conjunction with a relatively narrow-range, low-noise reference loop to provide low-jitter output clock signals that exhibit a wide range of operating frequencies. Also, because the transition from one frequency range to another may be accomplished by selecting a different set of output clock signals and without changing the frequency of the reference-loop-generated phase vectors, delay otherwise required for frequency re-lock in the reference loop may be avoided.

Embodiments of a Wide-Range Multi-Phase Clock Generator

FIG. 1 illustrates a wide-range multi-phase clock generator 100 according to one embodiment. The clock generator 100 includes a reference loop 101, frequency divider circuit 103 and selector circuit 105. In the embodiment shown, the reference loop 101 is a phase locked loop that includes a voltage-controlled oscillator 107 (VCO) to generate a set of reference phase vectors 111. The VCO 107 includes a number of differential inverter stages $108_1$-$108_4$ coupled in daisy-chained fashion (i.e., outputs of a given inverter stage 108 coupled to inputs of the next inverter stage) with the outputs of the final inverter stage $108_4$ cross-coupled to the inputs of the initial inverter stage $108_1$. That is, the complement output (indicated by a negation symbol 'o' in FIG. 1) of the final inverter stage $108_4$ is coupled to the non-complement input of the initial stage inverter stage $108_1$, and the non-complement output of the final stage $108_4$ is coupled to the complement input of the initial stage $108_1$. Each of the inverter stages 108 within the VCO 107 generates a differential clock signal pair (i.e., one of clock signal pairs $110_1$-$110_4$) that is phase offset from an input clock signal pair by a phase angle according to the total number of inverter stages 108. That is, due to the cross-coupled connection between the final and initial inverter stages $108_4$ and $108_1$, the VCO 107 subdivides a full reference clock cycle (i.e., the cycle time of any one of the reference phase vectors 111 generated by the reference loop) by 2M, where M is the number of inverter stages. Thus, in the particular embodiment of FIG. 1, the four inverter stages $108_1$-$108_4$ yield a total of eight phase vectors that are offset from one another by 45° phase angles (i.e., a full reference clock cycle, 360°, divided by 8). Selecting an arbitrary one of the phase vectors 111 to be a 0 degree phase vector, the phase vectors 111 output by the reference loop 101 have phase offsets of 0, 45, 90, 135, 180, 225, 270 and 315 degrees and oscillate at a common frequency, F, referred to herein as the reference loop frequency. The reference phase vectors 111 are marked by prime indicators (i.e., "'") to distinguish them from nominally same-phase clock signals 123 output from the clock generator 100. As discussed below, the output clock signals 123 may be phase offset from the reference phase vectors by an arbitrary phase angle due to delay introduced within the frequency divider circuit and/or the selector circuit. Though not shown in FIG. 1, the reference loop 101 may include additional circuitry to adjust one or more control voltages used to establish the slew rate of the inverter stages $108_1$-$108_4$ within the VCO 107, thereby enabling the reference loop frequency to be increased or decreased. For example, in one embodiment, the reference loop frequency is adjustable between a relatively narrow band from 0.8*F to F with divisors 8, 4, 2 and 1 being used to produce output clock signals having frequencies that range from 0.1*F to 0.125*F, 0.2*F to 0.25*F, 0.4*F to 0.5*F, and 0.8*F to F, respectively, thereby achieving a decade frequency range in the output clock signals (i.e., $F_{MAX}$=10$F_{MIN}$) with a narrow-band reference loop. The reference loop frequency range may be larger or smaller in alternative embodiments to achieve a corresponding increase or decrease the frequency range of the frequency-divided output clock signals. Also, in alternative embodiments, more or fewer inverter stages 108 may be provided within the VCO to provide finer or coarser phase offsets in the reference loop output. Further, other types of clock generating circuits may be used to produce the reference phase vectors 111 including, without limitation, a delay locked loop or clock-multiplying delay locked loop. Also, an LC-oscillator or other type of oscillator may be used within VCO 107 instead of the ring oscillator formed by inverter stages 108. More generally, any circuit for generating a set of reference phase vectors 111 may be used in alternative embodiments of the clock generator 100, with the set of reference phase vectors having any desired frequency and phase distribution within the reference loop frequency.

Figure 2:
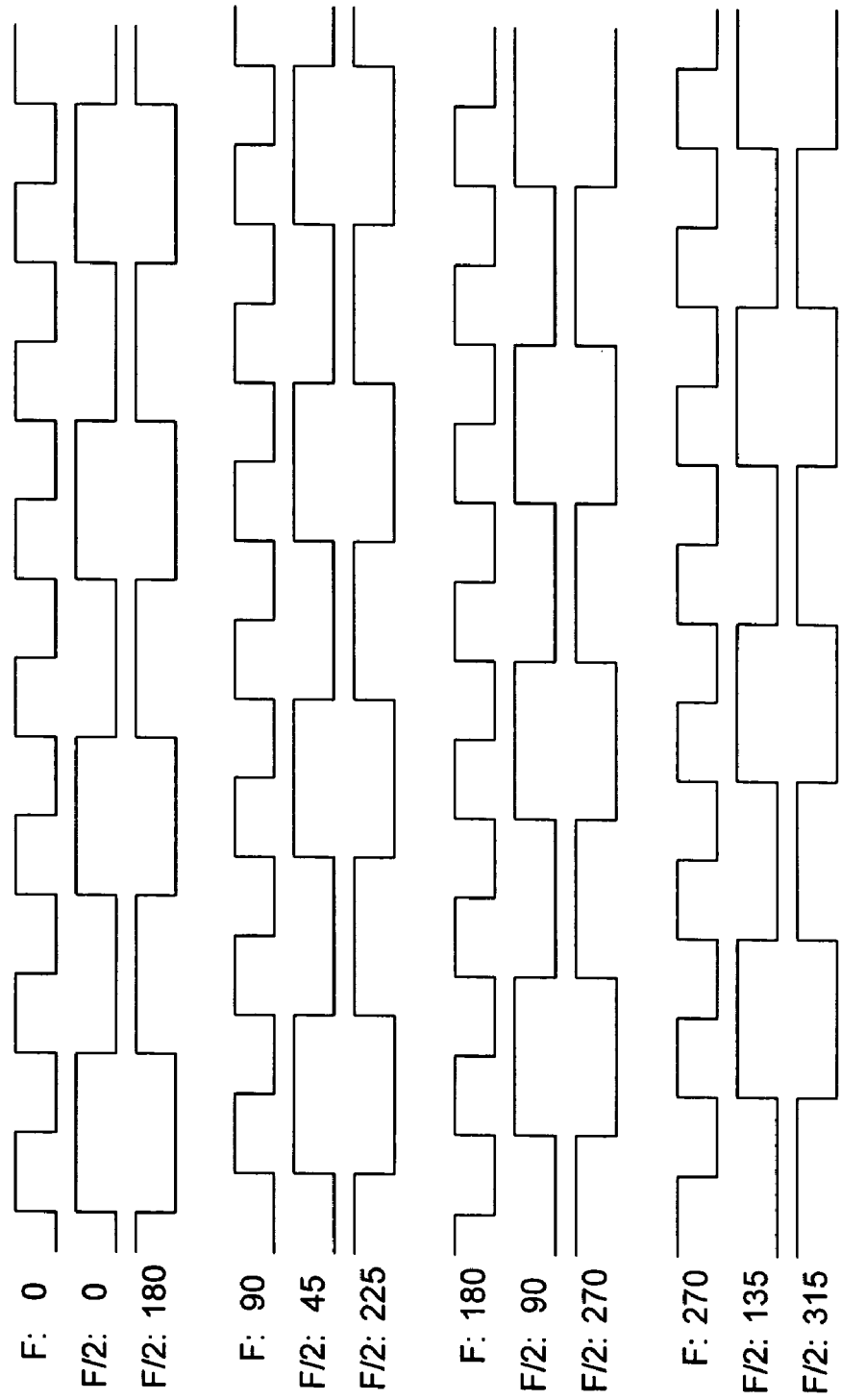
FIG. 2 illustrates selectable-frequency output clock signals generated by the clock generator of FIG. 1.

In the embodiment of FIG. 1, the frequency divider circuit 103 receives the reference phase vectors and outputs two sets of phase vectors in response: a divide-by-two vector set (i.e., a "/2" vector set) including phase vectors $119_1$-$119_8$, and a unity vector set (also referred to herein as a /1 vector set to indicate division by unity) including phase vectors $117_1$-$117_8$. The frequency divider circuit 103 includes a set of buffer amplifiers 113 to convert the reference vectors from reduced-swing to complementary-MOS (CMOS) signal levels and provide the resulting level-converted reference phase vectors $117_1$-$117_8$ to first inputs of respective multiplexers 121 within the selector circuit 105, thus providing a unity vector set. In alternative embodiments, the buffer amplifiers 113 may be omitted and the reference phase vectors 111 supplied directly from the reference loop to the multiplexers 121. The frequency divider circuit 103 also includes a set of divide-by-two circuits $115_1$-$115_8$ each coupled to receive a respective one of the reference phase vectors 111. In one embodiment, each divide-by-two circuit 115 is implemented by a complementary-output edge-triggered toggle element, such as a storage element, that toggles between logic high and logic low states at each rising edge of an incoming reference phase vector. By this operation, the complementary outputs of the toggle element transition once for every two transitions of the reference phase vector, thereby producing two frequency-divided phase vectors having half the frequency of the reference phase vector. Also, because the frequency-divided phase vectors have twice the period of the reference phase vectors, the phase angles of the frequency-divided phase vectors are effectively halved. Referring to FIG. 2, for example, reference phase vectors having frequency F and 0°, 90°, 180° and 270° phase angles, yield frequency-divided phase vectors having frequency F/2 and 0°, 45°, 90° and 135° phase angles, respectively, along with complementary frequency-divided phase vectors having phase angles of 180° (0+180°), 225° (45°+180°), 270° (90°+180°), and 315° (135°+180°). Referring to FIGS. 1 and 2, divide-by-two circuit $115_1$ receives a reference phase vector having a 0° phase angle and generates frequency-divided phase vectors having phase angles of 0° and 180°; divide-by-two circuit $115_3$ receives a reference phase vector having a 90° phase angle and generates frequency-divided phase vectors having phase angles of 45° and 225°; divide-by-two circuit $115_5$ receives a reference phase vector having a 180° phase angle and generates frequency-divided phase vectors having phase angles of 90° and 270°; and divide-by-two circuit $115_7$ receives a reference phase vector having a 270° phase angle and generates frequency-divided phase vectors having phase angles of 135° and 315°. The complementary phase vectors generated by divide-by-two circuits $115_1$, $115_3$, $115_5$ and $115_7$ are supplied to second inputs of the multiplexers 121 within the selector circuit 105 in accordance with their phase angles so that each multiplexer 121 receives a unity phase vector and a frequency-divided phase vector each having nominally the same phase angle. The selector circuit 105 additionally receives a rate select signal 120 (RS) which is supplied to control inputs of the multiplexers 121 to select either the unity phase vectors or the frequency-divided phase vectors to be output as output clock signals 123. Because the output clock signals have the same (or at least nominally the same) phase distribution in both the unity and divide-by-two phase vector sets, the frequency divider circuit 103 and selector circuit 105 effectively expand the frequency range of the output clock signals 123 relative to the frequency range of the reference loop 101. For example, if the reference loop 101 is capable of achieving a reference loop frequency that extends from F/2 to F, the overall frequency range of the output clock signals 123 generated by clock generator 100 is expanded to F/4 to F. Further, in the case where a signaling rate is to be transitioned between operating frequencies F and F/2, the transition may be effected by changing the state of the rate select signal 120, avoiding frequency adjustment within the reference loop and any re-lock delay associated therewith.

In one embodiment, each of the reference phase vectors 111 output by reference loop 101 is a differential signal formed by a combination of the reference phase vector and its complement, conducted on respective signal lines of a differential pair. Thus, generating a complement of a given reference phase vector or output clock signal may be effected by reversing the coupling of the component signal lines of the differential pair at the inputs of the recipient circuit. Accordingly, while single-ended signal lines are depicted in FIG. 1 and other figures described below, in all such cases the signal lines may be differential pairs for conducting differential clock signals, thus reducing generation of complementary clock signals to reversing (i.e., twisting) the differential pair at some point along its extension from a given output to a given input.

Figure 3:
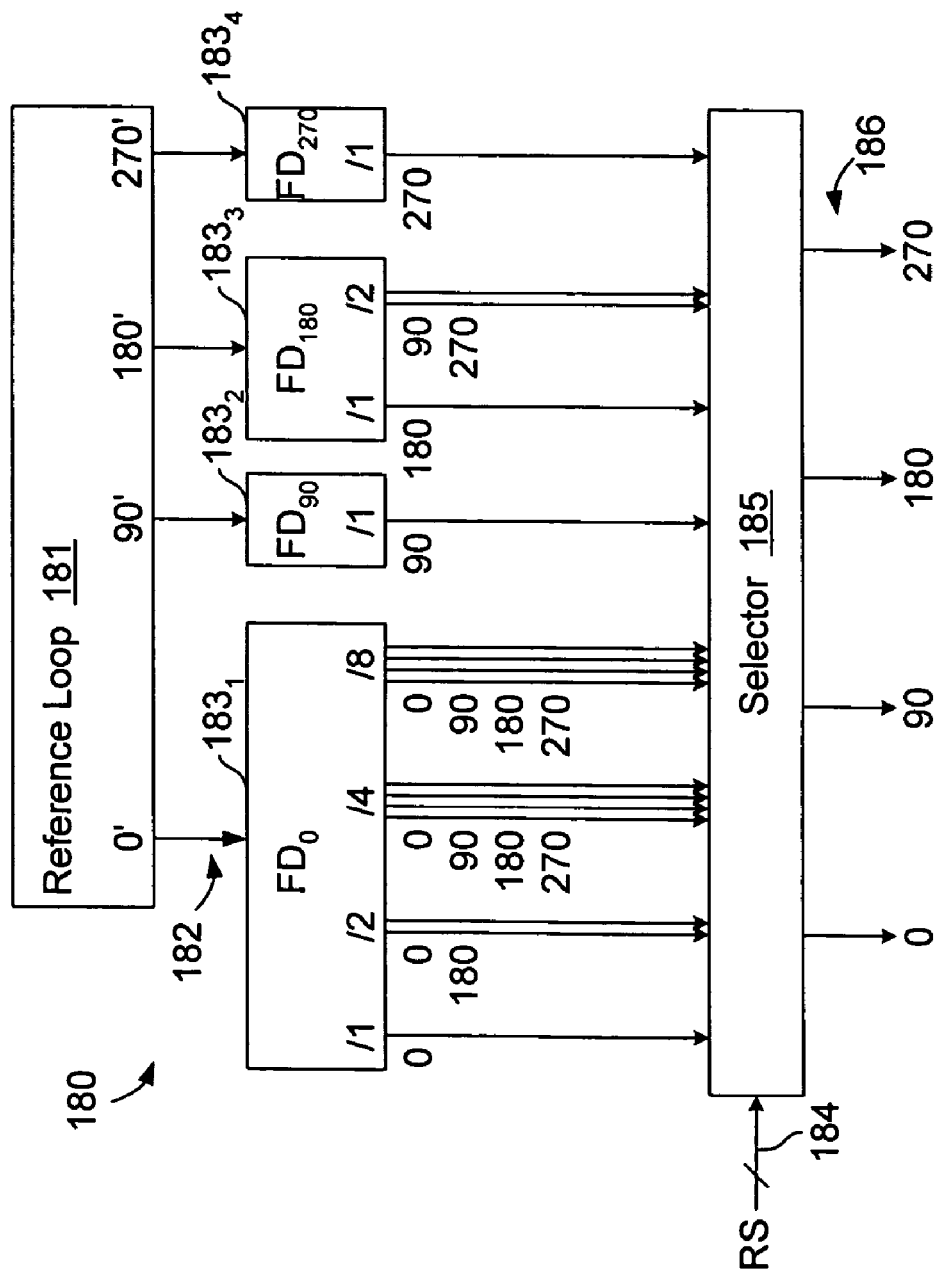
FIG. 3 illustrates another embodiment of a wide-range multi-phase clock generator.

FIG. 3 illustrates a wide-range multi-phase clock generator 180 according to an alternative embodiment. The clock generator 180 includes a reference loop 181, frequency divider circuits $183_1$-$183_4$, and selector circuit 185. In the particular embodiment shown, the reference loop 181 generates four reference phase vectors 182 that are evenly phase distributed (i.e., at phase angles 0° 90°, 180° and 270°) within a reference clock cycle. In alternative embodiments, more or fewer reference phase vectors may be generated by the reference loop 181. The frequency divider circuit $183_1$ is coupled to receive the 0° reference phase vector and generates a single unity (i.e., /1) phase vector having a 0 degree phase angle, two divide-by-two (i.e., /2) phase vectors having 0° and 180° phase angles, four divide-by-four (i.e., /4) phase vectors having 0°, 90°, 180° and 270° phase angles, and four divide-by-eight (i.e., /8) phase vectors having 0°, 90°, 180° and 270° phase angles. Frequency divider circuits $183_2$ and $183_4$ are coupled to receive the 90° and 270° reference phase vectors and generate corresponding 90° and 270° unity phase vectors. Frequency divider circuit $183_3$ receives the 180° reference phase vector and generates a corresponding 180° unity phase vector and /2 phase vectors having 90° and 270° phase angles. The selector circuit receives the sets of unity phase vectors, /2 phase vectors, /4 phase vectors and /8 phase vectors at respective input ports, and outputs one of the sets of phase vectors as output clock signals 186 according to the state of a multi-bit rate select signal 184 (RS). By this arrangement, the output clock signals 186 generated by the clock generator 180 range from the maximum frequency of the reference loop, $F_{MAX}$, to the minimum frequency of the reference loop, $F_{MIN}$, divided by 1, 2, 4 or 8, thereby providing a wide range of output clock frequencies using a relatively narrow-band reference loop 181.

Figure 4:
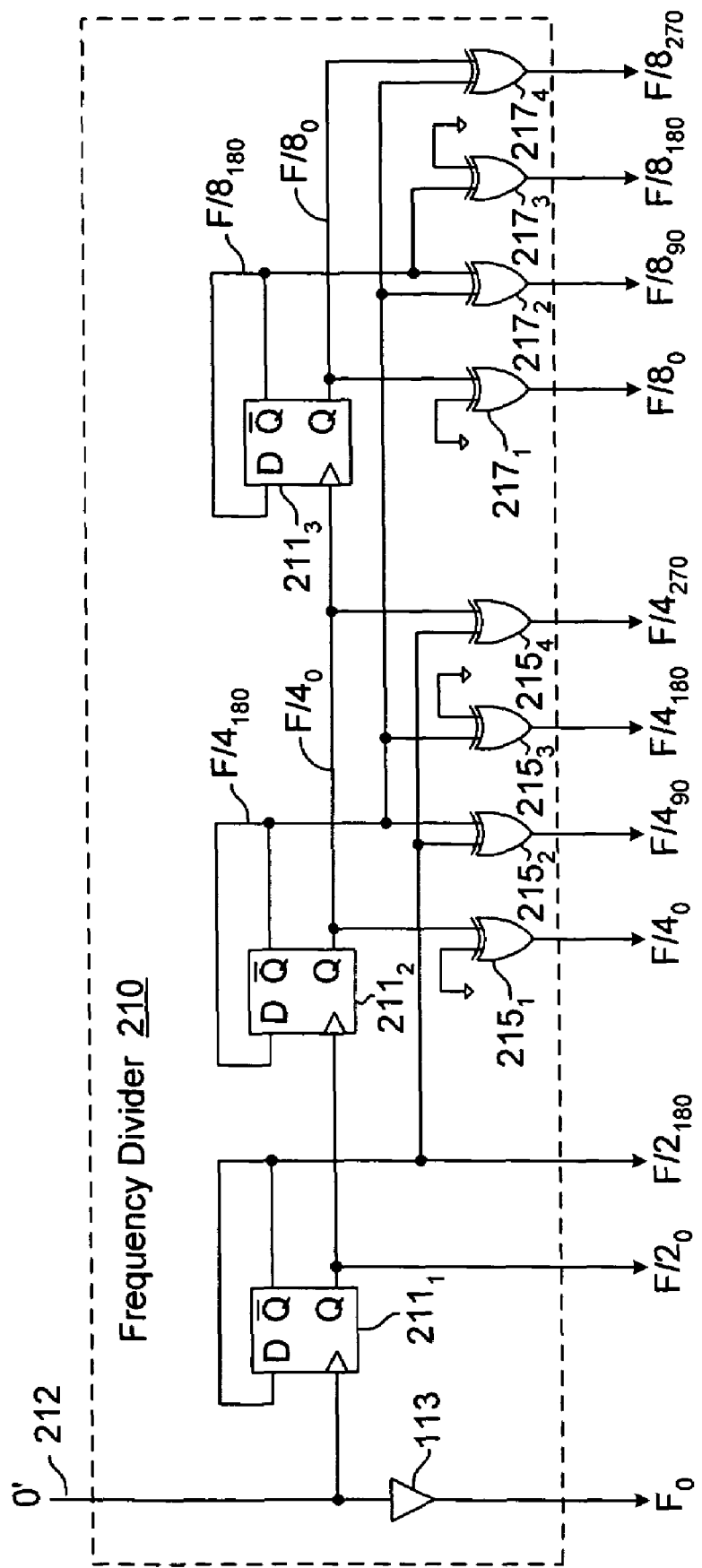
FIG. 4 illustrates an embodiment of a frequency divider circuit that may be used to implement the frequency divider circuit within the clock generator of FIG. 3.

FIG. 4 illustrates an embodiment of a frequency divider circuit 210 that may be used to implement the frequency divider circuit $183_1$. The frequency divider circuit 210 includes a buffer amplifier 113, edge-triggered storage elements $211_1$-$211_3$ (storage elements in this example), and exclusive-OR gates $215_1$-$215_4$ and $217_1$-$217_4$. The buffer amplifier 113 is coupled to receive a 0° reference phase vector 212 and generates a level-converted unity phase vector, $F_0$, in response. Buffer amplifier 113 may be omitted in alternative embodiments. Each of the storage elements $211_1$-$211_3$ includes a data input (D), clock input (indicated by clock input symbol ">"), and inverting and non-inverting outputs, /Q and Q. As shown, the inverting output of each storage element 211 is fed back to the data input of the storage element to effect a toggle configuration.

The reference phase vector 212 is supplied to the clock input of storage element $211_1$, thereby producing complementary clock signals $F/2_0$ and $F/2_{180}$ (i.e., clock signals having one-half the frequency of the reference phase vector and 0° and 180° phase angles). The $F/2_0$ clock signal is supplied to the clock input of storage element $211_2$ which, in response, generates complementary clock signals $F/4_0$ and $F/4_{180}$ (i.e., clock signals having one-fourth the frequency of the reference phase vector, and 0° and 180° phase angles). The $F/4_0$ clock signal is supplied to the clock input of storage element $211_3$ which, in response, generates complementary clock signals $F/8_0$ and $F/8_{180}$ (i.e., clock signals having one-eighth the frequency of the reference phase vector, and 0° and 180° phase angles).

Figure 5:
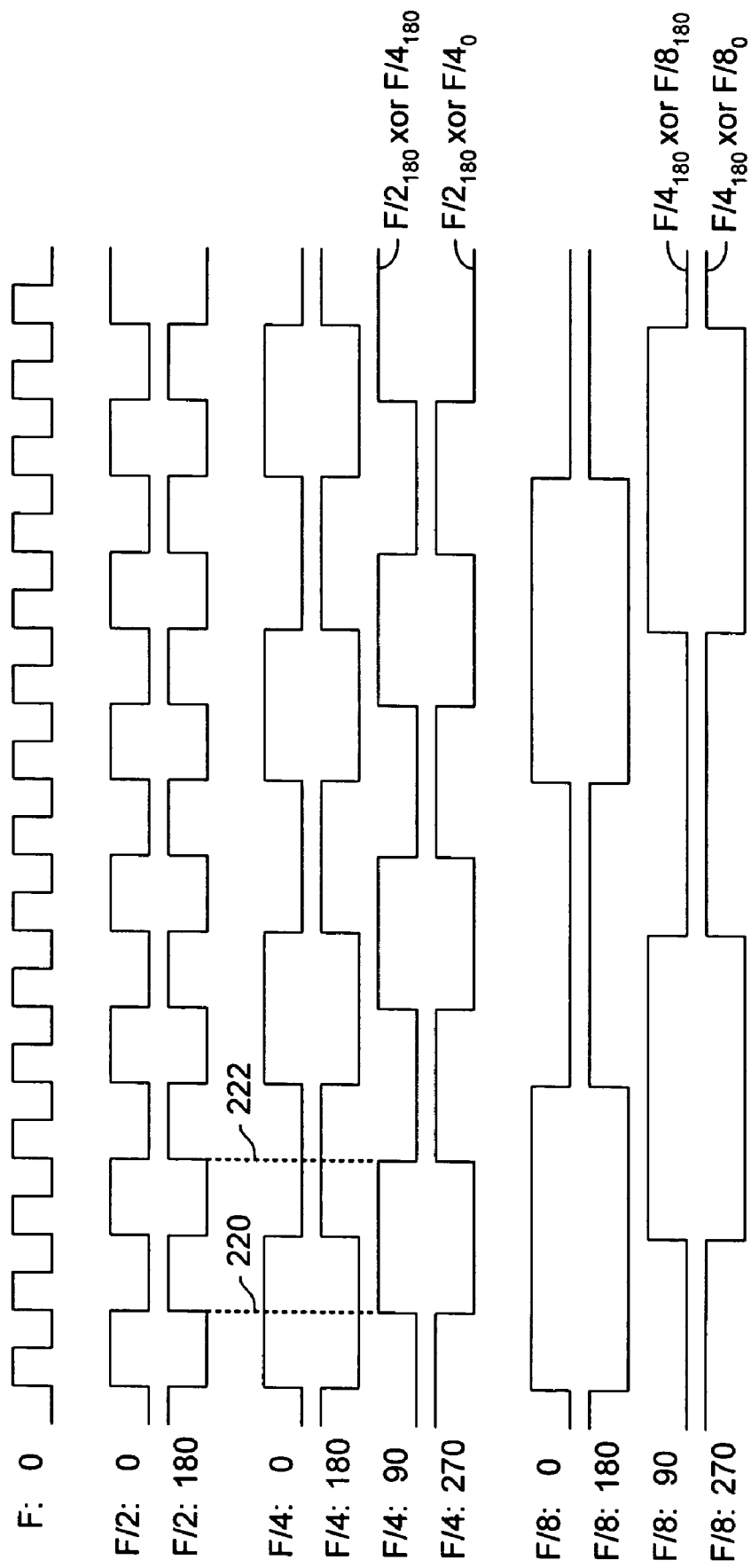
FIG. 5 illustrates an exemplary set of phase vectors generated by the frequency divider circuit of FIG. 4.

Still referring to FIG. 4, the $F/2_{180}$ and $F/4_{180}$ signals are supplied to respective inputs of exclusive-OR gate $215_2$ and the $F/2_{180}$ and $F/4_0$ signals are supplied to respective inputs of exclusive-OR gate $215_4$. Referring to FIG. 5, which illustrates the phase vectors generated by the frequency divider circuit of FIG. 4, it can be seen that the $F/2_{180}$ signal (F/2: 180) has a state opposite the state of the $F/4_{180}$ signal for a first half period of the F/4 cycle time that begins at the F/4 90° phase offset (i.e., at time 220), and the same state as the $F/4_{180}$ signal for the remaining half period of the F/4 cycle time. Thus, referring to FIGS. 4 and 5, the $F/2_{180}$ and $F/4_{180}$ signals may be combined in exclusive-OR gate $215_2$ to generate signal $F/4_{90}$; a phase vector having one-fourth the reference loop frequency and a 90° phase angle. Similarly, because the $F/2_{180}$ signal has a state opposite the state of the $F/4_0$ signal for a first half period of the F/4 cycle time that begins at the F/4 270° phase offset (i.e., at time 222), and the same state as the $F/4_0$ signal for the remaining half period of the F/4 cycle time, the $F/2_{180}$ and $F/4_0$ signals may be combined in exclusive-OR gate $215_4$ to generate signal $F/4_{270}$; a phase vector having one-fourth the reference loop frequency and a 270° phase angle. Still referring to FIGS. 4 and 5, it can be seen that the $F/4_{180}$ signal may be exclusive-ORed with $F/8_{180}$ in exclusive-OR gate $217_2$ and with $F/8_0$ in exclusive-OR gate $217_4$ to generate phase vectors $F/8_{90}$ and $F/8_{270}$, respectively. Exclusive-OR gates $215_1$, $215_3$, $217_1$ and $217_3$ have first inputs coupled to receive phase vectors $F/4_0$, $F/4_{180}$, $F/8_0$ and $F/8_{180}$, respectively, and grounded second inputs. By this arrangement, the phase vectors $F/4_0$, $F/4_{180}$, $F/8_0$ and $F/8_{180}$ pass through the exclusive-OR gates $215_1$, $215_3$, $217_1$ and $217_3$ but are phase delayed by the exclusive-OR signal propagation time to match the phase delay in clock signals $F/4_{90}$, $F/4_{270}$, $F/8_{90}$ and $F/8_{270}$ resulting from signal propagation through exclusive-OR gates $215_2$, $215_4$, $217_2$ and $217_4$.

It should be noted that various changes may be made to the frequency divider circuit 210 in alternative embodiments. For example, buffer amplifiers may be provided at the outputs of each of the exclusive-OR gates 215, 217 and/or the outputs of the storage element $211_1$ to buffer the corresponding clock signals output from the frequency divider circuit 210. Also, one or more delay elements or delay circuits may be provided in the path from the inverting output of storage element $211_1$ to the inputs of the exclusive-OR gates $215_2$ and $215_4$ to delay the $F/2_{180}$ signal as necessary to match the propagation delay through the storage element $211_2$. Similarly, one or more delay circuits may be provided in the path from the inverting output of the storage element $211_2$ to the inputs of exclusive-OR gates $217_2$ and $217_4$ to delay the $F/4_{180}$ signal as necessary to match the propagation delay through storage element $211_3$. Further, the storage elements 211 may each be loadable flip-flops (i.e., having a multiplexed data input to select either a preload data value or the fed-back output value) or may be coupled to a system reset line to ensure that the storage elements 211 are initialized to a predetermined state. Also, referring to FIG. 3, it should be noted that all four of the frequency divider circuits 183 may be implemented as shown in FIG. 4 (i.e., with unused outputs being left unconnected), or by removing unnecessary circuit elements. For example, each of the frequency divider circuits $183_2$ and $183_4$ may implemented by a buffer amplifier and, if desired for load matching purposes, a storage element or other circuit element to match the signal loading arrangement in the frequency divider circuit 210 of FIG. 4. Similarly, divider circuit $183_3$ may be implemented using a buffer amplifier and frequency-dividing storage element that correspond to amplifier 113 and storage element $211_1$ of FIG. 4 and, if desired for load matching purposes, a loading storage element and pair of exclusive-OR gates (or other load elements) may be coupled to the output of the frequency-dividing storage element to match the signal loading arrangement in the frequency divider circuit 210.

Figure 6:
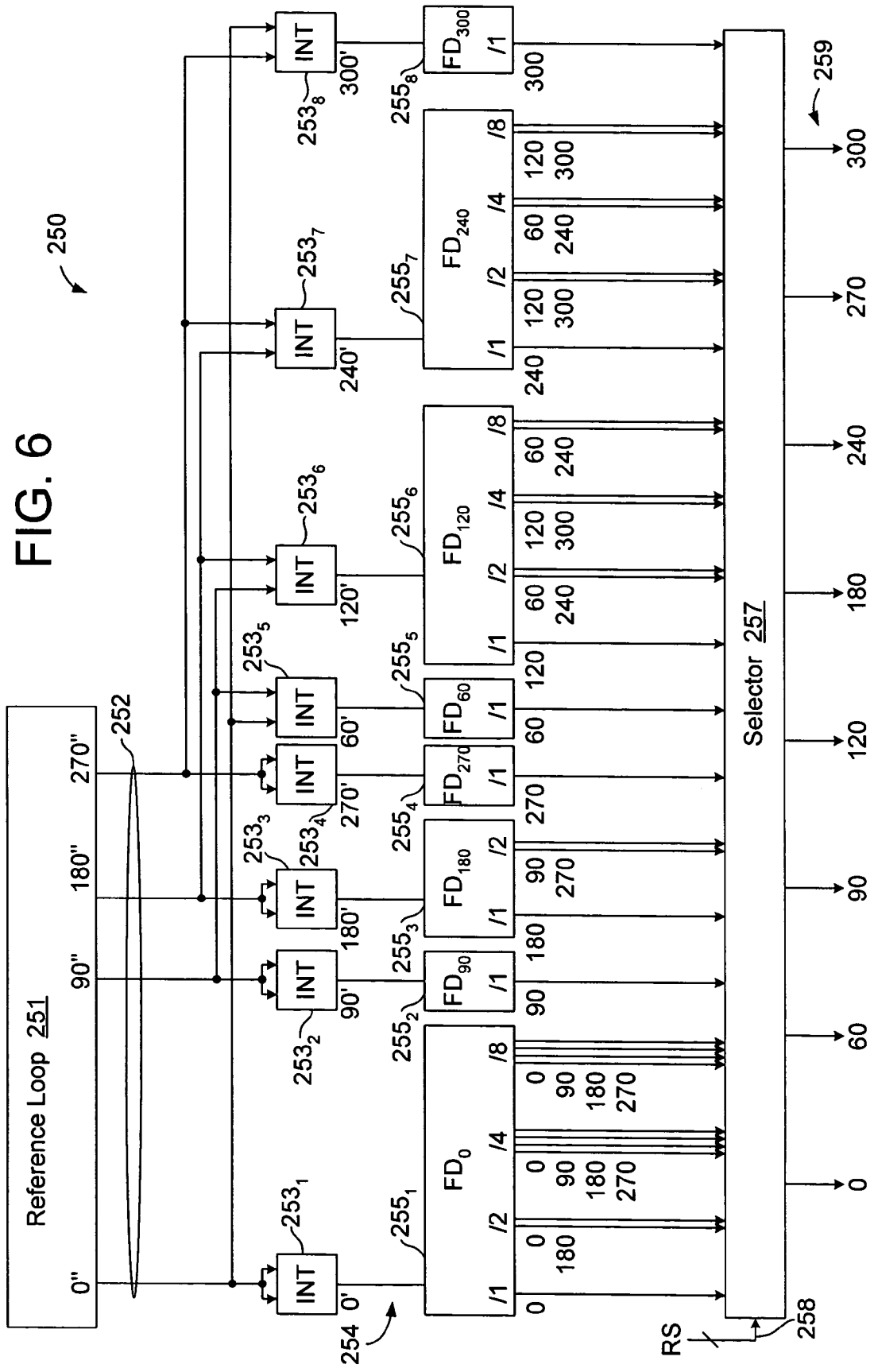
FIG. 6 illustrates another embodiment of a wide-range multi-phase clock generator.

FIG. 6 illustrates an embodiment of a wide-range multi-phase clock generator 250 that generates output clock signals 259 having selectable frequencies that range from F to F/8 with phase angles of 0°, 60°, 90°, 120°, 180°, 240°, 270° and 300°. As a matter of terminology, the 0°, 90°, 180° and 270° phases are referred to herein as primary phases, primary-phase clock signals or primary phase vectors, and the 60°, 120°, 240° and 300° degree phases are referred to herein as secondary phases, secondary-phase clock signals or secondary phase vectors. The primary and secondary phases may include more or fewer constituent clock signals and/or may have different phase angles in alternative embodiments. The 90° and 270° primary phase vectors may be used, for example, to sample a data waveform having two data valid intervals (i.e., two data eyes) per clock cycle, and the 0° and 180° primary phase vectors may be used to sample edges of the data waveforms. The 60° and 120° secondary phase vectors may be used for oversampling, for example, to determine whether a transition has occurred within the data waveform near in time to the 90° data sampling point, and the 240° and 300° phase vectors may similarly be used to oversample the data waveform to determine whether a transition has occurred near in time to the 270° data sampling point. In other embodiments, the output clock signals 259 may have different frequencies, phase angles and/or may be used for other purposes.

The clock generator 250 includes a reference loop 251, interpolators $253_1$-$253_8$, divider circuits $255_1$-$255_8$ and selector circuit 257. In the particular embodiment shown, the reference loop 251 generates four reference phase vectors 252 that are evenly phase distributed (i.e., at primary phase angles 0°, 90°, 180° and 270°) within a reference clock cycle. In alternative embodiments, more or fewer reference phase vectors 252 may be generated by the reference loop 251.

The interpolators $253_1$-$253_8$ are used to generate interpolated phase vectors 254 and include fixed-phase interpolators $253_1$-$253_4$ to generate primary phase vectors and mixed-phase interpolators $253_5$-$253_8$ to generate secondary phase vectors. In the embodiment shown, each of the interpolators 253 includes leading and trailing phase vector inputs and interpolates between the two input phase vectors in accordance with a weighting value to produce an interpolated phase vector 254 having a phase angle that falls between the phase angles of the input phase vectors. In the case of the fixed-phase interpolators $253_1$-$253_4$, the same reference phase vector is supplied to both phase vector inputs so that the resulting interpolated phase vector has nominally the same phase angle as the reference phase vector (i.e., one of the four primary phase angles) but is offset by the propagation delay through the interpolator 253. Thus, the interpolated phase vectors 254 generated by the fixed-phase interpolators are depicted in FIG. 6 as having the same phase angles as the reference phase vectors 252, but are designated by symbol "'0" to distinguish them from the reference phase vectors 252 (which are designated by symbol "'").

Each of the mixed-phase interpolators $253_5$-$253_8$ receives a pair of reference phase vectors at its leading and trailing phase vector inputs and is weighted to generate an interpolated phase vector that falls at a predetermined phase offset between the input reference phase vectors. Mixed-phase interpolator $253_5$, for example, is coupled to receive 0° and 90° reference phase vectors and is weighted to produce a 60° interpolated vector. That is, the interpolation control value applied within interpolator $253_5$ specifies a weight, $W_T$, to be applied to the trailing phase vector (TPV) that is twice the weight, $W_L$, applied to the leading phase vector (LPV), with $W_T+W_L$ summing to a predetermined constant, K (i.e., $W_T=2/3K$, $W_L=1/3K$). By this arrangement, interpolator $253_5$ generates an interpolated phase vector having a phase angle given by TPV*2/3+LPV*1/3=90°*2/3+0°*1/3=60°. The interpolators $253_6$, $253_7$ and $253_8$ are similarly weighted to mix vector pairs 90°/180°, 180°/270° and 270°/0° to generate interpolated vectors 120°, 240° and 300°, respectively. As with the interpolated phase vectors having 0°, 90°, 180° and 270° phase angles, the 60°, 120°, 240° and 300° interpolated phase vectors are designated by a "'" symbol to indicate that such vectors are delayed, relative to reference phase vectors 252, by the propagation delay of the interpolators 253. Thus, the fixed-phase interpolators $253_1$-$253_4$ perform a delay matching function, matching the phase delay introduced in the 60°, 120°, 240° and 300° interpolated phase vectors by mixed-phase interpolators $253_5$-$253_8$. In alternative embodiments, the fixed-phase interpolators $253_1$-$253_4$ may be replaced by other delay elements that match the propagation delay of the mixed-phase interpolators $253_5$-$253_8$ or omitted altogether. In the embodiment of FIG. 6, the interpolation control value is fixed within each mixed-phase interpolators $253_5$-$253_8$ to generate interpolated phase vectors having the predetermined 60°, 120°, 240° and 300° phase angles. In alternative embodiments, discussed below, the interpolation control value may be adjustable to enable generation of interpolated phase vectors having variable phase angles. Further, instead of interpolating between leading and trailing primary phase vectors to generate the secondary phase vectors, the secondary phase vectors may be generated through use of scaled delay elements, as discussed in greater detail below.

The interpolated phase vectors 254 are supplied to frequency divider circuits $255_1$-$255_8$ which, in turn, yield a set of unity phase vectors and multiple sets of frequency-divided phase vectors. Frequency divider circuit $255_1$, for example, receives the 0° interpolated phase vector and generates a corresponding 0° unity phase vector (i.e., having frequency F as indicated by the notation "/1", and a nominal 0° phase offset), a pair of F/2 phase vectors having 0° and 180° phase angles, F/4 phase vectors having 0°, 90°, 180° and 270° phase angles, and F/8 phase vectors having 0°, 90°, 180° and 270° phase angles. Frequency divider circuits $255_2$, $255_4$, $255_5$ and $255_8$ receive the 90°, 270°, 60° and 300° interpolated phase vectors, respectively, and generate corresponding unity phase vectors having 90°, 270°, 60° and 300° phase angles. Frequency divider circuit $255_3$ receives the 180° interpolated phase vector and generates a corresponding 180° unity phase vector as well as F/2 phase vectors having 90° and 270° phase angles. Frequency divider circuit $255_6$ receives the 120° interpolated phase vector and generates a corresponding 120° unity phase vector, F/2 phase vectors having 60° and 240° phase angles, F/4 phase vectors having 120° and 300° phase angles, and F/8 phase vectors having 60° and 240° phase angles. Frequency divider circuit $255_7$ receives the 240° interpolated phase vector and generates a corresponding 240° unity phase vector, F/2 phase vectors having 120° and 300° phase angles, F/4 phase vectors having 60° and 240° phase angles, and F/8 phase vectors having 120° and 300° phase angles.

The unity phase vectors, F/2 phase vectors, F/4 phase vectors and F/8 phase vectors generated by the frequency divider circuits 255 constitute respective sets of phase vectors that are provided to corresponding input ports of the selector circuit 257. The selector circuit additionally receives a multi-bit rate select signal 258 (RS) that indicates the desired frequency, or frequency range, of the output clock signals 259 and responsively outputs the corresponding set of unity phase vectors or frequency-divided phase vectors as the output clock signals 259. For example, in one embodiment, the selector circuit 257 outputs either the unity phase vectors, F/2 phase vectors, F/4 phase vectors, or F/8 phase vectors as the output clock signals 259 according to whether a two-bit rate select signal 258 is in a '00', '01', '10' or '11' logic state, respectively.

Figure 7:
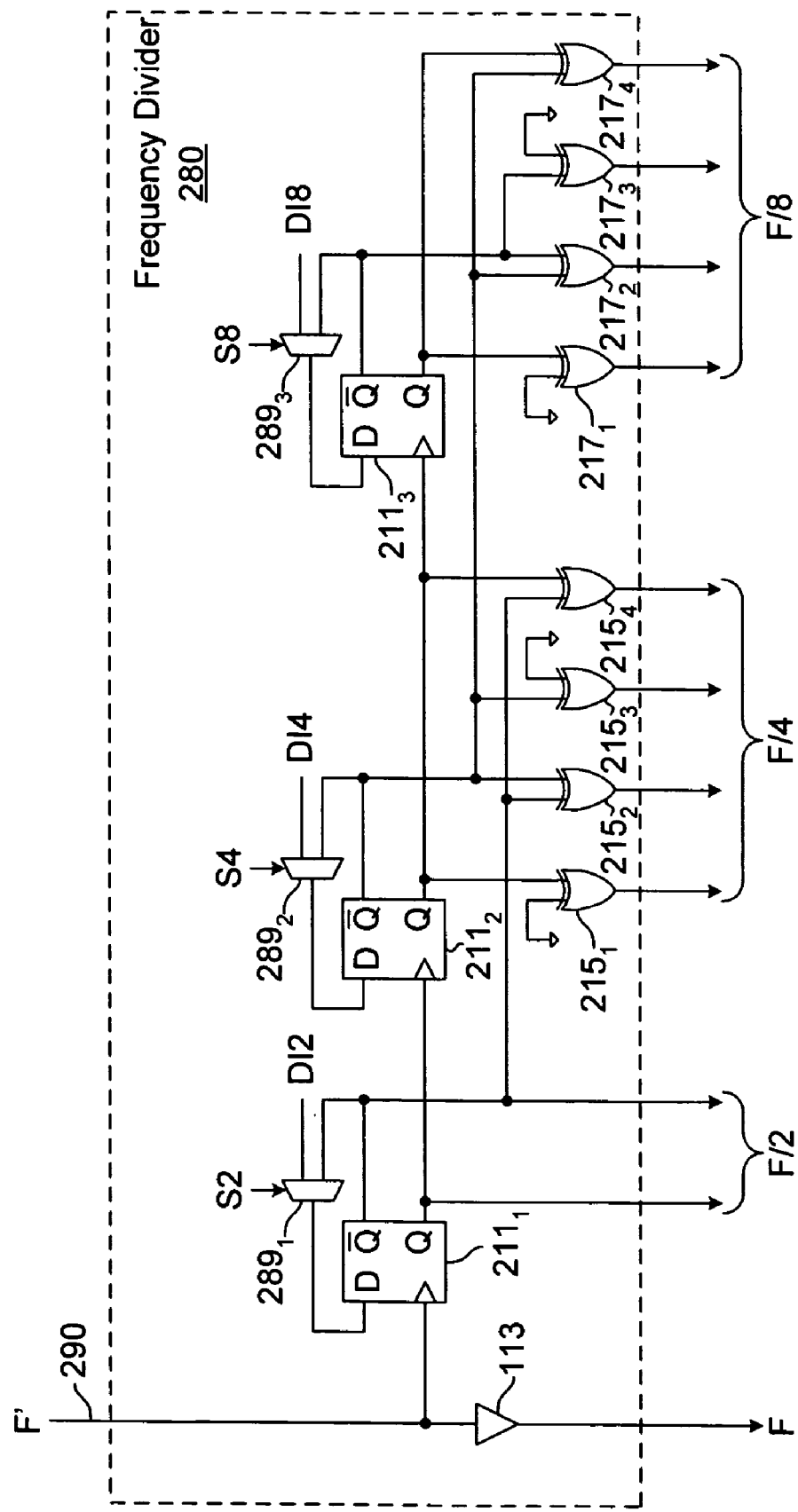
FIG. 7 illustrates a frequency divider circuit that may be used to implement each of the frequency divider circuits within the clock generator of FIG. 6.

FIG. 7 illustrates a frequency divider circuit 280 that may be used to implement each of the frequency divider circuits 255 within the clock generator of FIG. 6. The frequency divider circuit 280 includes the buffer amplifier 113, edge-triggered storage elements $211_1$-$211_3$, and exclusive-OR gates $215_1$-$215_4$, $217_1$-$217_4$ described in reference to FIG. 4, and additionally includes multiplexers $289_1$-$289_3$ coupled in the output-to-input paths of storage elements $211_1$-$211_3$, respectively. More specifically, a first input of each of the multiplexers $289_1$-$289_3$ is coupled to the inverting output of a respective one of the storage elements $211_1$-$211_3$, a second input of each of the multiplexers $289_1$-$289_3$ is coupled to receive a respective one of initialization values DI2, DI4 and DI8, and an output of each of the multiplexers $289_1$-$289_3$ is coupled to the data input of a respective one of storage elements $211_1$-$211_3$. Control signals S2, S4 and S8 are supplied to control inputs of the multiplexers $289_1$, $289_2$ and $289_3$, respectively, and are selectively transitioned between an initialization state and an operating state to initialize the storage elements 211 to a predetermined state. In one initialization sequence, for example, control signals S2 and S4 are initially set to an operating state to enable the outputs of storage elements $211_1$ and $211_2$ to toggle, while control signal S8 is set to an initialization state. By this operation, storage element $211_3$ is loaded with the initialization value DI8 in response to the rising edge output of storage element $211_2$. Thereafter, control signal S4 is transitioned to the initialization state to load DI4 into storage element $211_2$ at the next rising edge output of storage element $211_1$. After storage elements $211_3$ and $211_2$ have been initialized, control signal S2 is transitioned to the initialization state to load DI2 into storage element $211_1$ at the next rising edge of the incoming reference phase vector 290 (F'). After the storage elements $211_1$-$211_3$ have been initialized, the control signals S2, S4 and S8 may be simultaneously transitioned to the operating state to enable the storage elements to begin toggling.

Still referring to FIG. 7, the initialization value loaded into each of the storage elements 211 determines an initial state of the storage element output and therefore provides a selectable 180 degree phase shift in the storage element output. Thus, the effect of initializing a storage element 211 with a logic '0' or logic '1' value is to select either a first or a second of two successive rising edges in the input clock signal (i.e., the signal supplied to the clocking input of the storage element) to drive the rising edge of the storage element output. For example, if storage element $211_1$ is initially loaded with a logic '0' value, the non-inverting output of the storage element will initially be low and therefore will rise in response to a first rising edge of the incoming reference phase vector 290. By contrast, if storage element $211_1$ is initially loaded with a logic '1' value, the non-inverting output of the storage element will initially be high, and will therefore fall in response to the first rising edge of the reference phase vector 290, then rise in response to the subsequent rising edge of the reference phase vector 290. As discussed below, this operation is useful to enable selection of edges of the reference phase vector 290 that have phase angles greater than 360°.

In one embodiment, the storage elements $211_1$-$211_3$ are initialized differently in different instances of the frequency divider 280 to implement the frequency divider circuits $255_1$, $255_6$ and $255_7$ of FIG. 6. For example, the frequency divider circuit $255_1$ may be implemented by initializing the storage elements $211_1$-$211_3$ within a first instance of frequency divider 280 with logic '0' values. In such an arrangement, the output waveforms of the storage elements $211_1$-$211_3$ and exclusive-OR gates $215_1$-$215_4$ and $217_1$-$217_4$ correspond to the waveforms depicted in FIG. 5 and thus constitute the 0° unity phase vector, the 0° and 180° F/2 phase vectors, the 0°, 90°, 180° and 270° F/4 phase vectors, and the 0°, 90°, 180° and 270° F/8 phase vectors indicated in FIG. 6. The storage element $211_1$ in another instance of the frequency-divider circuit 280 may similarly be initialized with a logic '0' value to implement the frequency divider $255_3$ of FIG. 6, and additional instances of the frequency-divider circuit 280 may be initialized with arbitrary values to implement the frequency divider circuits $252_2$, $252_4$, $252_5$ and $252_8$ of FIG. 6. As discussed in reference to FIG. 4, storage elements 211 and exclusive-OR gates 215, 217 that generate unused clock signals may be omitted in selected instances of the frequency divider 280 of FIG. 7 or replaced with circuit elements that present similar loads. Also, one or more delay elements may be provided in the path between the non-inverting output of storage element $211_1$ and exclusive-OR gates $215_2$ and $215_4$ for delay matching purposes, and also in the path between the non-inverting output of storage element $211_2$ and exclusive-OR gates $217_2$ and $217_4$.

As discussed above in reference to FIGS. 1 and 2, when an interpolated phase vector having phase angle, A, is frequency divided by a value of N, the resulting frequency-divided phase vector has phase angle A/N. Accordingly, in the embodiment of FIG. 7, the frequency divider 280 is enabled to generate a phase vector having frequency F/N and an arbitrary phase angle A, by supplying an interpolated phase vector having a phase A*N thereto (the '*' symbol indicating multiplication). Thus, as shown in FIG. 8A, the frequency divider $255_6$ of FIG. 6 is enabled to generate a 60° F/2 phase vector by frequency-dividing incoming 120° interpolated phase vector by two, and is enabled to generate a 120° F/4 phase vector by frequency-dividing a 480° interpolated phase vector by four. As shown, the selection of a 480 degree phase vector (i.e., the rising edge of the 120° reference phase vector 290 that immediately succeeds the 120° edge) may be achieved, for example, by initializing storage element $211_1$ in an instance of the FIG. 7 frequency divider 280 to '1' (i.e., DI2=1), thus providing an F/2 240° phase vector to the clock input of the storage element $211_2$. Because the 240° F/2 phase vector may be divided by two in storage element $211_2$ to generate the F/4 120° phase vector, the initialization value DI4 is set to zero. Similarly, because the 120° F/4 phase vector generated at the non-inverting output of storage element $211_2$ and may be divided by two in storage element $211_3$ to generate the F/8 60° waveform, the initialization value for storage element $211_3$ is set to zero. The F/2 60° phase vector is generated at the inverting output of storage element $211_1$, and the F/4 300° and F/8 240° phase vectors are similarly generated at the inverting outputs of storage elements $211_2$ and $211_3$. Exclusive-OR gates $215_2$, $215_4$, $217_2$ and $217_4$ yield unused phase vectors when the frequency divider circuit 280 of FIG. 7 is used to implement the frequency divider $255_6$ of FIG. 6. Exclusive-OR gates $215_2$, $215_4$, $217_2$ and $217_4$ may nonetheless be provided within the frequency divider 280 for load matching purposes, or may be replaced by similar loading elements or omitted altogether.

Figure 8B:
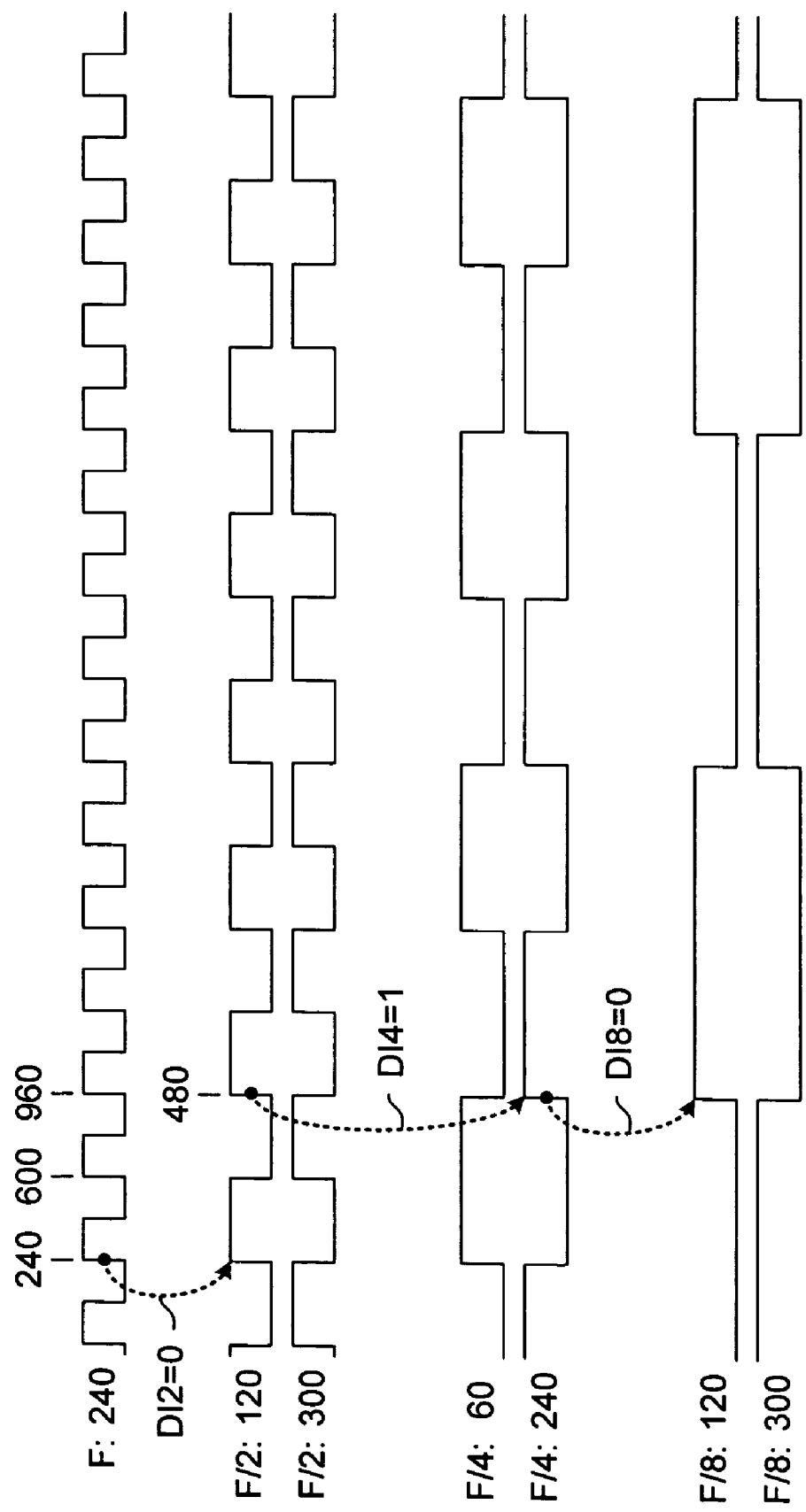
FIG. 8B illustrates another exemplary set of phase vectors generated within the clock generator of FIG. 6.

Referring to FIG. 8B, the frequency divider $255_7$ of FIG. 6 is enabled to generate a 120° F/2 and 60° F/4 phase vectors by frequency-dividing the incoming 240° interpolated phase vector by two and four, respectively, and is enabled to generate a 120° F/8 phase vector by frequency-dividing a 960° phase vector by eight. As shown, the selection of a 960° phase vector (i.e., the second rising edge of the 240° reference phase vector 290 after the 240° edge) is effected by initializing storage element $211_2$ to '1', thus providing a 240° F/4 phase vector (a phase vector having a rising edge aligned with the 480° edge of the 120° F/2 phase vector and therefore aligned with the 960° edge of the incoming reference phase vector 290) to the clock input of the storage element $211_3$. Because the 240° reference phase vector 290 may be divided by two to generate the F/2 120° phase vector, the initialization value for storage element $211_1$ is set to '0'. Similarly, because the 240° F/4 phase vector generated at the non-inverting output of storage element $211_2$ may be divided by two to generate the 120° F/8 phase vector, storage element $211_3$ is initialized to '0'. The 300° F/2 phase vector is generated at the inverting output of storage element $211_2$, and the 60° F/4 and 300° F/8 phase vectors are similarly generated at the inverting outputs of storage elements $211_2$ and $211_3$. The exclusive-OR gates $215_2$, $215_4$, $217_2$ and $217_4$ produce unused phase vectors when the FIG. 7 frequency divider 280 is used to implement frequency divider circuit $255_7$ of FIG. 6. Such gates may nonetheless be provided in the frequency divider 280 for load matching purposes, or may be replaced by similar loading elements or omitted altogether.

Still referring to FIG. 7, it should be noted that when a given one of storage elements $211_1$-$211_3$ is initialized to a logic '1' state, the output nodes of the frequency divider 280 at which the pair of complementary phase vectors generated by the storage element appear are reversed. For example, storage element $211_1$ generates F/2 phase vectors having phase angles A/2 and (A/2)+180° at its non-inverting and inverting outputs, respectively when initialized to a logic '0' state and generates F/2 phase vectors having phase angles (A/2)+180° and A/2 at its non-inverting and inverting outputs, respectively, when initialized to a logic '1' state (A being the phase angle of the incoming reference phase vector 290). In one embodiment, multiplexing circuits (not shown) are provided within the frequency divider circuit 280 to swap the coupling between the inverting and non-inverting outputs of a given storage element 211 and the output nodes of the frequency divider 280 when the storage element is initialized to '1', thereby yielding the same phase vector-to-output-node orientation within the frequency divider circuit 280 regardless of the state of the initialization values. In an alternative embodiment, the selector circuit 257 of FIG. 6 may compensate for phase vector-to-output-node swapping within the frequency divider circuit 280, for example, by routing the incoming phase vectors onto the appropriate output clock paths in accordance with the frequency division indicated by the rate select signal 258.

Figure 9:
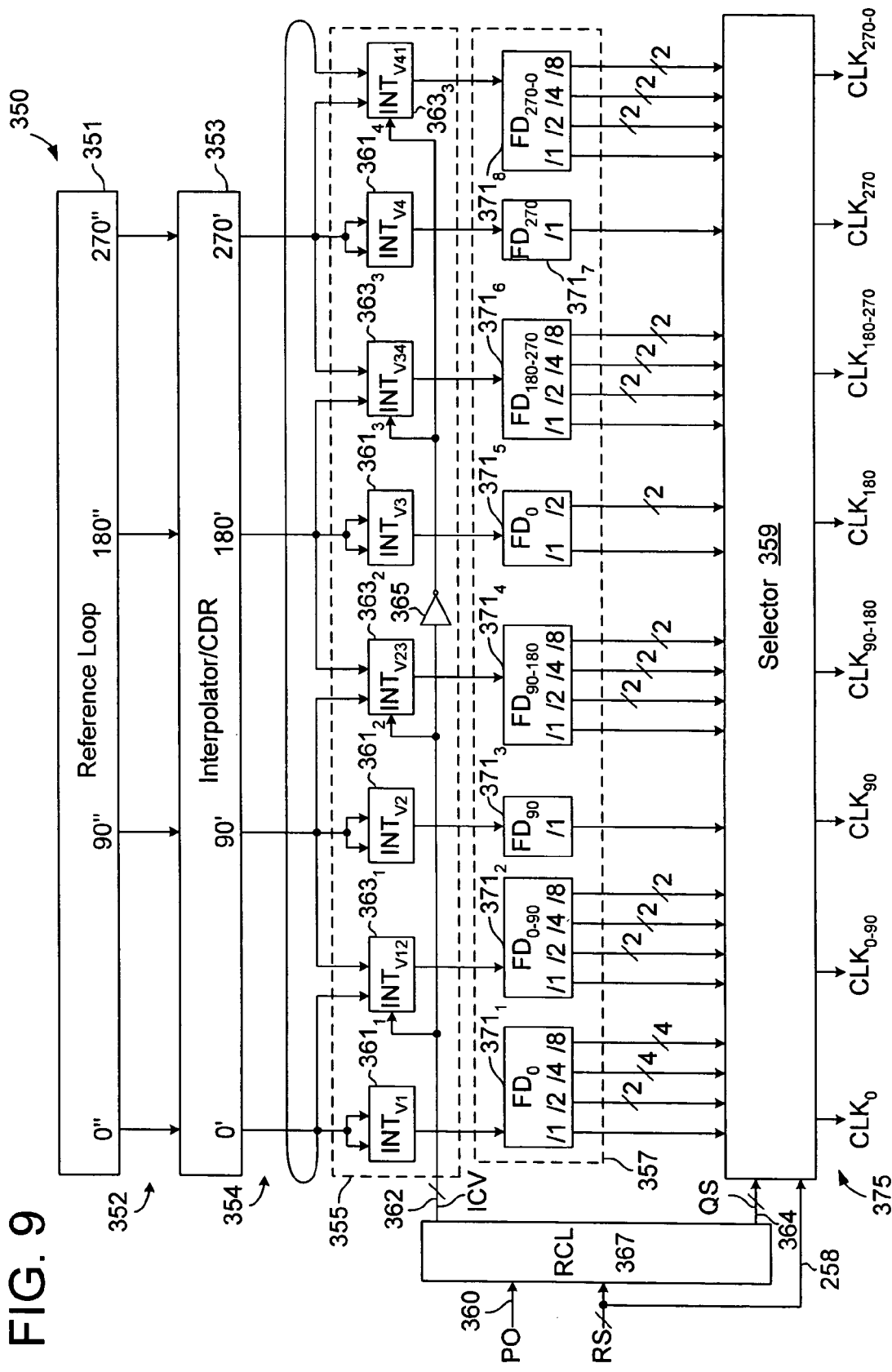
FIG. 9 illustrates an embodiment of a wide-range multi-phase clock generator that may be used to generate output clock signals having a selectable frequency range and programmable phase offsets.

FIG. 9 illustrates an embodiment of a wide-range multi-phase clock generator 350 that may be used to generate output clock signals 375 having a selectable frequency range and programmable phase offsets. The clock generator 350 includes a reference loop 351, first-stage interpolator bank 353, second-stage interpolator bank 355, frequency divider bank 357, selector circuit 359 and rate control logic 367 (RCL). In the embodiment shown, the reference loop 351 generates four reference phase vectors 352 that are evenly phase distributed (i.e., at primary phase angles 0°, 90°, 180° and 270°) within a reference clock cycle. In alternative embodiments, more or fewer reference phase vectors may be generated by the reference loop 351. As discussed above, the reference loop 351 may perform a clock multiplying function as in the case of a clock-multiplying delay-locked loop or phase-locked loop, or may generate reference phase vectors at a reference clock frequency as in the case of a delay-locked loop. The first-stage interpolator bank 353 is coupled to receive the reference phase vectors 352 from the reference loop and is used to adjust the phase of the reference phase vectors 352 as necessary to achieve a desired phase alignment between the output clock signals 375 and a signal to be sampled in response to transitions of the output clock signals. In one embodiment, for example, the first-stage interpolator bank 353 includes clock-data recovery logic (CDR) to adjust the phase of the reference phase vectors 352 according to whether samples captured at edges of data eyes within the incoming signal indicate that the output clock signals 375 used to time the capture of such samples are transitioning early or late relative to the edges in data eyes. Other clock phase adjustment techniques may be used in alternative embodiments. The phase vectors 354 generated by the first-stage interpolator bank 353 are referred to herein as reference phase vectors, but denoted by symbol "'" to distinguish them from the reference phase vectors generated by the reference loop 351 (which are denoted by "''"). In alternative embodiments, the first-stage interpolator bank 353 may be omitted or may be disposed outside the clock generator, for example, to receive the output clock signals 375 and adjust the phase of such signals directly. Thus, reference phase vectors may be supplied to the second-stage interpolator bank 355 directly from the reference loop 351 or by the first-stage interpolator bank 353.

In the embodiment of FIG. 9, the second-stage interpolator bank includes fixed-phase interpolators $361_1$-$361_4$ to generate fixed-phase vectors that correspond to the 0°, 90°, 180° and 270° reference phase vectors 354 (i.e., primary phase vectors), and mixed-phase interpolators $363_1$-$363_4$ to generate mixed-phase vectors having phase angles that fall between the phase angles of respective pairs of the fixed-phase vectors. For example, mixed-phase interpolator $363_1$ receives the 0° and 90° reference phase vectors and therefore generates a mixed-phase vector having a phase angle between 0° and 90°. Similarly, interpolators $363_2$, $363_3$ and $363_4$ receive reference phase vector pairs 90°/180°, 180/270 and 270°/0°, and therefore generate mixed-phase vectors having variable phase angles between 90° and 180°, 180° and 270°, and 270° and 0°, respectively. The phase angles of the mixed-phase vectors are controlled by one or more interpolation control values 362 (ICV) supplied by the rate control logic 367, as discussed below.

In the embodiment of FIG. 9, each of the 0°, 90°, 180° and 270° fixed-phase vectors is generated by supplying the corresponding reference phase vector to both inputs of a respective one of the fixed-phase interpolators $361_1$-$361_4$. By this arrangement, the fixed-phase vectors have nominally the same phase as the corresponding reference phase vectors, but are phase offset from such reference phase vectors according to the propagation delay through the interpolator circuits $361_1$-$361_4$, thus matching the propagation delay introduced in the mixed-phase vectors by mixed-phase interpolators $363_1$-$363_4$. In alternative embodiments, the reference-phase interpolators may be replaced by one or more buffer amplifiers, inverter chains or other delay elements that exhibit substantially the same propagation delay as the mixed-phase interpolators 363.

Still referring to FIG. 9, the frequency divider bank 357 generates a set of unity phase vectors and multiple sets of frequency-divided phase vectors based on the fixed-phase vectors and mixed-phase vectors received from the interpolator bank 355. The unity phase vectors have the reference loop frequency, F, and phase angles 0°, 90°, 180°, 270°, $X_{0-90}$, $X_{90-180}$, $X_{180-270}$ and $X_{270-0}$; the symbol 'X' denoting a variable phase angle within the range indicated by the associated subscript. In the particular embodiment of FIG. 9, three sets of frequency-divided phase vectors are generated by the frequency divider bank 357: a divide-by-two set of phase vectors having frequency F/2; a divide-by-four set of phase vectors having frequency F/4; and a divide-by-eight set of phase vectors having frequency F/8. Also, the constituent phase vectors of each set of frequency-divided phase vectors have phase angles that match (or substantially match) the phase angles of the unity phase vectors. In alternative embodiments, more or fewer sets of frequency-divided phase vectors may be generated, and each set of frequency-divided phase vectors may include more or fewer constituent phase vectors, depending on application needs.

In the embodiment of FIG. 9, the frequency divider bank 357 includes a set of frequency divider circuits $371_1$-$371_8$ each implemented by a respective instance of the frequency divider circuit 210 of FIG. 4. Frequency divider circuit $371_1$, for example, receives the 0° fixed-phase vector and generates a corresponding 0° unity phase vector (i.e., having frequency F, and a nominal 0° phase offset), F/2 phase vectors having 0° and 180° phase angles, F/4 phase vectors having 0°, 90°, 180° and 270° phase angles, and F/8 phase vectors having 0°, 90°, 180° and 270° phase angles. Frequency divider circuits $371_3$ and $371_7$ receive the 90° and 270° fixed-phase vectors, respectively, and generate corresponding unity phase vectors having 90° and 270° phase angles. Frequency divider circuit $371_5$ receives the 180° fixed-phase vector and generates a corresponding 180° unity phase vector as well as F/2 phase vectors having 90° and 270° phase angles. Frequency divider circuits $371_2$, $371_4$, $371_6$ and $371_8$ receive mixed-phase vectors having phase angles $X_{0-90}$, $X_{90-180}$, $X_{180-270}$ and $X_{270-0}$, respectively, from mixed-phase interpolators $363_1$, $363_2$, $363_3$ and $363_4$ and generate corresponding unity phase vectors and complementary pairs of phase vectors having frequencies F/2, F/4 and F/8 and phase angles X/2, X/4 and X/8, respectively. That is, each of the frequency divider circuits $371_2$, $371_4$, $371_6$ and $371_8$ generates a unity phase vector having phase angle X (i.e., 0-90°, 90-180°, 180-270° and 270-0°), a pair of frequency-divided phase vectors having frequency F/2 and phase angle X/2, a pair of frequency-divided phase vectors having frequency F/4 and phase angle X/4, and a pair of frequency-divided phase vectors having frequency F/8 and phase angle X/8. As discussed in reference to FIGS. 3 and 4, selected circuit elements (e.g., storage elements and exclusive-OR gates) may be omitted from frequency divider circuits 371 that do not generate selected F/2, F/4 or F/8 clock signals. Such circuit elements may also be replaced by other circuit elements which provide substantially equivalent loading. Also, the 180 and 270 unity phase vectors may be generated by divider circuits $371_1$ and $371_3$ in alternative embodiments, as complements of the 0 and 90 unity phase vectors. In such an embodiment, frequency divider circuit $371_7$ may be omitted altogether, and the buffer amplifier may, if desired, be omitted from frequency divider circuit $371_5$.

The frequency divider bank 357 outputs the set of unity phase vectors and the sets of frequency-divided phase vectors generated by the constituent frequency divider circuits 371 to respective input ports of the selector circuit 359. The selector circuit 359, in turn, outputs a selected set of the phase vectors as the output clock signals 375 according to a quadrant-select signal 364 (QS) from the rate control logic 367 and according to a rate select signal 258 (RS). In one embodiment, the rate select signal 258 is a multi-bit signal that indicates one of four available output clock frequencies, F, F/2, F/4 or F/8. In alternative embodiments, the rate select signal 258 may additionally indicate an output frequency for the reference loop 351 (e.g., within the tuning band of the reference loop 351) and therefore specify an output clock frequency within one of four frequency ranges. More or fewer output clock frequencies or an output clock frequency within more or fewer frequency ranges may be specified by the rate select signal 258 in alternative embodiments.

Figure 10A:
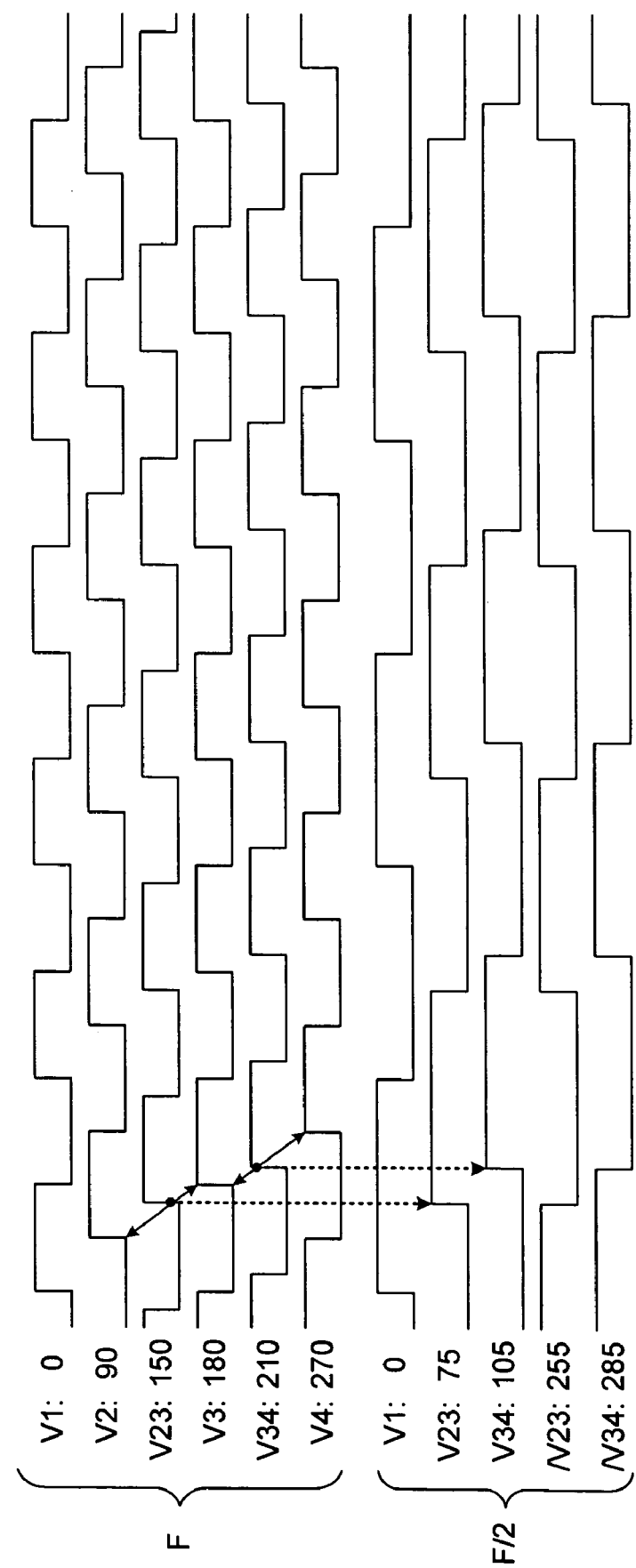
FIG. 10A illustrates an exemplary set of phase vectors generated within the clock generator of FIG. 9.

Reflecting on the mixed-phase interpolators $363_1$-$363_4$ and corresponding frequency dividers $371_2$, $371_4$, $371_6$ and $371_8$, it can be seen that, in order to generate an output clock signal having an arbitrary phase angle, A, at a specified frequency, F/N (where F is the reference clock frequency and N is an integer value equal to or greater than 1), a phase vector having a phase angle N*A may be generated by one of the mixed-phase interpolators 363, then divided by N within the corresponding frequency divider circuit 371. The undivided phase vector having phase angle N*A is referred to herein as a divisor-multiplied phase vector, as the phase vector corresponds to a desired output clock phase angle, but is multiplied by the frequency divisor value, N, in order to yield the desired phase angle after frequency division. Because the phase angle of the divisor-multiplied phase vector may generally occur anywhere within a full cycle of the reference clock signal, the pair of reference phase vectors that are mixed to yield the divisor-multiplied phase vector may vary according to the divisor value (e.g., 2, 4, 6, 8) and the desired output clock phase angle. Referring to FIG. 10A, for example, if an output clock signal having frequency F/2 and a 75° phase angle is desired, then a divisor-multiplied phase vector having frequency F and a 150° phase angle is generated by interpolating between the 90 and 180° reference phase angles, then divided by two to produce the desired clock signal. In the clock generator 350 of FIG. 9, the divisor-multiplied phase angle would therefore be generated by mixed-phase interpolator $363_2$ with an interpolation control value that specifies a ⅔ weight on the trailing reference phase vector (180°) and ⅓ weigh on the leading reference phase vector (90°). The resultant 150° mixed-phase vector is then divided by two in frequency divider circuit $371_4$ to produce the desired clock signal.

Figure 10B:
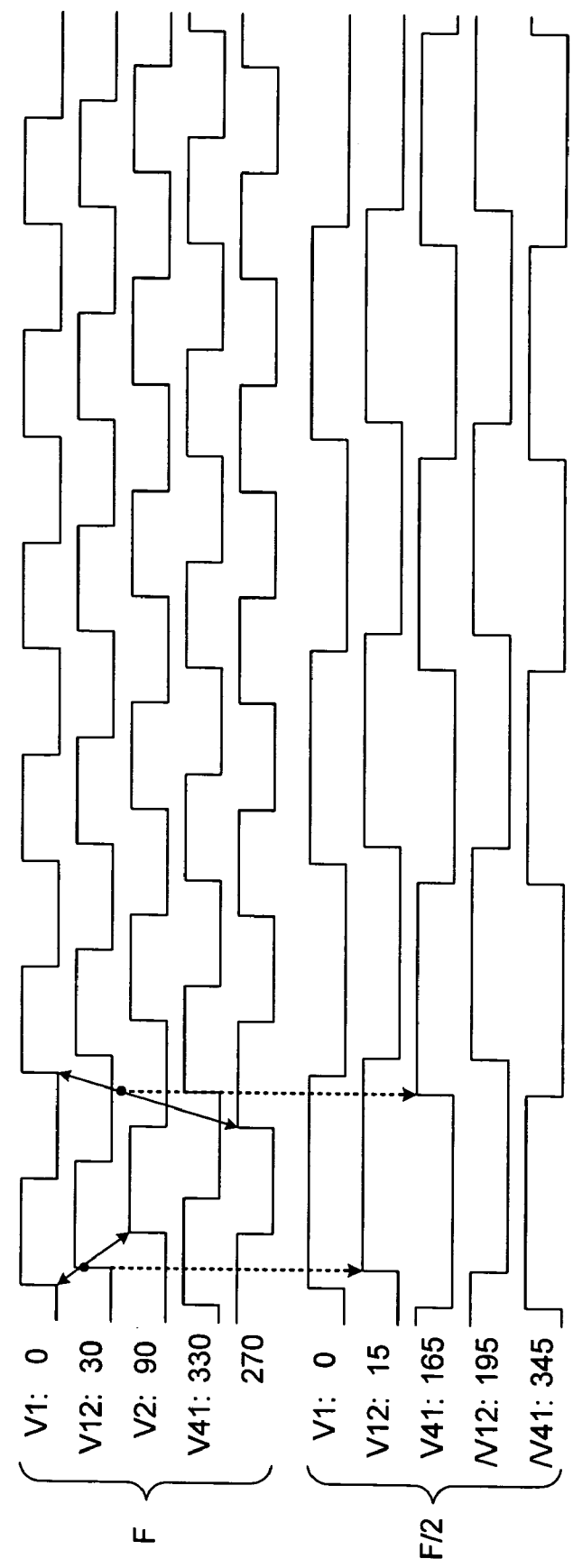
FIG. 10B illustrates another exemplary set of phase vectors generated within the clock generator of FIG. 9.

In one embodiment, each of the variable-phase output clock signals generated by clock generator 350 have related phase angles +A, −A, 180°+A (i.e., complement of +A) and 180°−A (complement of −A), for example, to achieve the oversampling function described in reference to FIG. 6. Thus, continuing with the example of FIG. 10A in which A=75°, the full complement of variable-phase output clock signals will have frequency F/2 and phase angles of 75°, 105°, 255° and 285°. As shown, the F/2 105° phase vector may be generated by interpolating between the 180° and 270° reference phase vectors to produce an interpolated phase vector having a 210° phase angle, then dividing the 210° interpolated phase vector by two. The 255° and 285° phase vectors are complements of the 75° and 105° phase vectors, respectively, and therefore are available at the inverting outputs of the frequency divider circuits $371_4$ and $371_6$. FIG. 10B illustrates another phase-mixing example in which variable-phase output clock signals having phase angles of 15°, 165°, 195° and 345° and frequency F/2 are desired. The F/2 output clock signal having a 15° (i.e., +A) phase angle is generated by interpolating between the 0° and 90° reference vectors to produce an interpolated vector having frequency F and a 30° phase angle, then dividing the interpolated phase vector by two in frequency divider circuit $371_2$. The F/2 output clock signal having a 165° phase angle (i.e., 180−A) is generated by interpolating between the 270° and 0° phase vectors to produce an interpolated vector having frequency F and a 330° phase angle, then dividing the interpolated phase vector by two in frequency divider circuit $371_8$. As in the example of FIG. 10A, the complement phase vectors, 180°+A (195°) and −A (345°) are available at the inverting outputs of the frequency divider circuits $371_2$ and $371_8$.

In the embodiment of FIG. 9, the rate control logic 367 receives a rate select signal 258 that indicates a divisor value, N (i.e., a desired frequency or frequency range), and a phase offset signal 360 (PO) that indicates a desired phase angle, A, of an output clock signal. The rate control logic 367 responds to the rate select and phase offset signals by generating an interpolation control value 362 (ICV) and the above-mentioned quadrant-select signal 364 (QS). The quadrant-select signal 364 indicates the quadrant of a reference clock cycle in which a divisor-multiplied phase angle, N*A, falls (i.e., $Q_0$: 0°-90°; $Q_1$: 90°-180°; $Q_2$: 180°-270°; or $Q_3$: 270°-0°) and therefore indicates the mixed-phase interpolator 363 that may be selected to source the corresponding divisor-multiplied phase vector. The interpolation control value 362 is supplied to the mixed-phase interpolators 363 to control interpolation between leading and trailing reference phase vectors as necessary to yield a divisor-multiplied phase vector having phase angle N*A. Within a given mixed-phase interpolator 363, the incoming interpolation control value, ICV, is applied to the trailing phase vector and its complement, /ICV, applied to the leading phase vector, ICV and /ICV summing to a predetermined constant.

Because phase angle −A is a reflection of phase angle A within a 360° phase plot, divisor-multiplied phase angle N*(−A) falls in a quadrant having a predetermined relationship to the quadrant of phase angle N*A. That is, if N*A falls in quadrant $Q_x$, where x=0, 1, 2 or 3, then N*(−A) falls in quadrant $Q_{(3-x)}$. Also, because phase angle −A represents an offset from a trailing phase vector to a leading phase vector (as opposed to angle A which represents a phase offset from a leading phase vector to a trailing phase vector), the value of the interpolation control value within the mixed-phase interpolator selected to source a divisor-multiplied phase vector having phase angle N*(−A) is the complement of the interpolation control value applied within the mixed phase interpolator selected to source phase vector having phase angle N*A. Recognizing that divisor-multiplied phase angles N*A and N*(−A) fall in opposite quadrant pairs Q1:Q2 and Q3:Q4 (i.e., when N*A falls within pair Q1:Q2, N*(−A) falls within pair Q3:Q4, and vice-versa), it follows that by complementing the interpolation control value supplied to the mixed-phase interpolators $363_3$ and $363_4$ that correspond to quadrant pair Q3:Q4, the two mixed-phase interpolators used to generate divisor-multiplied phase vectors having angles N*A and N*(−A) may be ensured to receive complementary interpolation control values 362. Thus, inverter 365 is provided in the embodiment of FIG. 9 to complement the interpolation control value supplied to mixed-phase interpolators $363_3$ and $363_4$ and, as discussed below, the rate control logic 367 includes circuitry to determine when angle N*A falls within quadrants Q3 or Q4 of the reference clock cycle and, in response, to complement the interpolation control value 362 so that mixed-phase interpolators $363_1$ and $363_2$ (one of which is used to generate a divisor-multiplied phase vector having phase angle N*(−A)) receive a complement interpolation control value and mixed phase interpolators $363_3$ and $363_4$ receive a non-complemented interpolation control value. By this arrangement, complement and complemented interpolation control values may be provided to selected mixed-phase interpolators to generate interpolated phase vectors having divisor-multiplied phase angles N*A and N*(−A). The divider circuits 371 coupled to receive such divisor-multiplied phase vectors may then divide by N to generate phase vectors having phase angles A and −A, and complementary phase vectors having phase angles 180°+A and 180°−A, thus completing the set of phase vectors to be output by the selector circuit 359 as variable-phase output clock signals.

Figure 11:
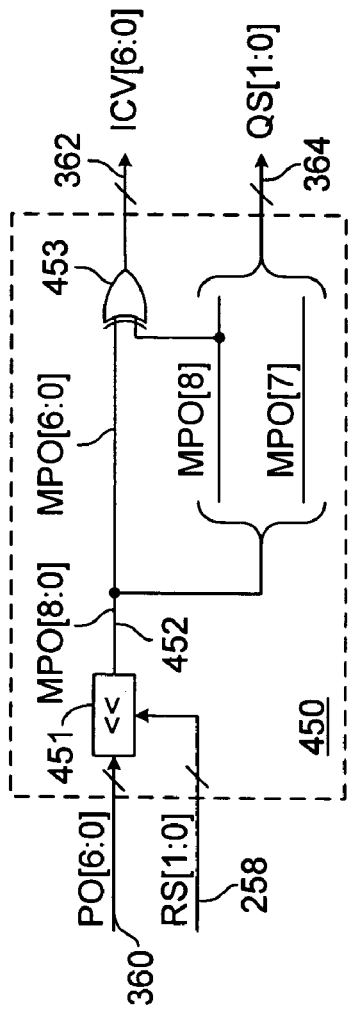
FIG. 11 illustrates an embodiment of a logic circuit that may be used to implement the rate control logic of FIG. 9.

FIG. 11 illustrates an embodiment of a logic circuit 450 that may be used to implement the rate control logic 367 of FIG. 9. Logic circuit 450 is coupled to receive a rate select signal 258 (RS) and phase offset signal 360 (PO) as inputs, and includes multiplier circuit 451 and exclusive-OR gate 453. In the particular embodiment shown, the rate select signal 258 is an encoded two-bit signal, RS[1:0], that specifies a divisor value of 1 (RS=00), 2 (RS=01), 4 (RS=10) or 8 (RS=11), and the phase offset signal 360 is a seven-bit signal, PO[6:0], that specifies a phase angle between 0° and 90° (i.e., between 0° and 90°*(127/128) to be more precise) in increments of 90°/128. Thus, a value of 000 0000b ('b' indicating binary notation) indicates a 0° phase offset, a value of 000 0001b indicates a 90°/128 phase offset, a value of 0000010b indicates a 90°*(2/128) phase offset and so forth to 111 1111b, which indicates a 90°*(127/128) phase offset. In the embodiment of FIG. 11, the multiplier 451 is a shift circuit that shifts the phase offset signal 360 left by a number of bits equivalent to the numeric value of the rate select signal 258. Because each bitwise shift to the left effectively multiplies the indicated phase offset by two, the multiplier 451 outputs a multiplied phase offset signal 452 (MPO) which represents the input phase offset signal 360 multiplied by 1, 2, 4 or 8, in accordance with the divisor indicated by the rate select signal. Thus, the multiplied phase offset signal 452 may be viewed as the divisor-multiplied phase angle, N*A, indicated by the incoming phase offset signal 360 and rate select signal 258. In one embodiment, the multiplied phase offset signal is limited to 9 bits (MPO[8:0]) to achieve a modulo 512 division, effectively limiting the desired divisor-multiplied phase vector (i.e., the divisor-multiplied phase vector indicated by the divisor-multiplied phase angle) to one of four quadrants within a single reference clock cycle.

The two most significant bits of the multiplied phase offset, MPO[8:7], are output from the logic circuit 364 as quadrant-select signal 364, such bits indicating the quadrant of a reference clock cycle in which the desired divisor-multiplied phase vector falls. That is, if the quadrant-select signal 364 is '11', then the divisor-multiplied phase offset represents a phase angle between 270° and 0° ($Q_3$). If the quadrant-select signal 364 is '10', then the divisor-multiplied phase offset represents a phase angle between 180° and 270° ($Q_2$). If the quadrant-select signal 364 is '01', then the divisor-multiplied phase offset represents a phase angle between 90° and 180° ($Q_1$). Finally, if the quadrant-select signal 364 is '00', then the divisor-multiplied phase offset represents a phase angle between 0° and 90° ($Q_0$).

The least significant seven bits of the multiplied phase offset, MPO[6:0], indicate the offset of a phase angle within the quadrant-select indicated quadrant and therefore may be output from the logic circuit 450 as an interpolation control value 362. If the multiplied phase offset corresponds to a divisor-multiplied phase angle greater than or equal to 180° (i.e., a phase angle that falls in quadrants Q2 or Q3 of a reference clock cycle), then one of the interpolators $363_3$ and $363_4$ of FIG. 9 will be selected to generate the corresponding divisor-multiplied phase vector. Accordingly, bit 8 (MPO[8]) of the multiplied phase offset (which will be high in the case of a multiplied phase offset signal that corresponds a divisor-multiplied phase angle greater than or equal to 180°) is supplied to a first input of exclusive-OR gate 453 (which may be a bank of seven exclusive-OR gates each having first inputs coupled to receive MPO[8] and second inputs to receive respective bits MPO[6] to MPO[0]) to invert the interpolation control value output by the logic circuit 450, thereby canceling the effect of the inverter 365 of FIG. 9; delivering a non-complemented interpolation control value 362 to mixed-phase interpolators $363_3$ and $363_4$ and a complemented interpolation control value 362 to mixed-phase interpolators $363_1$ and $363_2$.

It should be noted that numerous changes may be made to the logic circuit 450 in alternative embodiments. For example, the rate select signal 258 and/or the phase offset signal 360 may have more or fewer constituent bits. Also, the phase offset signal may, instead of numerically indicating a desired phase offset, be a select signal that selects one of a predetermined number of phase offsets from a table of phase offsets. Interpolation control values may tabulated in such an embodiment and output from the table in response to the phase offset selection and rate select signal. More generally, any circuit capable of generating an interpolation control value and quadrant-select signal (or other signal that indicates the source of a desired divisor-multiplied phase vector) may be used instead of logic circuit 450 in alternative embodiments.

Figure 12:
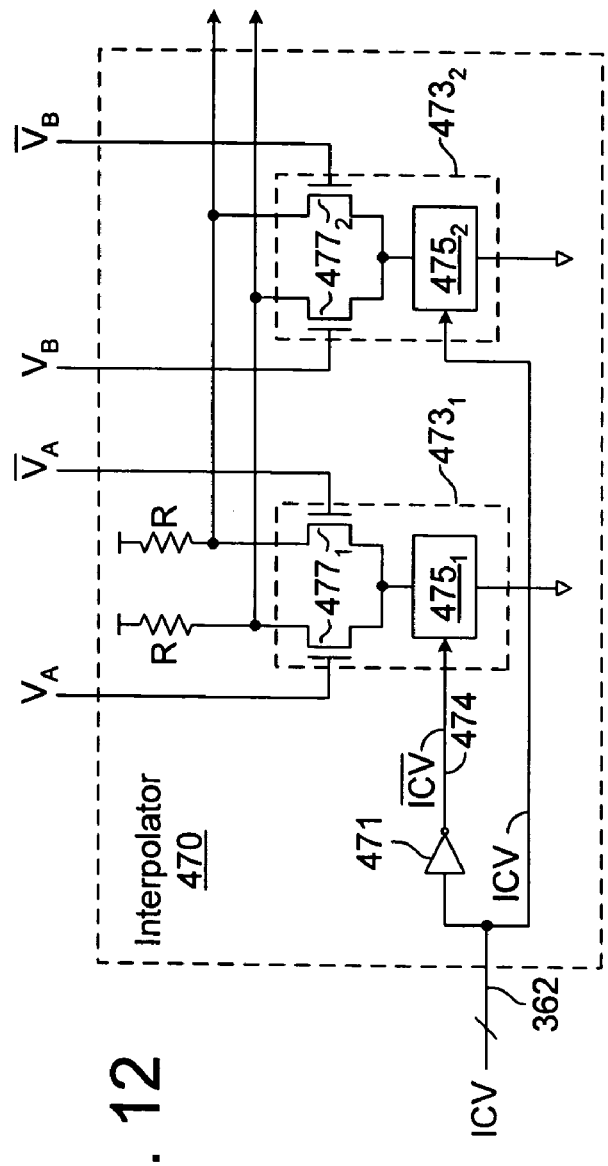
FIG. 12 illustrates an embodiment of an interpolator that may be used to implement the mixed-phase interpolators of FIG. 9.

FIG. 12 illustrates an embodiment of an interpolator 470 that may be used to implement the mixed-phase interpolators $363_1$-$363_3$ of FIG. 9. The interpolator 470 includes differential amplifiers $473_1$ and $473_2$ coupled to receive differential reference phase vector $V_A$ at a first phase vector input, and differential reference phase vector $V_B$ at a second phase vector input. The differential outputs of the amplifiers $473_1$ and $473_2$ are coupled in common to form a differential output port and, in the embodiment of FIG. 12, are pulled up by a pair of resistive elements, R. Though depicted as resistors, the resistive elements, R, may be passive or active load elements in alternative embodiments.

Each of the differential amplifiers $473_1$, $473_2$ includes a pair of transistors $477_1$, $477_2$ having source terminals coupled in common to a biasing circuit $475_1$, $475_2$. The drain terminals of transistors 477 constitute the differential amplifier outputs, and the gate terminals of transistors 477 are coupled to receive the complement and non-complement components of a differential phase vector. The biasing circuits $475_1$ and $475_2$ establish respective bias currents within the differential amplifiers $473_1$ and $473_2$ (i.e., from the source terminals of the corresponding transistor pair 477 to ground) in accordance with an incoming interpolation control value 362 and complement interpolation control value 474, respectively. In one embodiment, each of the biasing circuits $475_1$, $475_2$ is implemented by a set of binary weighted transistors (or sets of transistors ganged together to achieve an effective binary weighting) having gate terminals coupled to receive respective bits of the interpolation control value. That is, a first transistor is coupled between the transistor pair 477 and ground, has a gate terminal coupled to receive bit ICV[0] and conducts current $I_{REF}$ when ICV[0] is high; a second transistor (or pair of transistors) is coupled in parallel with the first transistor and conducts current $2*I_{REF}$ when ICV[1] is high, and so forth to a final transistor (or group of transistors) that conducts current $2^{K-1}*IREF$ when bit ICV[K−1] is high, K being the number of constituent bits in the interpolation control value. Inverter 471 is provided to complement the interpolation control value provided to differential amplifier $473_1$ so that, if bias current $ICV*I_{REF}$ is generated in biasing circuit $475_2$, bias current $I_{MAX}-(ICV*I_{REF})$ is generated in biasing circuit $475_1$, $I_{MAX}$ being the maximum bias current generated by either of the biasing circuits (e.g., $I_{REF}*2^{K-1}$). Because the bias currents generated by biasing circuits $475_1$ and $475_2$ sum to $I_{MAX}$, the effect of increasing or decreasing the value of the interpolation control value 362 is to increase or decrease the current drawn by biasing circuit $475_2$ and to correspondingly decrease or increase the current drawn by biasing circuit $475_1$. Also, because the output nodes of the differential amplifiers $473_1$ and $473_2$ are coupled together to resistive pull-up elements, R, the differential clock signals supplied to differential amplifiers $473_1$ and $473_2$ are effectively phase mixed in accordance with the interpolation control value 362 and complement interpolation control value 474. That is, when the interpolation control value 362 is a minimum value (e.g., zero), $I_{MAX}$ flows through the transistor pair $477_1$ of differential amplifier $473_1$ and zero or negligible current flows through differential amplifier $473_2$, thereby yielding an interpolated phase vector nominally phase aligned with input vector $V_A$ (i.e., phase aligned with $V_A$, but phase offset by the propagation delay of differential amplifier $473_1$). When the interpolation control value 362 is a maximum value (e.g., all '1's), $I_{MAX}$ flows through differential amplifier $473_2$ and zero or negligible current flows through differential amplifier $473_1$, yielding an interpolated phase vector nominally phase aligned with input vector $V_B$. When the interpolation control value 362 is between the maximum and minimum values, the interpolated phase vector generated by interpolator 470 exhibits a reduced slew rate during the initial portion of the rising edge of leading reference phase vector $V_A$, followed by an increased slew rate when trailing vector $V_B$ begins to rise, the reduced slew rate slowing the midpoint transition and therefore the phase angle of the resulting interpolated phase vector. Thus, as the interpolation control value 362 is incremented from minimum to maximum values, the resulting interpolated phase vector exhibits an incrementally slower slew rate, and therefore an incrementally increased phase angle.

It should be noted that numerous changes may be made to the interpolator 470 of FIG. 12 in alternative embodiments. For example, in one embodiment, additional differentially-coupled transistor pairs 477 are coupled in parallel with transistor pair $477_1$ and have matching source, drain and gate connections (i.e., gate terminals coupled to receive input vector $V_A$, drain terminals coupled to the interpolator output nodes, and source terminals coupled in common with the source terminals of transistors $477_1$), and additional differentially coupled transistor pairs are similarly coupled in parallel with transistor pair $477_2$. The additional transistor pairs are selectively enabled according to the rate select signal 258 to increase the current drawn by the differential amplifiers as a function of the input vector frequency, thus achieving a desired temporal overlap between leading and trailing input phase vectors. In other embodiments, the interpolation control values may be fixed to implement the fixed-phase interpolators $361_1$-$361_4$ of FIG. 9. More generally, any circuit capable of generating an interpolated output vector by phase-mixing the input vectors $V_A$ and $V_B$ in accordance with a fixed interpolation control value or interpolation control value 362 may be used to generate interpolated phase vectors in alternative embodiments.

FIG. 13 is a table 500 illustrating the operation of the selector circuit 359 of FIG. 9 according to one embodiment. As discussed in reference to FIG. 9, the selector circuit outputs four fixed-phase output clock signals, shown in table 500 as $CLK_0$, $CLK_{90}$, $CLK_{180}$, $CLK_{270}$, and four mixed-phase clock signals, shown in table 500 as $CLK_{0-90}$, $CLK_{90-180}$, $CLK_{180-270}$ and $CLK_{270-0}$. More or fewer clock signals may be output by the selector circuit 359 in alternative embodiments. In the embodiment illustrated by table 500, the selector circuit 359 selects the fixed-phase output clock signals from frequency divider circuits $371_1$,$371_3$, $371_5$ and $371_7$ within the FIG. 9 frequency divider bank 357 according to the state of the rate select signal 258. That is, when the rate select signal 258 indicates a unity frequency, F, phase vectors having frequency F and 0°, 90°, 180° and 270° phase angles are selected from divider circuits $371_1$, $371_3$, $371_5$ and $371_7$, respectively (and therefore from interpolators $361_1$-$361_4$) and output at the fixed-phase clock signal outputs, $CLK_0$, $CLK_{90}$, $CLK_{180}$, $CLK_{270}$, of the selector circuit. Similarly, phase vectors having frequency F and variable phase angles A (0°-90°), −A (270°-0°), 180°+A (180°-270°) and 180°−A (90°-180°) are output at the variable-phase clock signal outputs, $CLK_{0-90}$, $CLK_{270-0}$, $CLK_{180-270}$ and $CLK_{90-180}$, respectively. As a matter of terminology, each entry in an output clock column of table 500 indicates the interpolator that sources the phase vector to be output as a unity phase vector or to be frequency-divided by interpolated phase vector number (i.e., V1, V2, V3 and V4 being the interpolated phase vectors generated by fixed phase interpolators $361_1$-$361_3$, and V12, V23, V34 and V41 being the interpolated phase vectors generated by mixed-phase interpolators $363_1$-$363_4$) and indicates the frequency of the output clock signal by a subscript, F, F/2, F/4 or F/8. Thus, in the first row of table 500, interpolated phase vectors $V1_F$, $V2_F$, $V3_F$ and $V4_F$ are output at fixed-phase clock signal outputs, $CLK_0$, $CLK_{90}$, $CLK_{180}$, $CLK_{270}$, respectively, and interpolated phase vectors $V12_F$, $V41_F$, $V12_F$ and /$V41_F$ are output at variable-phase clock signal outputs $CLK_{0-90}$, $CLK_{270-0}$, $CLK_{180-270}$ and $CLK_{90-180}$, respectively.

Completing the fixed-phase output clock signal columns in table 500, when the rate select signal indicates a divide-by-two output clock frequency, F/2, fixed-phase vectors V1 and V3, having frequency F/2 and 0° and 180° phase angles are selected from interpolators $361_1$ and divided by two in frequency divider circuits $371_1$ and $371_5$ to produce 0° and 90° F/2 output clock signals and their 180° and 270° complements. That is, phase vectors $V1_{F/2(0)}$, $V3_{F/2(90)}$ (the subscripts F/2(0) and F/2(90) indicating the 0° and 90° F/2 phase vectors generated by frequency divider circuits $371_1$ and $371_5$, respectively), /$V1_{F/2(0)}$ and /$V3_{F/2(90)}$ are selected to be output as fixed-phase output clock signals $CLK_0$, $CLK_{90}$, $CLK_{180}$, $CLK_{270}$, respectively. When the rate select signal indicates a divide-by-four output clock frequency, F/4, fixed-phase vectors $V1_{F/4(0)}$ and $V1_{F/4(90)}$ are output as fixed-phase output clock signals $CLK_0$ and $CLK_{90}$, and their complements, /$V1_{F/4(0)}$ and /$V1_{F/4(90)}$, are output as fixed-phase output clock signals $CLK_{180}$ and $CLK_{270}$. Similarly, when the rate select signal indicates a divide-by-eight output clock frequency, F/8, fixed-phase vectors $V1_{F/8(0)}$ and $V1_{F/8(90)}$ are output as fixed-phase output clock signals $CLK_0$ and $CLK_{90}$, and their complements, /$V1_{F/8(0)}$ and /$V1^{F/8(90)}$, are output as fixed-phase output clock signals $CLK_{180}$ and $CLK_{270}$.

The mixed-phase output clock signals, $CLK_{0-90}$, $CLK_{90-180}$, CLK180-270 and CLK270-0 are selected from respective frequency divider circuits based on the divisor-multiplied phase angle indicated by the rate select signal and the quadrant-select signal. Thus, when the rate select signal indicates a unity frequency, F, the unity phase vector generated by frequency divider circuit $371_2$, which has a phase angle between 0° and 90° (i.e., phase angle +A) according to the interpolation control value applied within interpolator $363_1$, is output as variable-phase clock signal $CLK_{0-90}$. Similarly, the unity phase vector generated by frequency divider circuit $371_8$, which has a phase angle between 270° and 0° (i.e., phase angle −A) according to the complement interpolation control value applied within interpolator $363_4$ is output as variable-phase clock signal $CLK_{270-0}$. Because the output clock signals having phase angles 180°+A and 180°−A are the complements of the $CLK_{0-90}$ and $CLK_{270-0}$ clock signals, the selector circuit selects the complements of clock signals output as $CLK_{0-90}$ and $CLK_{270-0}$ to be the $CLK_{180-270}$ and $CLK_{90-180}$ clock signals, respectively. This correspondence holds throughout table 500 of FIG. 13 as the unity phase vector or frequency-divided phase vector selected to be output as $CLK_{180-270}$ is the complement of the phase vector selected to be output as $CLK_{0-90}$, and the unity phase vector or frequency-divided phase vector selected to be output as $CLK_{90-180}$ is the complement of the phase vector selected to be output as $CLK_{270-0}$.

Still referring to FIG. 13, when the rate select signal indicates an F/2 frequency selection, then the divisor-multiplied phase vector used to generate output clock signal $CLK_{0-90}$ falls in either the first quadrant or second quadrant of a reference clock cycle, depending on whether the selected phase offset is greater or less than 45°. Thus, if the quadrant-select signal indicates that the divisor-multiplied phase vector falls between 0° and 90° (i.e., QS[1:0]=00), then the F/2 phase vector generated by frequency divider circuit $371_2$ (i.e., by frequency dividing interpolated phase vector V12) is selected to be output as clock signal $CLK_{0-90}$. If the quadrant-select signal indicates that the divisor-multiplied phase vector falls between 90° and 180° (i.e., QS[1:0]=01), then the F/2 phase vector generated by frequency divider circuit $371_4$ (i.e., by frequency dividing interpolated phase vector V23) is selected to be output as clock signal $CLK_{0-90}$. Because the output clock signal $CLK_{270-0}$ similarly falls in either the fourth or third quadrants of a reference clock signal according to the selected phase offset, either the F/2 phase vector generated by frequency divider circuit $371_8$ or by frequency divider circuit $371_6$ (which correspond to the interpolated phase vectors V41 and V34, respectively) is selected to be output as clock signal $CLK_{270-0}$, depending on the state of the quadrant select signal.

If the rate select signal indicates an F/4 frequency selection, then the divisor-multiplied phase vector used to generate clock signal $CLK_{0-90}$ falls in either the first, second, third or fourth quadrants of a reference clock cycle, depending on the selected phase offset. Similarly, the divisor-multiplied phase vector used to generate clock signal $CLK_{270-0}$ falls in either the fourth, third, second or first quadrants of a reference clock cycle, depending on the selected phase offset. Accordingly, if the quadrant-select signal indicates that the divisor-multiplied phase vector that corresponds to clock signal $CLK_{0-90}$ falls between 0° and 90°, then the F/4 phase vectors generated by frequency divider circuits $371_2$ and $371_8$ (i.e., by frequency-dividing the interpolated vectors V12 and V41 generated by interpolators $363_1$ and $363_4$) are selected to be output clock signals $CLK_{0-90}$ and $CLK_{270-0}$, respectively. If the quadrant-select signal indicates that the divisor multiplied phase vector that corresponds to the $CLK_{0-90}$ clock signal falls between 90° and 180°, then the F/4 phase vectors generated by frequency divider circuits $371_4$ and $371_6$ (i.e., by frequency-dividing the interpolated vectors V23 and V34 generated by interpolators $363_2$ and $363_3$) are selected to be output clock signals $CLK_{0-90}$ and $CLK_{270-0}$, respectively. If the quadrant-select signal indicates that the divisor multiplied phase vector that corresponds to the $CLK_{0-90}$ clock signal falls between 180° and 270° (i.e., QS[1:0]=10), then the F/4 phase vectors generated by frequency divider circuits $371_6$ and $371_4$ (i.e., by frequency-dividing the interpolated vectors V34 and V23) are selected to be output clock signals $CLK_{0-90}$ and $CLK_{270-0}$, respectively. Finally, if the quadrant-select signal indicates that the divisor multiplied phase vector that corresponds to the CLK$_{0-90}$ clock signal falls between 270° and 0° (i.e., QS[1:0]=11), then the F/4 phase vectors generated by frequency divider circuits 371$_8$ and 371$_2$ (i.e., by frequency-dividing the interpolated vectors V41 and V12) are selected to be output clock signals CLK$_{0-90}$ and CLK$_{270-0}$, respectively.

If the rate select signal indicates an F/8 frequency selection, then the divisor-multiplied phase vector used to generate clock signal CLK$_{0-90}$ falls in either the first, second, third or fourth quadrants of a reference clock cycle, depending on the selected phase offset. Similarly, the divisor-multiplied phase vector used to generate cock signal CLK$_{270-0}$ falls in either the fourth, third, second or first quadrants of a reference clock cycle, depending on the selected phase offset. Accordingly, if the quadrant-select signal indicates that the divisor-multiplied phase vector that corresponds to clock signal CLK$_{0-90}$ falls between 0° and 90°, then the F/8 phase vectors generated by frequency divider circuits 371$_2$ and 371$_8$ (i.e., by frequency-dividing the interpolated vectors V12 and V41 generated by interpolators 363$_1$ and 363$_4$) are selected to be output clock signals CLK$_{0-90}$ and CLK$_{270-0}$, respectively. If the quadrant-select signal indicates that the divisor multiplied phase vector that corresponds to the CLK$_{0-90}$ clock signal falls between 90° and 180°, then the F/8 phase vectors generated by frequency divider circuits 371$_4$ and 371$_6$ (i.e., by frequency-dividing the interpolated vectors V23 and V34 generated by interpolators 363$_2$ and 363$_3$) are selected to be output clock signals CLK$_{0-90}$ and CLK$_{270-0}$, respectively. If the quadrant-select signal indicates that the divisor multiplied phase vector that corresponds to the CLK$_{0-90}$ clock signal falls between 180° and 270° (i.e., QS[1:0]=10), then the F/8 phase vectors generated by frequency divider circuits 371$_6$ and 371$_4$ (i.e., by frequency-dividing the interpolated vectors V34 and V23) are selected to be output clock signals CLK$_{0-90}$ and CLK$_{270-0}$, respectively. Finally, if the quadrant-select signal indicates that the divisor multiplied phase vector that corresponds to the CLK$_{0-90}$ clock signal falls between 270° and 0° (i.e., QS[1:0]=11), then the F/8 phase vectors generated by frequency divider circuits 371$_8$ and 371$_2$ (i.e., by frequency-dividing the interpolated vectors V41 and V12) are selected to be output clock signals CLK$_{0-90}$ and CLK$_{270-0}$, respectively.

Phase Vector Generation using Scaled Replica Delay Elements

Figure 14:
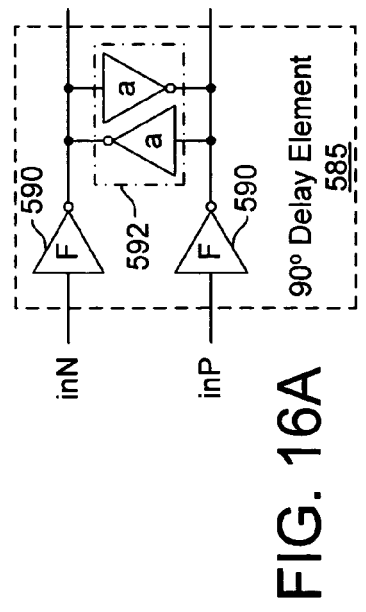
FIG. 14 illustrates an embodiment of a phase vector generator in which primary phase vectors propagate through scaled delay elements to generate secondary phase vectors.

FIG. 14 illustrates an embodiment of a phase vector generator 550 in which primary phase vectors propagate through scaled delay elements, inverters in this example, to generate secondary phase vectors. By this operation, secondary phase vectors may be generated without interpolators, thereby obviating the mixed-phase and fixed-phase interpolators of FIG. 6. In the particular example shown, two series-coupled delay elements 552 each of which introduces a propagation delay that corresponds to a 60° phase delay at the reference loop frequency (i.e., 60° delay elements) are coupled to receive the 0° primary phase vector and therefore output a 120° secondary phase vector; that is, a phase vector that is delayed by 120° relative to the 0° primary phase vector. Two series-coupled delay elements 552 are similarly coupled to receive the 180° primary phase vector and therefore output a 300° secondary phase vector. Two series-coupled 75° delay elements 554 are coupled to receive the 90° primary phase vector and output a 240° secondary phase vector (90°+75°+75°), and two series-coupled 75° delay elements 554 are also coupled to receive the 270° primary phase vector and therefore output a 60° secondary phase vector (270°+75°+75° mod 360°). Secondary phase vectors having other phases may be generated using other delay elements and/or other combinations of the delay elements 552 and 554.

Figure 15:
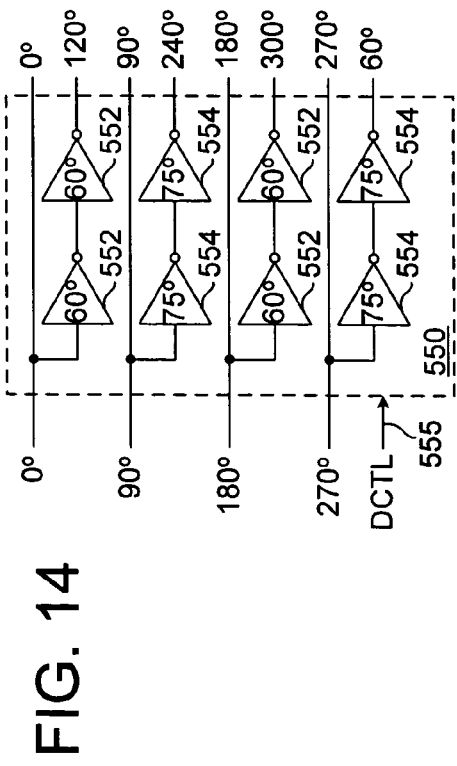
FIG. 15 illustrates a phase-locked loop for generating primary phase vectors and its interconnection to a phase vector generator having scaled delay elements.

In the particular example shown, 0°, 90°, 180° and 270° primary phase vectors are provided from a reference loop along with a delay control signal 555 (DCTL) that is used to control the delay through delay elements within a ring oscillator of the reference loop. By this arrangement, as the delay control signal is adjusted by the reference loop (e.g., in a phase-locked loop, delay-locked loop or similar circuit) to compensate for changes in temperature, voltage or other environmental conditions, the resulting propagation-delay adjustment of delay elements within the reference loop is also applied in the scaled delay elements 552 and 554 of phase vector generator 550. FIG. 15, for example, illustrates a PLL 558 for generating 0°, 90°, 180° and 270° phase vectors and its interconnection to a phase vector generator 560 that operates in generally the same manner as phase vector generator 550. As shown, the PLL 558 includes a voltage-controlled oscillator 567 (VCO), divider 569, phase detector 561, charge pump 563, charge storage element 565 and buffer 566. The VCO 567 is implemented by a ring oscillator in the form of a pair of cross-coupled delay elements 571$a$ and 571$b$, though alternative types of voltage-controlled oscillators may be used in other embodiments. Because the time required for a differential signal to propagate through both inverters 571$a$ and 571$b$ and return to the input of inverter 571 a defines a 180 degree interval of the reference clock signal (i.e., the time between a rising edge and falling edge at the inputs of an inverter 571), it follows that each inverter 571 introduces a quarter-cycle delay (i.e., 90° delay) and therefore that the four outputs of the two differential inverters 571$a$, 571$b$ constitute or may be used to generate 0°, 90°, 180° and 270° primary phase vectors. Also, because the VCO 567 oscillates at a frequency determined by the propagation delay through the differential inverters 571$a$, 571$b$, the output slew rates of the differential inverters 571$a$, 571$b$ may be increased or decreased to increase or decrease the inverter propagation delay and thereby effect a corresponding increase or decrease in the reference loop frequency.

In the exemplary embodiment shown, the divider 569 receives the 0° phase vector (or a buffered version thereof) from the VCO 567 and frequency-divides the 0° phase vector to generate a phase vector 570 that nominally matches the frequency of a reference clock 562 (RefClk). The reference clock 562 and frequency-divided phase vector 570 are supplied to the phase detector 561 which outputs a phase advance signal 564 to the charge pump 563 that indicates whether phase vector 570 vector leads or lags the reference clock signal 562. When the phase advance signal indicates that the phase vector 570 lags the reference clock signal 562, the charge pump 563 pulses the charge storage element 565 to increase the voltage level thereon, thereby increasing the level of the delay control signal 555. The delay control signal 555 is used, in turn, to control the slew rate of the differential inverters 571 and so, when increased, shortens the delay through the differential inverters 571 and increases the oscillating frequency of the reference loop 558.

In one embodiment, the delay control signal 555 is a current (i.e., buffer 566 performs a voltage-to-current conversion) that is used to bias the differential inverters 571 to achieve a desired output slew rate. In alternative embodiments, the delay control signal 555 may be a voltage (e.g., buffer 566 may be a voltage follower or other buffer, or omitted altogether) that is used to power or otherwise control the output slew rates of the differential inverters 571.

In either case, the delay control signal 555 is provided to the phase vector generator 560 where it is used to control the output slew rates of differential inverters 572 and 574 in the same manner as the differential inverters 571 within the reference loop. By this arrangement, and by scaling components within the differential inverters 572 and 574 to provide a scaled delay relative to differential inverters 571, the differential inverters 572 and 574 act as scaled delay elements that are adjusted, along with the differential inverters 571 within the VCO 567, in response to the delay control signal 555. Thus, the 0° and 180° phase vectors are each delayed by two differential 60° delay elements (i.e., scaled differential inverters in the embodiment of FIG. 15) to yield 120° and 300° phase vectors, and the 90° and 270° phase vectors are each delayed by two differential 75° delay elements to yield 240° and 60° phase vectors.

Figure 16A:
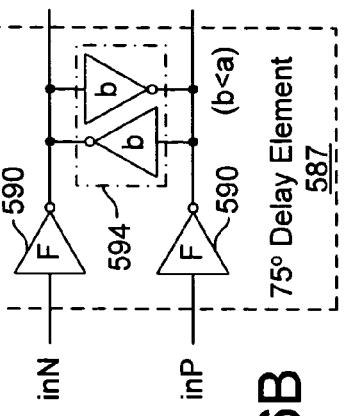
FIGS. 16A-16C illustrate exemplary delay elements that may be used to implement the delay elements shown in FIG. 15.
Figure 16B:
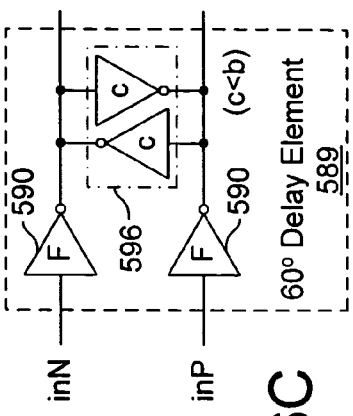
Figure 16C:
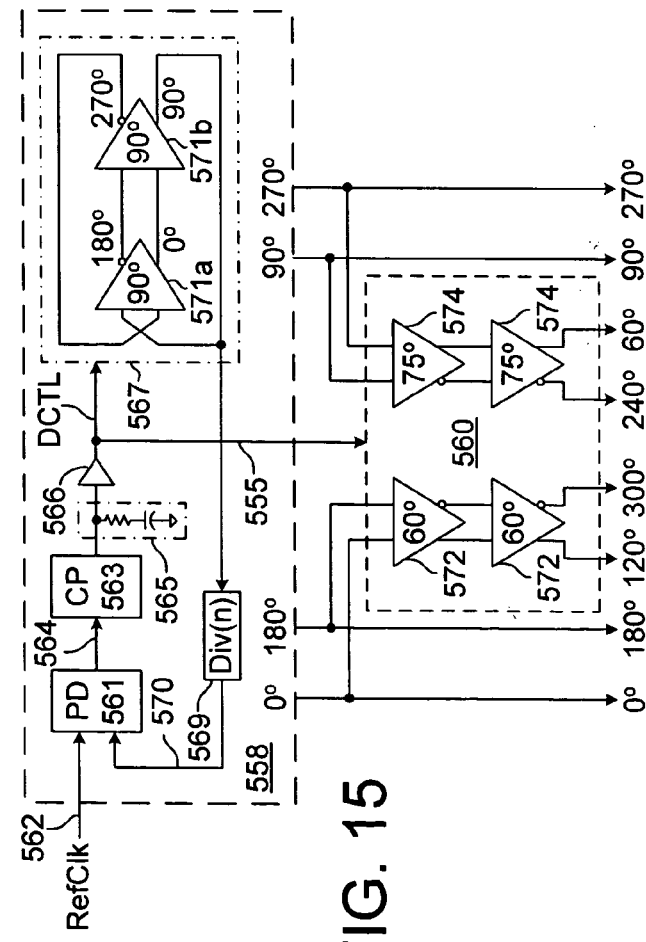

FIGS. 16A-16C illustrate exemplary delay elements 585, 587 and 589 that may be used to implement elements 571, 572 and 574 of FIG. 15. Referring first to FIG. 16A, delay element 585 includes a pair of driver inverters 590 having inputs, inN and inP, to receive a differential input signal and outputs coupled to respective nodes of a latch 592 formed by back-to-back coupled inverters. Assuming that the latch 592 is initially in a first state, then a transition of the differential input signal from one stable state to another will cause the outputs of inverters 590 to change state, with the latch 592 resisting the change in state in accordance with the loop gain established by the back-to-back coupled inverters. That is, the greater the loop gain of the latch 592, the greater the resistance to change in state and, therefore, the longer the time required to change state. Because the loop gain of the latch 592 may be increased and decreased by scaling the size 'a' (e.g., the width-length ratio) of transistors within the back-to-back coupled inverters, a correspondingly (though not necessarily linear) scaling of the output slew rate of the delay element 585 may be achieved, thereby establishing a scaled delay. Referring to FIG. 16B, for example, a 75° delay element 587 is realized by implementing latch 594 with transistors having a width-length ratio 'b' that is smaller than the width-length ratio 'a' of transistors within latch 592 of delay element 585. The ratio b/a is selected to provide a ⅙ reduction in propagation time through the delay element 574 relative to delay element 585 (i.e., output slew rate is increased such that a differential transition is more rapidly reflected at the output of the delay element 585), thereby providing a 75° differential delay element. In FIG. 16C, a 60° differential delay element is realized by implementing a latch 596 with transistors having a width-length ratio 'c' that is smaller than the width-length ratio 'b' to provide a ⅓ reduction in propagation time relative to the 90° delay element 585.

Still referring to FIGS. 16A-16C, each of the component inverters (i.e., 590 and the back-to-back coupled inverters in latches 592, 594 and 596) or any subset thereof may be biased, powered or otherwise controlled by the delay control signal 555 of FIG. 15 so that, as the delay control signal is adjusted to maintain closed-loop control of the 90° delay element 585, a corresponding adjustment in the propagation delay of the scaled 60° and 75° delay elements is effected. Through a combination of component scaling to achieve a nominal scaled propagation delay, and dynamic delay control using a feedback-generated delay control signal, scaled delay elements that exhibit accurate propagation delays over changes in environmental conditions (e.g., voltage and/or temperature drift) and process variations may be realized.

Further, because scaled delay elements may be implemented using substantially fewer transistors than phase vector interpolators and tend to consume less power and introduce less clock jitter, the scaled delay elements may be used to generate higher quality clock signals while at the same time lowering production and operating costs. The phase vector generators of FIGS. 14 and 15 may be used, for example, in place of the mixed-phase interpolators of FIG. 6, obviating the fixed-phase interpolators provided for delay matching purposes and thereby saving more power and die area.

Figure 17B:
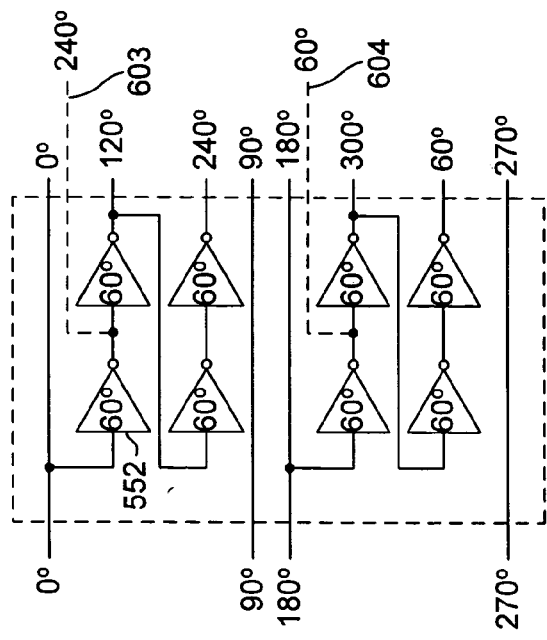
FIGS. 17A and 17B illustrate alternative combinations of delay elements that may be used to generate secondary phase vectors.
Figure 17A:
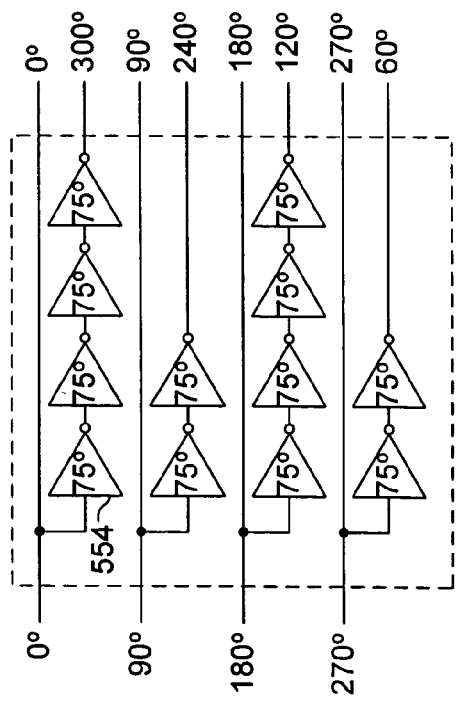

Referring again to FIG. 14, it should be noted that numerous alternative delay element arrangements may be used to generate the secondary phase vectors. For example, instead of pairs of 60° and 75° delay elements 552, 554, a single 120° delay element (e.g., a single or differential inverter exhibiting a 120° propagation delay) may be used in place of the series-coupled pairs of 60° delay elements 552 to generate the 120° and 300° phase vectors and/or a single 150° delay element may be used in place of the series-coupled pairs of 75° delay elements 554 to generate the 60 and 240 degree phase vectors. Also, a combination of delay elements all exhibiting the same (or substantially the same) propagation delay may be used instead of the mixed-delay element arrangement shown in FIG. 14. For example, the series-coupled pairs of 60° delay elements 552 may be replaced by respective sets of four 75° delay elements 554 to generate the 300° and 120° phase vectors, as shown in FIG. 17A. Alternatively, as shown in FIG. 17B, an additional pair of series-coupled 60° delay elements 552 may be coupled to receive the 120° phase vector and another additional pair of series-coupled 60° delay elements 552 coupled to receive the 300° phase vector, thereby generating the 240° and 60° phase vectors, and obviating the 75° delay elements 554 of FIG. 14. Numerous other combinations of delay elements representing virtually any combination of propagation delays may be used to generate the secondary phase vectors in alternative embodiments. For example, in the embodiment of FIG. 17B, the 60° and 240° phase vectors may be generated by single 60° delay elements 552 as shown by dashed lines 603 and 604, thereby obviating the additional pairs of 60° delay elements otherwise used to generate those phase vectors. Also, as discussed above, though four secondary phase vectors having 60°, 120°, 240° and 300° phase angles are generated in the embodiments of FIGS. 17A and 17B, more or fewer secondary phase vectors having the same or different phase angles may be generated in alternative embodiments.

Figure 18B:
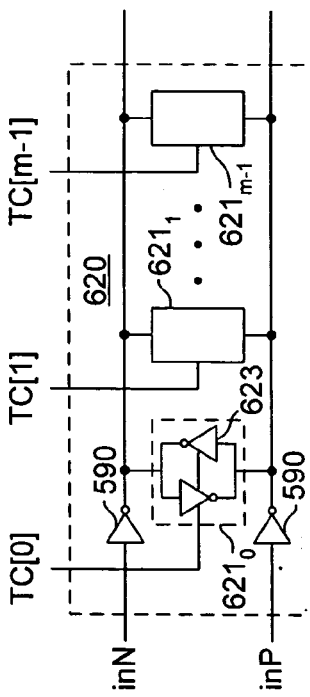
FIGS. 18A and 18B illustrate exemplary embodiments of variable-delay elements that may be used to generate phase vectors having programmably selected phase angles.
Figure 18A:
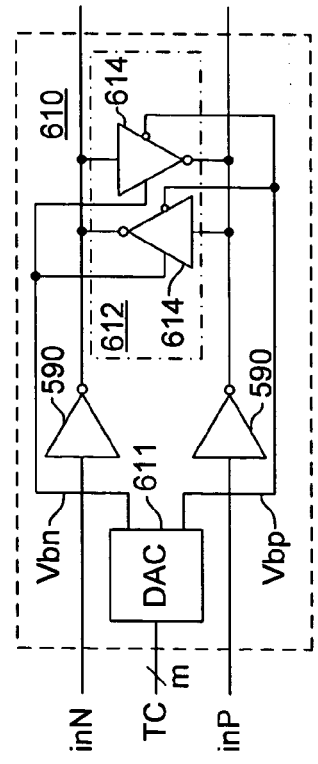

FIGS. 18A and 18B illustrate exemplary embodiments of variable-delay elements that may be used to generate phase vectors having programmably selected phase angles. Such delay elements may be used, for example, in place of the mixed-phase interpolators 363 of FIG. 9, to enable generation of phase vectors having a selectable phase range, and may also be used to enable the phase angles of secondary phase vectors to be calibrated in a phase calibration operation. In the embodiment of FIG. 18A, a variable-delay element 610 includes a digital-to-analog converter 611 (DAC), driver inverters 590 and a latch 612 formed by back-to-back coupled inverters 614. The driver inverters 590 have inputs coupled to receive a differential input signal, inN and inP, and outputs coupled to respective nodes of the latch 612 to form the outputs of the delay element. Thus, the total propagation delay through the delay element 610 is a function of the loop gain of the back-to-back coupled inverters 614 as in the delay elements of FIGS. 16A-16C. The DAC 611 receives an m-bit trim control value, TC (e.g., from a programmable register or other control source) and, in response, generates a pair of bias voltages, Vbn and Vbp, that are supplied to the back-to-back coupled inverter elements 614 to control the loop gain of the latch 612. By this arrangement, as the trim control value is increased from a minimum to a maximum value, the bias voltages are adjusted accordingly to increase the loop gain of the latch 612 from a minimum to a maximum value, thereby providing a range of delays within the delay element. The DAC may alternatively be a current DAC that establishes one or more bias currents within the inverters 614 to establish a desired delay through the delay element 610.

In the embodiment of FIG. 18B, delay element 620 includes driver inverters 590 coupled to receive a differential input signal and having outputs that form the output nodes of the delay element. A set of latch elements $621_0$-$621_{m-1}$ are coupled in parallel between the output nodes of the delay element 620, with each latch element 621 being in either a latch state or a tri-state condition according to the state of a respective one of trim control signals TC[m-1:0]. As an example, in one embodiment, when the TC[0] is low, inverters 623 are tri-stated to set latch element $621_0$ to a tri-state condition (i.e., appearing as an open circuit between the outputs of driver inverters 590) and therefore contributes negligible resistance to change in state when the differential input signal transitions from one state to another. When TC[0] is high, the latch element $621_0$ is enabled to latch the output state of the driver inverters 590, and therefore provides a measure of resistance to change in state. By this arrangement, the various latch elements $621_0$-$621_{m-1}$ may be selectively tri-stated or enabled in different patterns to control the total resistance to change in state on the outputs of the driver inverters 590 and thus control the total delay through the delay element 620. The individual latch elements 621 may be weighted (e.g., binary weighted by providing differently sized-components such that latch element $621_1$, when enabled, provides twice the incremental delay of latch element $621_0$, latch element $621_2$ provides twice the incremental delay of latch element $621_1$, and so forth) and/or thermometer coded as necessary to provide a desired delay range and resolution. More generally, virtually any circuit arrangement that may be used to provide a controlled propagation delay in a delay element may be used in alternative embodiments.

Self-Aligning Clock Divider

Figure 19:
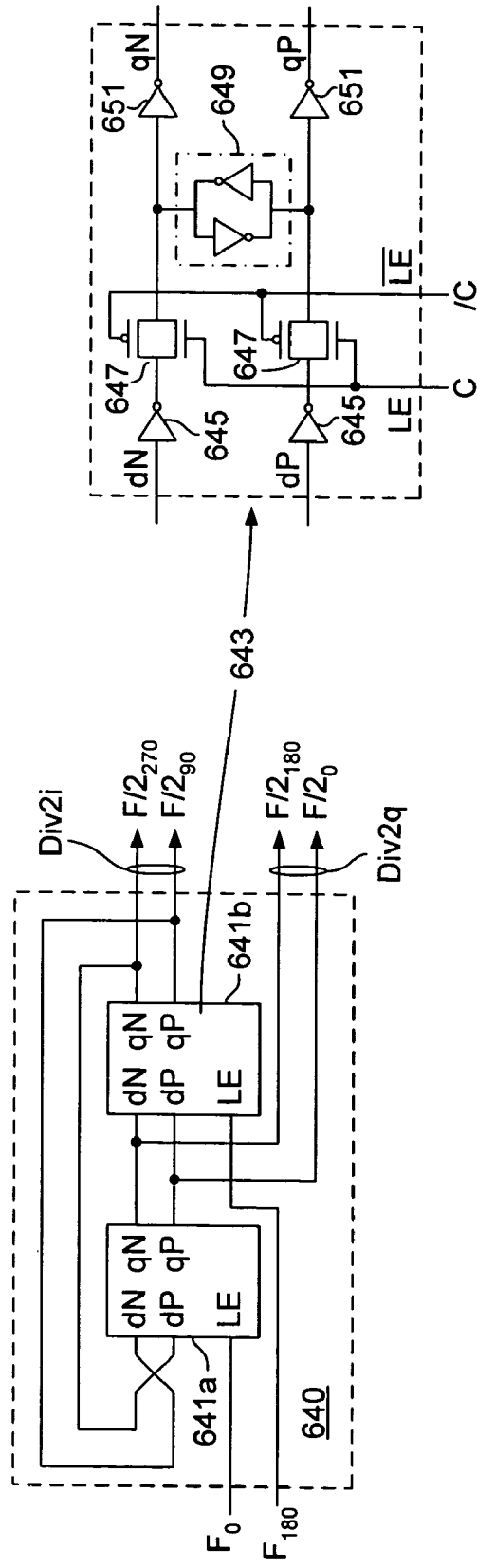
FIG. 19 illustrates an embodiment of a self-aligning clock divider that may be used to generate frequency-divided, quadrature clock signals.
Figure 20:
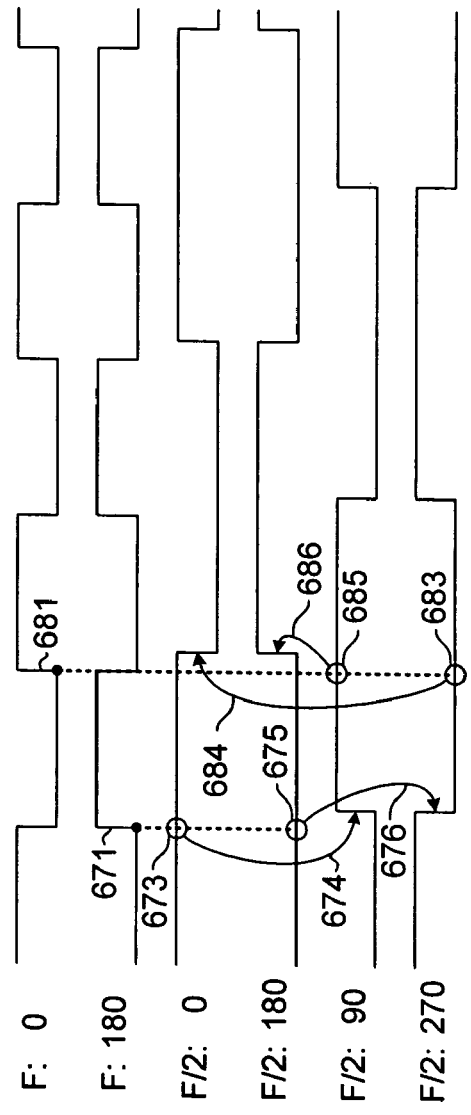
FIG. 20 is a timing diagram illustrating the operation of the clock divider of FIG. 19.

FIG. 19 illustrates an embodiment of a self-aligning clock divider 640 that may be used in place of the frequency divider circuits of FIGS. 4 and 7 to generate frequency-divided, quadrature clock signals. The clock divider includes a pair of differential, transparent latch elements 641a, 641b coupled to one another in a balanced, master-slave flip-flop configuration. That is, the differential outputs (qP, qN) of latch element 641a are coupled to the differential inputs (dP, dN) of latch element 641b, and the differential outputs of latch element 641b are cross-coupled to the differential inputs of latch element 641a (i.e., qP coupled to dN, and qN coupled to dP). By this arrangement, and by clocking the latch enable inputs (LE) of the latch elements 641a and 641b with respective component clock signals of a differential clock signal having frequency F (e.g., $F_0$ and $F_{180}$ as shown in FIG. 19), the differential outputs of the latch elements 641a, 641b change state at frequency F/2, and exhibit a quadrature relation to one another. Thus, if the differential outputs of latch element 641a are designated to be 0° and 180° phase angles (i.e., $F/2_0$ and $F/2_{180}$), then the differential outputs of latch element 641b have 90° and 270° phase angles (i.e., $F/2_{90}$ and $F/2_{270}$). FIG. 20 is a timing diagram illustrating the operation of the clock divider of FIG. 19. Assuming that the differential outputs of latch element 641a (i.e., $F/2_0$ and $F/2_{180}$) are initially in a high-low state (i.e., qP=H, qN=L), then the rising edge 671 of the $F_{180}$ clock signal will enable latch element 641b to sample the $F/2_0$ and $F/2_{180}$ signals at times 673 and 675, thereby creating the $F/2_{90}$ and $F/2_{270}$ transitions shown at 674 and 676. Consequently, the ensuing rising edge 681 of the $F_0$ signal will trigger latch element 641a to sample the $F/2_{270}$ and $F/2_{90}$ signals at the times shown at 683 and 685, thereby producing the $F/2_0$ and $F/2_{180}$ transitions shown at 684 and 686. Note that, if the latch element 641b powers up in a high-low state instead of the low-high state shown in FIG. 20, the samples at 673 and 675 will cause latch element 641b to remain in the high-low state so that proper quadrature F/2 clocks will be generated. Similarly, if latch element 641a powers up in a low-high state instead of a high-low state, then the samples at 673 and 675 will produce state transitions opposite those shown at 674 and 676 (i.e., assuming that latch element 641b powers up in a high-low state), but proper quadrature F/2 clocks will still be generated. Thus, regardless of the initial states of latch elements 641a and 641b, the latch elements 641a, 641b will properly generate in-phase and quadrature differential clock signals (Div2i and Div2q, respectively) having half the frequency of the clock signals supplied to the latch enable inputs. There is no invalid power up state, so that no initial values need to be loaded into the latch elements 641 in order to ensure proper operation. Accordingly, clock divider 640 is self-initializing and self-aligning (i.e., auto-aligning) and requires no reset or initialization circuitry.

Still referring to FIG. 19, each of the differential latch elements 641a, 641b may be constructed using a pair of input inverters 645, pass gates 647, storage element 649 and output inverters 651 as shown in detail view 643 (other circuit arrangements may be used in alternative embodiments). The input inverters 645 constitute the dN and dP inputs of the latch element and are coupled to receive a differential input signal. The outputs of the input inverters 645 are coupled, via respective pass gates 647, to opposite nodes of the storage element 649 and to output inverters 651. The storage element 649 is formed by a pair of cross-coupled inverters (though other types of storage elements may be used) and is used to maintain the state of the latch element when the pass gates 647 are switched to a non-conducting state, and the output inverters 651 are used to drive a differential output signal via nodes qN and qP. By this arrangement, when a differential control signal (C, /C) applied to latch enable inputs LE, /LE goes high (i.e., C=1, /C=0), pass gates 647 are switched on to enable the state of the storage element 649 to be updated (i.e., flipped or maintained in the same state) based on the state of the differential input signal. By powering the back-to-back coupled inverters within latch element 649 with logic supply voltages (e.g., ground and $V_{DD}$ in a CMOS process), small-swing differential input signals may be automatically converted to logic levels in the differential output signals, obviating separate level converter circuits at the input (or output) of clock divider 640. Avoiding level converter circuits at the input or output of the clock divider 640 provides a significant benefit as such converter circuits consume additional power and die area and tend to introduce duty cycle distortion due to asymmetric conversion of rising and falling clock edges. Separate level-converting circuits may-be provided in alternative embodiments.

Figure 21:
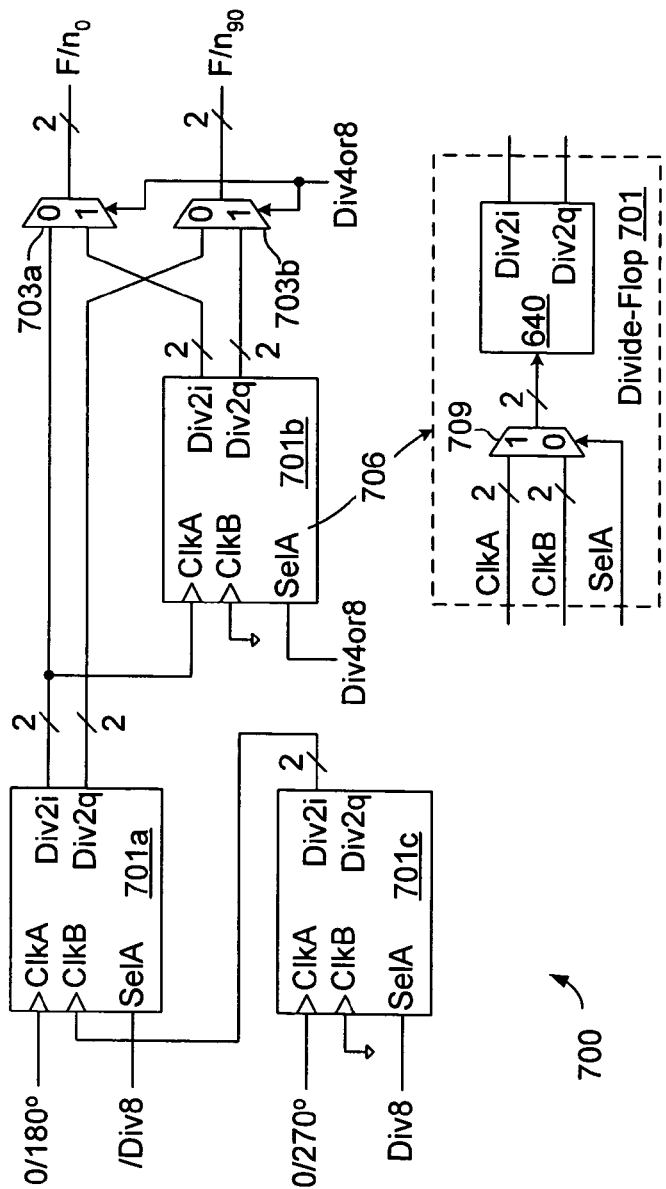
FIGS. 21 and 22 illustrate embodiments of selectable-frequency clock divider circuits that may be used in place of the frequency divider circuits of FIGS. 4 and 7 to generate primary phase vectors at a selected sub-divided frequency.
Figure 22:
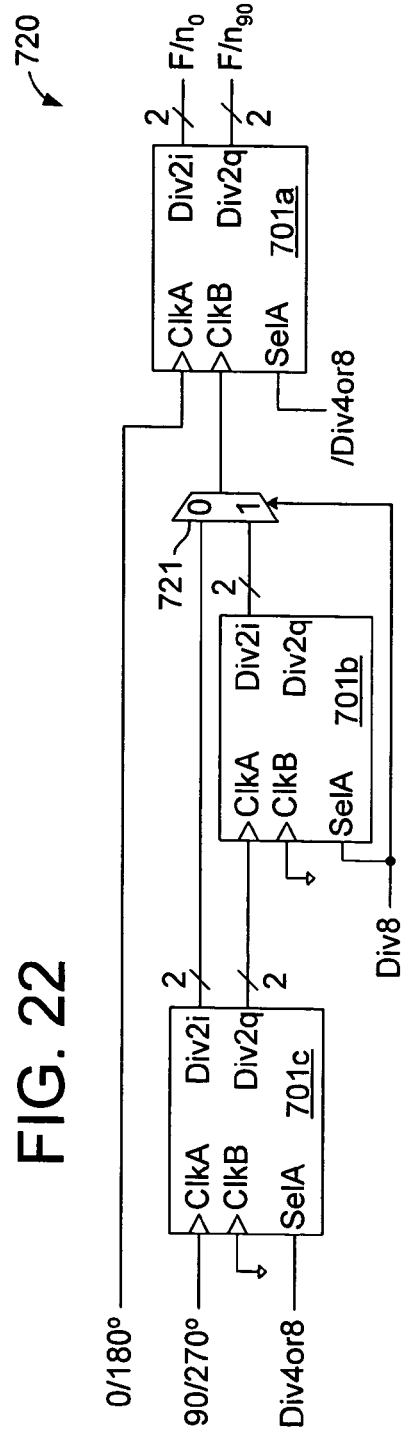

FIGS. 21 and 22 illustrate embodiments of selectable-frequency clock divider circuits 700 and 720 that may be used in place of the frequency divider circuits of FIGS. 4 and 7 to generate primary clock phases (0, 90, 180, 270) at divide-by-2, divide-by-4 and divide-by-8 frequencies. Other divisors may be used to generate clock signals having different frequencies in alternative embodiments.

Referring first to clock divider 700 of FIG. 21, a set of three divide-flops 701a, 701b and 701c, and a pair of output multiplexers 703a, 703b are coupled to one another to provide primary phase vectors having a divide-by-n ratio, where n is specified by a pair of control signals Div8 and Div4or8 to be either 2, 4 or 8. As shown in detail view 706, each of the divide-flops 701 is formed by a multiplexer 709 and an instance of the self-initializing clock divider 640 described in reference to FIGS. 19 and 20. The multiplexer 709 passes one of two differential input clocks (ClkA, ClkB) to the differential clock input of the clock divider 640 according to the state of a select signal, SelA. That is, when SelA is high, ClkA is passed to the clock divider 640 and when SelA is low, ClkB is passed to the clock divider 640. The clock divider 640 operates as described in reference to FIGS. 19 and 20 to generate two differential clock signals each having half the frequency of the differential input clock signal: an in-phase differential clock signal, Div2i having 0° and 180° phase components, and a differential quadrature clock signal, Div2q, having 90° and 270° phase components. Divide-flop 701a is coupled to receive 0° and 180° unity-phase primary phase vectors (i.e., differential clock signal, $F_0$) at its ClkA input, the in-phase output (Div2i) of divide-flop 701c at its ClkB input, and the complement of control signal Div8 at its select input. Divide-flop 701c is coupled to receive 90° and 270° unity-phase primary phase vectors (i.e., differential clock signal, $F_{90}$) at its ClkA input and control signal Div8 at its select input. Divide-flop 701b is coupled to receive the in-phase output of divide-flop 701a at its ClkA input and control signal Div4or8 at its select input. The in-phase output of divide-flop 701a is supplied to a first input of output multiplexer 703a, and the quadrature output of divide-flop 701a (Div2q) is supplied to the first input of output multiplexer 703b. The in-phase output of divide-flop 701b is provided to the second input of multiplexer 703a, and the quadrature output of divide-flop 701b is provided to the second input of multiplexer 703b. Control signal Div4or8 is supplied to the select inputs of multiplexers 703a and 703b so that, if a divide-by-4 or divide-by-8 set of primary phase vectors is desired (i.e., Div4or8 is high), the divide-flop 701b is selected to source the divided phase vectors and, if a divide-by-2 set of primary phase vectors is desired, divide flop 701a is selected to source the divided phase vectors.

When a divide-by-2 set of primary phase vectors is desired, the Div8 and Div4or8 signals are lowered so that divide-flops 701b and 701c each select grounded clock inputs (ClkB) and are therefore disabled; a non-toggling, power-saving state. Because Div8 is low, divide-flop 701a generates a set of in-phase and quadrature phase vectors each having frequency F/2 based on the 0/180° differential clock signal at ClkA. Also, because Div4or8 is low, the F/2 in-phase and quadrature clock signals (0/180° and 90/270°) are passed to the output nodes of the clock divider 700 via multiplexers 703a and 703b. When a divide-by-4 set of primary phase vectors is desired, Div8 is lowered to disable divide-flop 701c and Div4or8 is raised. Divide-flop 701a generates in-phase differential clock signals and quadrature differential clock signals having frequency F/2 as in the divide-by-2 configuration described above, with the high-state of Div4or8 selecting the in-phase F/2 differential clock signal from divide-flop 701a as the input clock for divide-flop 701b. By this operation, divide-flop 701b generates in-phase and quadrature differential clock signals having frequency F/4 which, due to the high state of Div4or8, are output from the clock divider 700 via multiplexers 703a and 703b. When a divide-by-8 set of primary phase vectors is desired, Div8 and Div4or8 are both raised. Divide-flop 701c responds to the high state of Div8 by selecting the undivided 90/270° differential clock signal as its input clock and therefore generates in-phase and quadrature differential clock signals having frequency F/2. The high state of Div8 also causes divide-flop 701a to select the in-phase F/2 clock signals ($F/2_0$ and $F/2_{180}$) generated by divide-flop 701c as its clock inputs. Consequently, divide-flop 701a supplies in-phase differential clock signals having frequency F/4 to the ClkA input of divide-flop 701b which, in response to the high state of Div4or8, outputs in-phase and quadrature clock signals having frequency F/8 from the clock divider 700 via multiplexers 703a, 703b.

One beneficial characteristic of clock divider 700, is that a relatively compact output multiplexing arrangement is used to provide primary phase vectors at the various selectable output clock frequencies. In effect, the selection of the frequency divisor is performed at the front-end of the divide-flops 701 by selecting either a divided or undivided clock source at the input of divide-flop 701a and selectively bypassing divide-flop 701b (i.e., in the divide-by-2 case). Such compact output multiplexing tends to reduce undesired signal coupling and therefore improve signal quality as compared, for example, with a multiplexing arrangement in which separate sets of phase vectors at each selectable frequency are provided to respective input ports of an output multiplexer. Also, the ability to place unused divide-flops in a reduced power state (e.g., 701c in the divide-by-2 or divide-by 4 cases, and 701c and 701b in the divide by 2 case), may provide substantial power savings (and therefore reduced heat generation) over embodiments in which phase vector sets are generated for all divide ratios, then selected in a final output multiplexer. Note that additional power savings may be achieved by disabling divide-flop 701a when no frequency division is required. For example, a Div2or4 control signal may be provided to the select input of divide-flop 701a to select the ClkA input only when a divide-by-2 or divide-by-4 set of output clock signals is desired, thereby disabling divide-flop 701a when Div2or4 and Div8 are both low.

FIG. 22 illustrates an alternative embodiment of a clock divider 720 capable of selectively outputting divide-by-2, divide-by-4 and divide-by-8 phase vectors with no output multiplexing. Divide-flop 701c receives an undivided 90/270° differential input clock at its ClkA input, a Div4or8 control signal at its select input and has a grounded ClkB input. By this arrangement, when Div4or8 is lowered (i.e., indicating that a set of primary phase vectors having frequency F/2 is desired), divide-flop 701c is disabled. When Div4or8 is raised, divide-flop 701c outputs an in-phase differential clock signal having frequency F/2 to a first input of multiplexer 721, and a quadrature differential clock signal having frequency F/2 to divide-flop 701b.

Divide-flop 701b receives the quadrature differential clock signal (Div2q) generated by divide-flop 701c at its ClkA input, a Div8 control signal at its select input, and has a grounded ClkB input. Thus, when Div8 is low, divide-flop 701b is disabled and, when Div8 is high (and Div4or8 is high), divide-flop 701b outputs an in-phase differential clock signal having frequency F/4 to a second input of multiplexer 721. The Div8 control signal is supplied to the select input of multiplexer 721 so that multiplexer 721 passes either the F/2 differential clock signal from divide-flop 701c or the F/4 differential clock signal from divide-flop 701b to divide-flop 701a depending on whether the output clock signal is to be frequency-divided by four or eight, respectively.

Divide-flop 701a receives an undivided differential input clock signal (i.e., 0/180°) at its ClkA input, the frequency-divided differential clock signal (F/2 or F/4) from multiplexer 721 at its ClkB input, and the complement of control signal Div4or 8 at its select input. By this arrangement, when the Div4or8 signal is low, the undivided differential clock at the ClkA input is frequency-divided within divide-flop 701a to generate in-phase and quadrature differential clock signals having frequency F/2, thereby providing four primary phase vectors 0, 90, 180 and 270 having frequency F/2 at the clock divider output. When the Div4or8 signal is high, the frequency-divided clock signal supplied to the ClkB input of divide-flop 701a is further divided to generate in-phase and quadrature differential clock signals having either frequency F/4 or frequency F/8 according to the state of control signal Div8.

Secondary Phase Vector Generation through Primaary Phase Retiming

Figure 24:
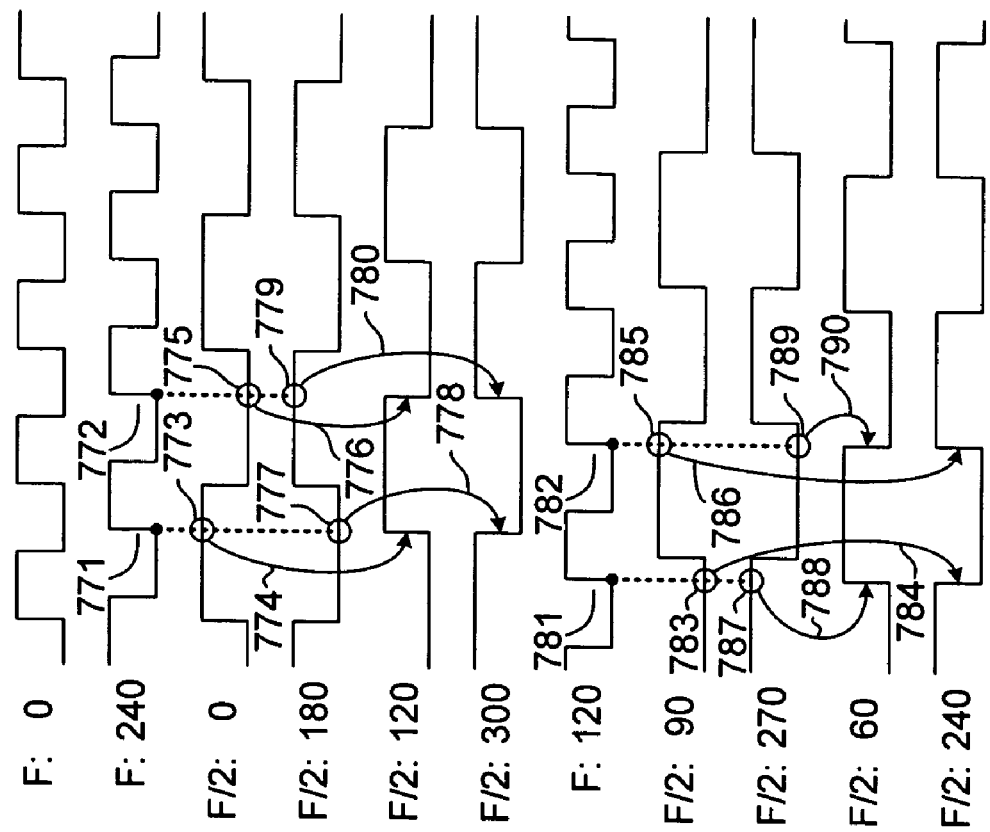
FIG. 24 is a timing diagram illustrating the operation of the clock re-timing circuit of FIG. 23.
Figure 23:
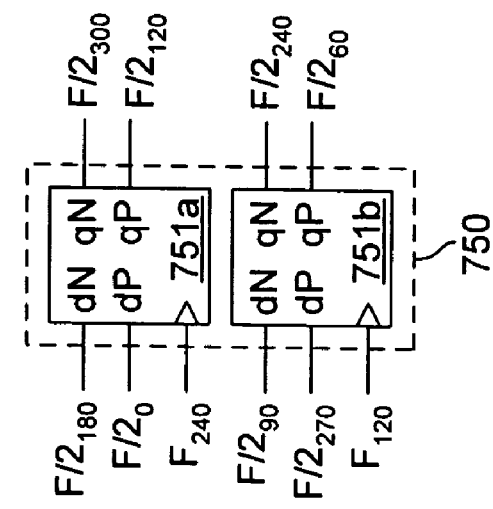
FIG. 23 illustrates an embodiment of a clock re-timing circuit that generates frequency-divided secondary phase vectors by sampling frequency-divided primary phase vectors in response to transitions of undivided secondary phase vectors.

FIG. 23 illustrates an embodiment of a clock re-timing circuit 750 that generates frequency-divided secondary phase vectors by sampling frequency-divided primary phase vectors in response to transitions of undivided secondary phase vectors. In the embodiment shown, the clock re-timing circuit 750 includes a pair of differential flip-flops 751a, 751b each having a differential data input (dN, dP), a differential data output (qN, qP), and a clock input ('>'). An in-phase differential clock signal having frequency F/2 (i.e., $F/2_0$ and $F/2_{180}$) is provided to the differential data input of flip-flop 751a, and a quadrature differential clock signal having frequency F/2 (i.e., $F/2_{90}$, $F/2_{270}$) is provided to the differential data input of flip-flop 751b. The clock input of flip-flop 751a is coupled to receive the undivided secondary phase vector, $F_{240}$ and the clock input of flip-flop 751b is coupled to receive undivided secondary phase vector $F_{120}$ (note that the clock inputs of flip-flops 751 may be differential so that flip-flop 751a additionally receives complementary phase vector $F_{60}$, and flip-flop 751 additionally receives complementary phase vector $F_{300}$). By this arrangement, flip-flop 751a samples the state of the in-phase, frequency-divided primary phase vectors, $F/2_0$ and $F/2_{180}$, in response to each rising edge of the undivided secondary phase vector, $F_{240}$, to produce differential secondary phase vectors having 120° and 300° phase angles at frequency F/2. Flip-flop 751b similarly samples the state of the divided, quadrature primary phase vectors, $F/2_{90}$ and $F/2_{270}$, in response to each rising edge of the undivided secondary phase vector, $F_{120}$, to produce differential secondary phase vectors having 60° and 240° phase angles at frequency F/2. Referring to the timing diagram 770 of FIG. 24, for example, the $F_{240}$ rising edge shown at 771 triggers sampling of the $F/2_0$ phase vector at point 773 to produce the rising edge in phase vector $F/2_{120}$ shown at 774, and the subsequent $F_{240}$ rising edge shown at 772 triggers sampling of the $F/2_0$ phase vector at point 775 to produce the falling edge of phase vector $F/2_{120}$ shown at 776. The $F_{240}$ rising edges at 771 and 772 also trigger the sampling of the $F/2_{180}$ phase vector at points 777 and 779, respectively, to produce the $F/2_{300}$ transitions shown at 778 and 780. The $F_{120}$ rising edge shown at 781 triggers sampling of the $F/2_{90}$ phase vector at point 783 to produce the falling edge in phase vector $F/2_{240}$ shown at 784, and the subsequent $F_{120}$ rising edge shown at 782 triggers sampling of the $F/2_{90}$ phase vector at point 785 to produce the rising edge of phase vector $F/2_{240}$ shown at 786. The $F_{120}$ rising edges at 781 and 782 also trigger sampling of the $F/2_{270}$ phase vector at points 787 and 789 to produce the $F/2_{60}$ rising and falling transitions shown at 788 and 790, respectively.

Selectable-Freguency Clock Divider Implemented with Divide-Flops and Re-Timers

Figure 25:
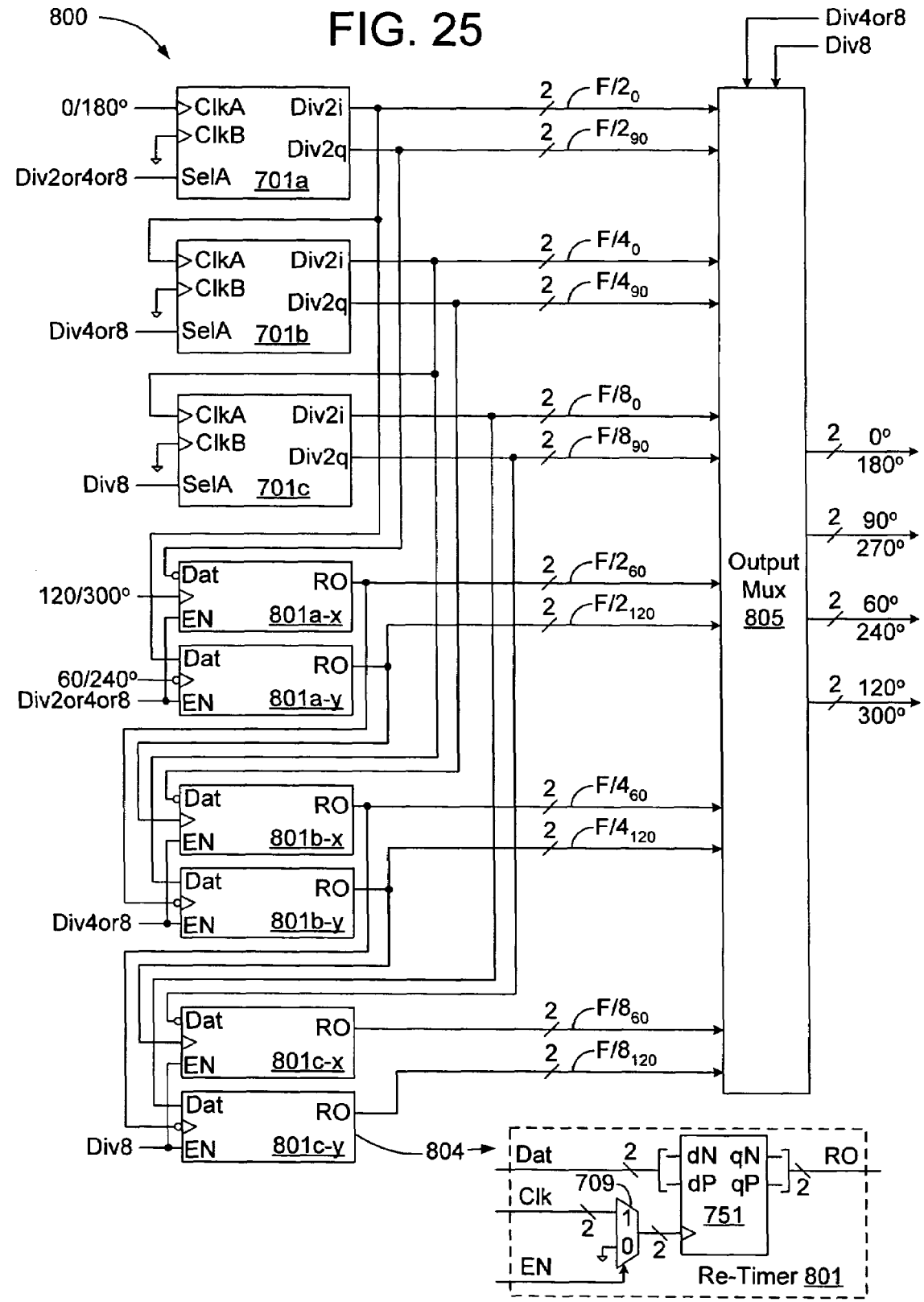
FIG. 25 illustrates an embodiment of a clock divider that generates primary and secondary phase vectors at a selected subdivided frequency using a combination of divide-flops and clock re-timing circuits.

FIG. 25 illustrates an embodiment of a clock divider 800 that generates primary and secondary phase vectors at a selected subdivided frequency using a combination of divide-flops and clock re-timing circuits. More specifically, the clock divider 800 includes an output multiplexer 805, a set of divide-flops 701a, 701b, 701c to generate differential in-phase (0/180°) and quadrature (90/270°) primary phase vectors at subdivided frequencies F/2, F/4 and F/8 , and a set of clock re-timers 801a-x, 801a-y, 801b-x, 801b-y, 801c-x and 801c-y to generate differential secondary phase vectors having phase angles 60/240° and 120/300° at the subdivided frequencies F/2 , F/4 and F/8.

Referring first to primary phase generation, divide-flop 701a receives an undivided in-phase differential clock signal (0/180°) at its ClkA input, a Div2or4or8 control signal at its select input, and has a grounded ClkB input. The Div2or4or8 control signal is raised when a frequency-divided set of phase vectors is desired and lowered otherwise (i.e., when a unity phase vector set is desired). By this arrangement, divide-flop 701a is disabled when frequency division is unneeded, and otherwise outputs in-phase and quadrature differential clock signals at frequency F/2 (i.e., $F/2_0$ and $F/2_{90}$ and their complements) to an input port of multiplexer 805. The ClkA input of divide-flop 701b is coupled to the in-phase output of divide-flop 701a so that, when Div2or4or8 is high, divide-flop 701b receives the F/2 in-phase differential clock signal ($F/2_0$ and $F/2_{180}$) at its CLkA input. The select input of divide-flop 701b is coupled to receive a Div4or8 control signal, and the ClkB input of divide-flop 701b is grounded. The Div4or8 signal is raised when F/4 or F/8 output clock signals are desired, and lowered otherwise. Thus, divide-flop 701b is disabled when a divide-by-2 or unity phase vector set is selected, and otherwise outputs in-phase and quadrature differential clock signals at frequency F/4 to an input port of multiplexer 805. The ClkA input of divide-flop 701c is coupled to the in-phase output of divide-flop 701b so that, when Div4or8 is high, divide-flop 701c receives the F/4 in-phase differential clock signal ($F/4_0$ and $F/4_{180}$) at its ClkA input. The select input of divide-flop 701c is coupled to receive a Div8 control signal, and the ClkB input is grounded. Thus, divide-flop 701c is disabled when a divide-by-4, divide-by-2 or unity phase vector set is selected (i.e., when Div8 is low), and otherwise outputs in-phase and quadrature differential clock signals at frequency F/8 to an input port of multiplexer 805.

In one embodiment, each of the clock re-timers 801 ("re-timer" for short) is implemented by a differential flip-flop 751 and a multiplexer 709 as shown at detail view 804. An enable input of the re-timer is coupled to a select input of the multiplexer 709 so that, when an enable signal EN is high, the differential clock signal presented at the clock input, Clk (depicted as a '>' symbol in re-timers 801a-x, 801a-y, 801b-x, 801b-y, 801c-x and 801c-y), is passed to a clock input of the differential flip-flop. When the enable signal is low, the clock input of the flip-flop 751 is grounded, preventing the flip-flop 751 from toggling and therefore placing the re-timer 801 in a reduced-power, disabled state. A differential data input of the re-timer 801 is coupled to the differential inputs (dP, dN) of the flip-flop 751 and the differential outputs (qP, qN) of the flip-flop 751 constitute the re-timer output, RO. Thus, when a logic-high signal is provided at the enable input of a given re-timer, the re-timer 801 is enabled and operates generally in the manner discussed in reference to FIG. 23 to re-time the differential clock signal presented at the data input. When a logic-low signal is provided at the enable input of a re-timer, the clock input of the flip-flop is grounded to prevent flip-flop 751 from toggling and thereby placing the re-timer in a disabled, reduced-power state. Note that the inversion dot at the data input or clock input of a re-timer 801 indicates that incoming differential signal is cross-coupled to the differential clock input or differential data input of the re-timer. For example, the inversion dot at the data input of re-timer 801a-x indicates that the differential clock signal $F/2_0$ is cross-coupled to the re-timer data input. That is, the $F/2_{180}$ component of the differential clock signal is supplied to the positive data input (dP), and the $F/2_0$ component is supplied to the negative data input (dN), instead of the other way around.

Turning to generation of frequency-divided secondary phase vectors, re-timers 801a-x and 801a-y receive undivided secondary phase vectors 120/300° and 60/240° at their respective clock inputs and the in-phase and quadrature F/2 phase vectors generated by divide-flop 701a at their respective data inputs. The Div2or4or8 control signal is supplied to the enable inputs of re-timers 801a-x and 801a-y (referred to collectively as re-timers 801a) so that, when a frequency-divided set of phase vectors is desired (i.e., Div2or4or8 is high), re-timers 801a-x and 801a-y output differential clock signals $F/2_{60}$ (i.e., secondary phase vectors having frequency F/2 and complementary phase angles 60° and 240°) and $F/2_{120}$ (i.e., secondary phase vectors having frequency F/2 and complementary phase angles 120 and 300), respectively, to an input port of multiplexer 805. When Div2or4or8 is low, re-timers 801a are disabled.

Re-timers 801b-x and 801b-y receive the differential signals $F/2_{120}$ and $F/2_{60}$ generated by re-timers 801a at their respective clock inputs and the in-phase and quadrature F/4 phase vectors from divide-flop 701b at their data inputs. The Div4or8 control signal is supplied to the enable inputs of re-timers 801b so that, when a divide-by-4 or divide-by-8 set of phase vectors is desired (i.e., Div4or8 is high), re-timers 801b output differential clock signals $F/4_{60}$ and $F/4_{120}$ to an input port of multiplexer 805. When Div4or8 is low, re-timers 801b are disabled.

Re-timers 801c-x and 801c-y receive the differential signals $F/4_{120}$ and $F/4_{260}$ generated by re-timers 801b at their respective clock inputs, and the in-phase and quadrature F/4 phase vectors from divide-flop 701c at their data inputs. Control signal Div8 is supplied to the enable inputs of re-timers 801c so that, when a divide-by-8 set of phase vectors is selected (i.e., Div8 is high), re-timers 801c output differential clock signals $F/8_{60}$ and $F/8_{120}$ to an input port of multiplexer 805. When Div8 is low, re-timers 801c are disabled.

The Div4or8 and Div8 control signals are supplied to the output multiplexer 805 to control the selection of phase vectors that are output to form the primary and secondary differential phase vectors, 0°, 90°, 60° and 120°. In one embodiment, for example, the output multiplexer 805 selects between the phase vectors generated by the divide-flops 701 and re-timers 801 in accordance with the following table ('X' indicating don't care):

TABLE 1

| Div8 | Div4or8 | Out 0/180° | Out 90/270° | Out 60/240° | Out 120/300° |
|------|---------|------------|-------------|-------------|--------------|
| X | 0 | $F/2_0$ | $F/2_{90}$ | $F/2_{60}$ | $F/2_{120}$ |
| 0 | 1 | $F/4_0$ | $F/4_{90}$ | $F/4_{60}$ | $F/4_{120}$ |
| 1 | 1 | $F/8_0$ | $F/8_{90}$ | $F/8_{60}$ | $F/8_{120}$ |

Thus, the output multiplexer 805 may be implemented by four 3:1 multiplexers, each of which outputs a differential clock signal having one of three frequencies, F/2, F/4 or F/8 according to the state of the Div8 and Div4or8 control signals and having a respective one of phase angles 0°, 90°, 60° and 120°. Note that dummy loads may be coupled to the outputs of re-timers 801c-x and 801c-y or other components within the clock divider 800 for load balancing purposes.

Figure 26:
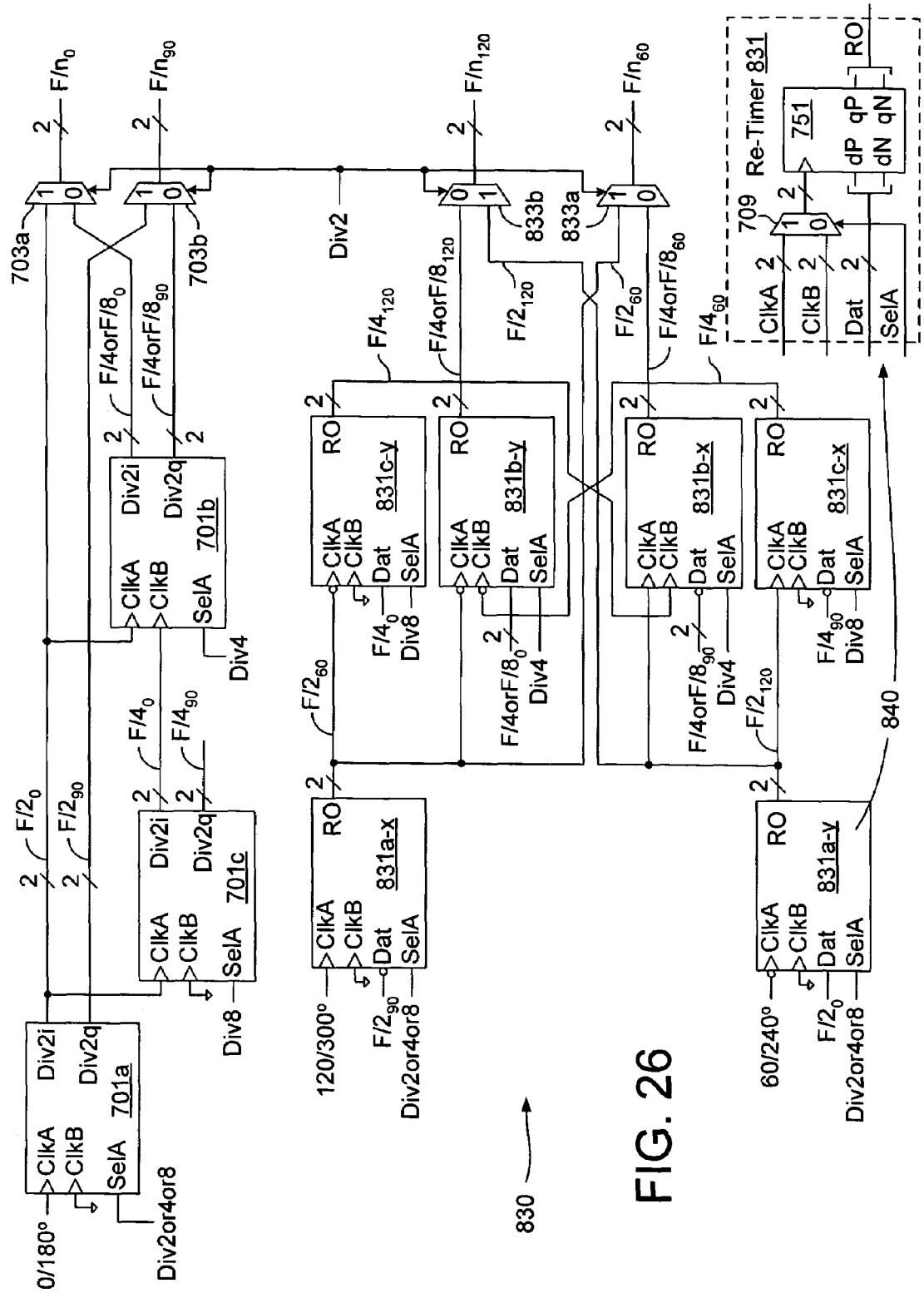
FIG. 26 illustrates an alternative embodiment of a clock divider that outputs primary and secondary phase vectors at a selected subdivided frequency with reduced output multiplexing.

FIG. 26 illustrates an alternative embodiment of a clock divider 830 that outputs primary and secondary phase vectors at a selected subdivided frequency (F/2, F/4 or F/8) using a set of 2:1 output multiplexers instead of the 3:1 output multiplexing in the embodiment of FIG. 25. As discussed above, reduced output multiplexing means less signal fan-in and therefore tends to reduce undesired signal coupling between adjacent-path signals. The clock divider 830 includes the same number of divide-flops (701a, 701b and 701c) and re-timers (831a-x, 831a-y, 831b-x, 831b-y, 831c-x and 831c-y) as in the embodiment of FIG. 25, but selection between F/4 and F/8 output vectors is effected by controlling the input timing sources for divide-flop 701b and re-timers 801b. That is, divide-flop 701b and re-timers 801b output phase vectors at either frequency F/4 or F/8 according to the input timing source selection, thereby obviating selection between F/4 and F/8 phase vectors in the output multiplexing stage.

Referring first to primary phase vector generation, divide-flop 701a is configured in the same manner as in the embodiment of FIG. 25 and therefore generates in-phase and quadrature differential clock signals having frequency F/2 (i.e., $F/2_0$ and $F/2_{90}$) when control signal Div2or4or8 is high, and is disabled when Div2or4or8 is low. Divide-flop 701c receives $F/2_0$ at its ClkA input, control signal Div8 at its select input and has a grounded ClkB input. By this arrangement, when Div8 is high, divide-flop 701c generates in-phase and quadrature differential clock signals, $F/4_0$ and $F/4_{90}$. When Div8 is low, divide-flop 701c is disabled. Divide-flop 701b receives $F/2_0$ at its ClkA input and $F/4_0$ at its ClkB input, and a control signal Div4 at its select input. Accordingly, when the Div4 signal is high (i.e., indicating that a divide-by-4 output clock frequency is desired), the $F/2_0$ phase vectors at the ClkA input are selected as the input timing source so that divide-flop 701b generates differential clock signals, $F/4_0$ and $F/4_{90}$. When the Div4 signal is low and the Div8 signal is high, the differential clock signal $F/4_0$ generated by divide-flop 701c is selected as the input timing source for divide-flop 701b so that divide-flop 701b generates differential clock signals $F/8_0$ and $F/8_{90}$. Thus, the differential clock signals generated by divide-flop 701b may have frequency F/4 or F/8 and are referred to as F/4 or $F8_0$ and F/4 or $F8_{90}$ clock signals. As mentioned, divide-flop 701c is disabled when Div8 is low. Because divide-flop 701b selects the output of divide-flop 701c as its timing source when Div4 is low, divide-flop 701b is disabled when Div4 and Div8 are both low.

The in-phase differential clock signals, $F/2_0$ and F/4 or $F/8_0$ output from divide flops 701a and 701b, respectively, are provided to respective input ports of 2:1 multiplexer 703a, and the quadrature differential clock signals, $F/2_{90}$ and F/4 or $F/8_{90}$ are likewise provided to respective input ports of 2:1 multiplexer 703b. Control signal Div2 is supplied to a select input of the multiplexers 703a and 703b and therefore, when raised to select a divide-by-2 output clock frequency, enables multiplexers 703a and 703b to output the $F/2_0$ and $F/2_{90}$ clock signals from the clock divider 830 and, when lowered, enables multiplexers 703a, 703b to output the F/4 or $F/8_0$ and F/4 or $F/8_{90}$ clock signals.

Turning to generation of secondary phases, each of the re-timers 831 is constructed similarly to re-timers 801 of FIG. 25 except that, as shown in detail view 840, an additional differential clock input, ClkB, is provided at the second input of multiplexer 709 (i.e., instead of tying the input to ground) so that the enable input of re-timer 801 becomes a select input (SelA) in re-timer 831 to select either clock source ClkA or ClkB to be provided to the differential flip-flop 751. Re-timer 801 of FIG. 25 may thus be viewed as an instance of re-timer 831 with a grounded ClkB input.

Re-timers 831a-x and 831a-y are configured in the same manner as counterpart re-timers 801a-x and 801a-y of FIG. 25 and thus generate differential clock signals $F/2_{60}$ and $F/2_{120}$ when Div2or4or8 is high. When Div2or4or8 is low, re-timers 831a-x and 831a-y are disabled. Re-timers 831c-x and 831c-y are coupled to receive the differential clock signals $F/2_{120}$ and $F/2_{60}$ generated by re-timers 831a-x and 831a-y at their respective ClkA inputs, the $F/4_0$ and $F/4_{90}$ differential clock signals (i.e., from the in-phase and quadrature outputs of divide-flop 701c) at their respective data inputs, the Div8 control signal at their select inputs, and have grounded ClkB inputs. Re-timers 831b-x and 831b-y are coupled to receive the differential clock signals $F/2_{120}$ and $F/2_{60}$ generated by re-timers 831a-x and 831a-y at their respective ClkA inputs, the outputs of re-timers 831c-y and 831c-x at their respective ClkB inputs, the F/4 or $F/8_0$ and F/4 or $F/8_{90}$ differential clock signals (i.e., from the in-phase and quadrature outputs of divide-flop 701b) at their respective data inputs, and the Div4 control signal at their select inputs. By this arrangement, when Div4 is high and Div8 is low, re-timers 831c-x and 831c-y are disabled, and re-timers 831b-x and 831b-y generate $F/4_{60}$ and $F/4_{120}$ differential clock signals, respectively, by sampling the $F/4_{90}$ and $F/4_0$ clock signals output from divide-flop 701b (i.e., clock signals F/4 or $F8_0$ and F/4 or $F8_{90}$ have frequency F/4 when Div8 is low and Div4 is high) in response to the $F/2_{120}$ and $F/2_{60}$ differential clock signals output by re-timers 831a-y and 831a-x. When Div8 is high and Div4 is low, re-timers 831c-y and 831c-x output differential clock signals $F/4_{120}$ and $F/4_{60}$ to the ClkB inputs of re-timers 831b-x and 831b-y, respectively. Re-timers 831b-x and 831b-y, in turn, generate $F/8_{60}$ and $F/8_{120}$ differential clock signals, respectively, by sampling the $F/8_{90}$ and $F/8_0$ clock signals output from divide flop 701b (i.e., clock signals F/4 or $F/8_0$ and F/4 or $F/8_{90}$ have frequency F/8 when Div8 is high and Div4 is low) in response to the $F/4_{120}$ and $F/4_{60}$ differential clock signals output from re-timers 831c-y and 831c-x. Thus, the re-timers 831b-x and 831b-y output 60° and 120° differential clock signals, respectively, at frequency F/4 or at frequency F/8, according to the state of control signals Div4 and Div8. Thus, the differential clock signals output from re-timers 831b-x and 831b-y may have frequency F/4 or F/8 and are referred to as F/4 or $F8_{60}$ and F/4 or $F8_{120}$ clock signals.

The differential clock signals $F/2_{60}$ and F/4 or $F/8_{60}$ output from re-timers 831a-x and 831b-x are supplied to respective inputs of a 2:1 multiplexer 833a, and the differential clock signals $F/2_{120}$ and F/4 or $F/8_{120}$ output from re-timers 831a-y and 831b-y are supplied to respective inputs of 2:1 multiplexer 833b. Control signal Div2 is supplied to the select inputs of multiplexers 833a and 833b so that, when a divide-by-2 phase vector set is desired (i.e., Div2 is high), differential clock signals $F/2_{60}$ and $F/2_{120}$ are selected to be output from the clock divider 830 along with differential clock signals $F/2_0$ and $F/2_{90}$. When Div2 is low, indicating that either a divide-by-4 or divide-by-8 phase vector set is desired, differential clock signals F/4 or $F/8_{60}$ and F/4 or $F/8_{120}$ are selected to be output from the clock divider 830 along with the differential clock signals F/4 or $F/8_0$ and F/4 or $F/8_{90}$. As discussed, the determination of whether the F/4 or F/8 differential clock signals have frequency F/4 or F/8 is established by the timing source selection at the inputs of divide-flop 701b and re-timers 831b so that the overall selection between one of three subdivided clock frequencies may be effected using only a 2:1 multiplexing stage.

As in the embodiment of FIG. 25, dummy load elements may be coupled to outputs of selected divide-flops and/or re-timers to achieve a balanced loading of all clock signal paths. Also, more or fewer frequency division factors (including different frequency division factors), more or fewer phase vectors and phase vectors having different phase angles may be generated by the clock dividers of FIGS. 25 and 26 in alternative embodiments. Further, the input clock selection technique used to reduce output multiplexing in the embodiment of FIG. 26 may be extended to avoid output multiplexing altogether in alternative embodiments. As an example, divide-flop 701b may be modified to include a 3:1 clock selection multiplexer that selects between the undivided 0/180° input ($F_0$) in addition to the outputs of divide-flops 701a and 701b, thereby generating in-phase and quadrature output clock signals having frequency F/2, F/4 or F/8. Similarly, re-timers 831b-x and 831b-y may be modified to include 3:1 clock selection multiplexers that select between the undivided 60/240° and 120/300° differential clock signals as well as the outputs of re-timers 831c and re-timers 831a, thereby generating 60/240° and 120/300° output clock signals having frequency F/2, F/4 or F/8. In other embodiments, output multiplexing may be reduced without modifying the divide-flops 701 and re-timers 831, for example, by generating F/2 differential clock signals in divide-flop 701a, selecting between undivided (F) and F/2 differential clock signals in divide-flop 701c to produce F/2 or F/4 differential clock signals, then selecting between the undivided differential clock signals and the F/2 or F/4 clock signals in divide-flop 701b to produce in-phase and quadrature differential clock signal having frequency F/2, F/4 or F/8 (i.e., F/2 or F/4 or $F/8_0$ and F/2 or F/4 or $F/8_{90}$). Similarly, re-timers 831c may select between undivided differential clock signals (F) and the F/2 differential clock signals provided by re-timers 831 a to deliver F/2 or F/4 differential clock signals to clock inputs of re-timers 831b. Re-timers 831b may additionally receive the undivided differential clock signals at their second clock inputs, and therefore select between the undivided differential clock signals and the F/2 or F/4 clock signals to produce differential clock signals having 60° and 120° phase angles at frequency F/2, F/4 or F/8 (i.e., F/2 or F/4 or $F/8_{60}$ and F/2 or F/4 or $F/8_{120}$).

Figure 27:
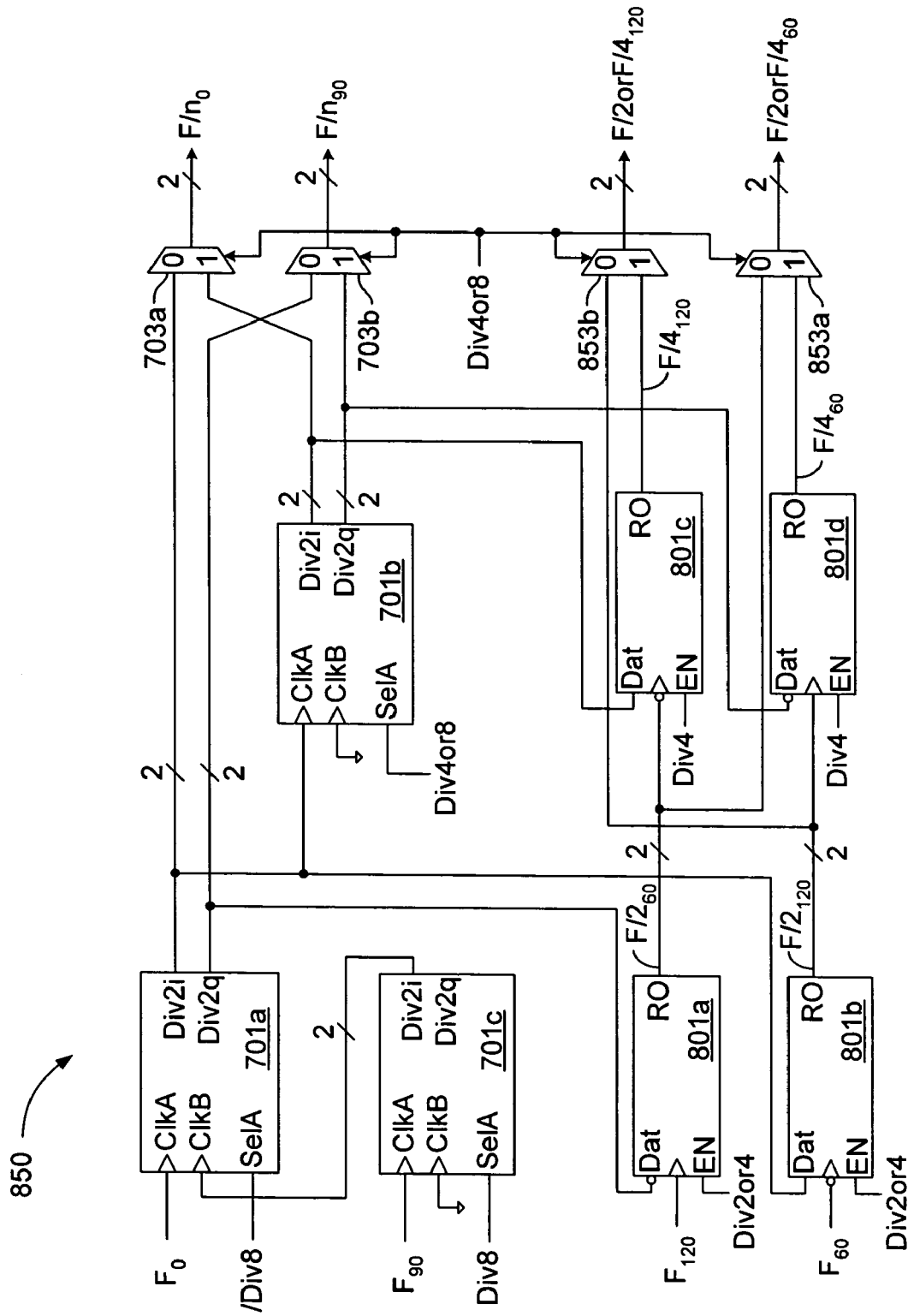
FIG. 27 illustrates an alternative embodiment of a clock divider that outputs primary and secondary phase vectors at a selected subdivided frequency.

In some applications, a full complement of primary and/or secondary phase vectors may not be needed at all selectable frequencies, thus enabling some circuit optimizations. For example, in the clock divider embodiment 850 depicted in FIG. 27, secondary phase vectors having frequency F/8 are not generated, enabling the clock divider 850 to be implemented with fewer re-timers 801 than in the embodiments of FIGS. 25 and 26. In the particular embodiment shown, divide-flops 701a, 701b, 701c and multiplexers 703a and 703b are configured as described in reference to FIG. 21 to generate in-phase and quadrature phase vectors having frequency F/2, F/4 or F/8. When a divide-by-2 or divide-by-four phase vector set is selected (i.e., Div2or4 is high and Div8 is low), the in-phase and quadrature phase vectors output from divide-flop 701a have frequency F/2 and are provided to the data inputs of re-timers 801b and 801a, respectively. Re-timers 801a and 801b additionally receive differential clock signals $F_{120}$ and $F_{60}$ at their respective clock inputs and the Div2or4 control signal at their enable inputs. By this arrangement, re-timers 801a and 801b generate differential clock signals $F/2_{60}$ and $F/2_{120}$ when Div2or4 is high (i.e., indicating that a divide-by-2 or divide-by-4 set of phase vectors is desired) and are disabled when Div2or4 is low. Re-timers 801c and 801d receive the differential clock signals output from re-timers 801a and 801b at their respective clock inputs and receive the in-phase and quadrature differential clock signals output from divide-flop 701b at their respective data inputs. When a divide-by-4 set of output phase vectors is desired, control signal Div4 is raised to enable re-timers 801c and 801d to sample the in-phase and quadrature differential clock signals output from divide-flop 701b (such signals having frequency F/4 as divide flop 701c is disabled, and divide-flop 701a generates in-phase and quadrature differential clock signals at frequency F/2) in response to the $F/2_{60}$ and $F/2_{120}$ differential clock signals output from re-timers 801a and 801b, respectively. Thus, when Div4 is high, re-timers 801c and 801d generate differential clocks signals $F/4_{120}$ and $F/4_{60}$, respectively. When Div4 is low, re-timers 801c and 801d are disabled. The differential clock signals $F/2_{60}$ and $F/4_{60}$ output from re-timers 801a and 801d are supplied to respective inputs of multiplexer 853a, and the differential clock signals $F/2_{120}$ and $F/4_{120}$ output from re-timers 801b and 801c are supplied to respective inputs of multiplexer 853b. Select inputs of multiplexers 853a and 853b are coupled to receive the Div4or8 control signal so that, when Div4or8 is low (indicating a divide-by-2 selection), the $F/2_{60}$ and $F/2_{120}$ differential clock signals are output from the clock divider 850 along with the $F/2_0$ and $F/2_{90}$ clock signals generated by divide-flop 701a. When Div4or8 is high and Div8 is low, the $F/4_{60}$ and $F/4_{120}$ differential clock signals are output from the clock divider 850 along with the $F/4_0$ and $F/4_{90}$ differential clock signals output from divide flip 701b. Lastly, when Div4or8 is high and Div8 is high, the re-timers 801a-801d are disabled so that the outputs of multiplexers 853a and 853b do not toggle. That is, only $F/8_0$ and $F/8_{90}$ differential clock signals are output from the clock divider 850.

Figure 28:
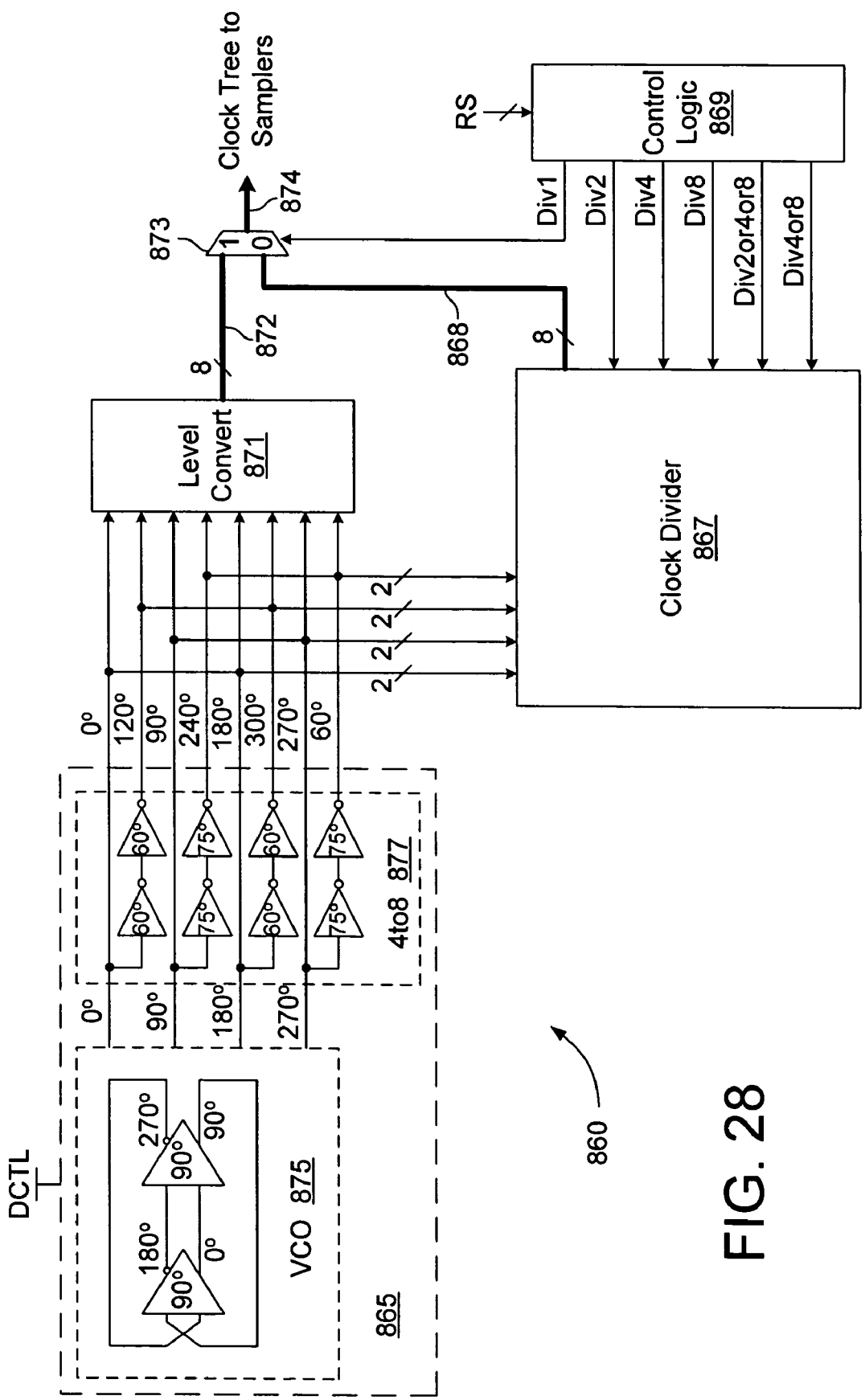
FIG. 28 illustrates an exemplary clock generator including a reference phase generator according to the embodiments described in reference to FIGS. 14-18 and a clock divider having component divider and re-timing circuits according to the embodiments described in reference to FIGS. 19-27.

FIG. 28 illustrates an exemplary clock generator 860 including a reference phase generator 865 according to the embodiments described in reference to FIGS. 14-18 and a clock divider 867 having component divider and re-timing circuits according to the embodiments described in reference to FIGS. 19-27. As shown, the reference phase generator 865 includes a VCO 875 to generate primary phase vectors (0/180°, 90/270°), and also includes a set of scaled delay elements 552, 554 which form a 4-to-8 converter 877 for generating secondary phase vectors (60/240°, 120/300°) from the primary phase vectors. Although specific combinations of 60° and 75° degree delay elements are shown in the 4-to-8 converter 877, any of the various combinations of scaled delay elements discussed above may alternatively be used. The delay elements in both the VCO 875 and the 4-to-8 converter 877 are controlled by a common delay control signal (DCTL) which may be generated as discussed above in reference to FIG. 15. In one embodiment, the primary and secondary phase vectors generated within the reference phase generator 865 are small-swing signals which may be converted to logic-level signals (e.g., CMOS signal levels) in a level converter 871.

Still referring to FIG. 28, a control logic circuit 869 receives a multi-bit rate select signal, RS, that specifies a desired output clock frequency which, in the exemplary embodiment of FIG. 28, may be the reference loop frequency F, or one of the subdivided frequencies F/2, F/4 or F/8. Other output clock frequencies may be selected in alternative embodiments. The control logic 869 outputs a set of control signals Div2, Div4, Div8, Div4or8 and Div2or4or8 to the clock divider 867 to control the clock division therein (e.g., as described in reference FIGS. 25-27), thereby enabling the clock divider 867 to output a set of phase vectors 868 having frequency F/2, F/4 or F/8 and phase angles 0/180°, 90/270°, 60/240° and 120/300°. As discussed above, more or fewer phase vectors having different phase angles and/or frequencies may be generated by the clock divider 867 in alternative embodiments. The control logic 869 further outputs a Div1 control signal to a multiplexer 873 to select either the unity phase vectors 872 from the level converter 871 (Div1='1') or the frequency-divided phase vectors 868 from the clock divider 867 (Div1='0') to be output to from the clock generator 860 as a set of output clock signals 874. The output clock signals 874 may be provided, for example, to a clock tree (e.g., if necessary to provide clock signal fan-out) and from the clock tree to a set of sampling circuits or to any other circuits in which multi-phase clocking may be used.

The control logic 869 may be implemented, for example, by a 2:4 decoder to assert one of four signals (Div1, Div2, Div4 or Div8) according to the state of a two-bit rate select signal. The remaining Div4or8 and Div2or4or8 signals and complements thereof may be synthesized from the outputs of the 2:4 decoder (e.g., using OR gates, inverters, etc.). Also, in alternative embodiments, one or more of the control signals may be unneeded and therefore not generated by the control logic 869.

Signaling System having a Wide-Range Multi-Phase Clock Generator

Figure 29:
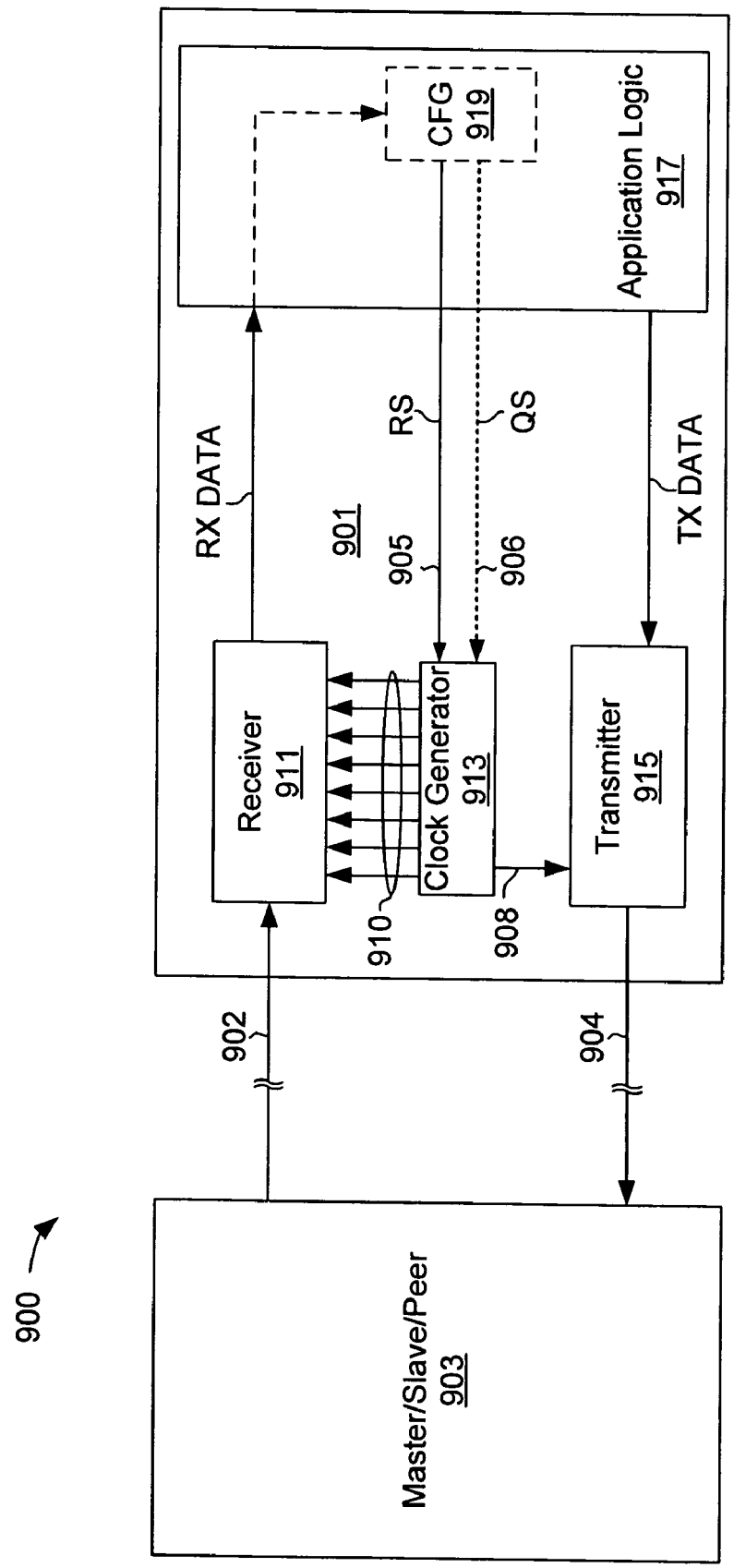
FIG. 29 illustrates a signaling system in which clock generators according to the embodiments of FIGS. 1-28 may be employed.

FIG. 29 illustrates a signaling system 900 in which clock generators according to the embodiments of FIGS. 1-28 may be employed. The system 900 may, for example, form part of a computing device (e.g., mobile, desktop or larger computer), networking equipment (e.g., switch, router, etc.), consumer electronics device (e.g., telephone, personal digital assistant (PDA), etc.), or any other type of device in which wide-frequency-range clock generation is desired.

The system includes a pair of integrated circuits (ICs) 901 and 903 coupled to one another via signal paths 902 and 904. In the embodiment shown, the signal paths 902 and 904 are unidirectional high speed serial links for conducting serialized transmissions from one IC to the other. In alternative embodiments, either or both of the links may be bi-directional, and multiples of such signal paths may be provided to enable transmission of parallel groups of bits (e.g., each group of bits forming a data or control word (e.g., command, address, etc.) or portion of a data or control packet). The ICs 901 and 903 may be peers (e.g., each IC being capable of independently initiating a signal transmission to the other), or master and slave. Also, the relative status of the ICs 901 and 903 may change from time-to-time such that one IC is a master at a first time, then a slave at another time, and/or a peer at another time.

IC 901 is shown in simplified block diagram form and includes a wide range clock generator 913, variable data-rate signal receiver 911, variable data-rate signal transmitter 915 and application logic 917. The clock generator 913 outputs a set of sampling clock signals 910 (i.e., output clock signals) to the variable-rate receiver 911 to time data and/or edge sampling operations therein. The sampling clock signals 910 correspond to the clock generator output clock signals discussed above in reference to FIGS. 1-13 and have a desired frequency and phase offset in accordance with a rate select signal 905 and, if variable-phase operation is desired, a phase offset signal 906 supplied by the application logic 917. Though not specifically shown in FIG. 29, edge samples may be provided from the receiver 911 to the clock generator 913 for clock-data-recovery purposes, as discussed above. The clock generator 913 additionally outputs one or more transmit clock signals 918 to the transmitter 915 to time data transmission operations therein. The transmit clock signals may be free running clock signals, for example, generated by a VCO within the clock generator 913, or may be phase aligned with one or more of the sampling clock signals 910 supplied to the receiver 911. Also, the transmit clock signals 908 may be frequency-divided in accordance with the rate select signal 905 and/or phase offset signal 906 supplied by the application logic circuit 917.

Data recovered by the variable-rate receiver 911 is provided to the application logic 917 as receive data (RX DATA), and the application logic 917 outputs transmit data (TX DATA) to variable-rate transmitter 915 for transmission on path 904. Because the transmit clock signals and sampling clock signals generated by the clock generator 913 may have different frequencies, different transmit and receive data rates may be selected.

In the embodiment of FIG. 29, a configuration circuit 919 (e.g., run-time programmable register, non-volatile storage, fused storage, etc.) within the application logic 917 is used to store a first rate select value that is output to the clock generator 913 as rate select signal 905 and used within the clock generator 913 to establish the frequency of the sampling clock signals 910. The configuration circuit 919 may additionally store a phase offset value that is output to the clock generator 913 as phase offset signal 906 to control the phase offset of the sampling clock signals 910. The rate select signal 905 and phase offset signal 906 may additionally or alternatively be used to establish the frequency and phase offset of the transmit clock signal 908, or separate frequency and/or phase offset information may be stored within the configuration circuit 919 and output to the clock generator 913 to set the frequency and/or phase offset of the transmit clock signal 908. In one embodiment, the IC 903 is designed and/or programmed to issue one or more configuration commands (or requests or instructions) to the IC 901 to store one or more rate-select and/or phase offset values in the configuration circuit 919. Each rate-select value and/or phase offset value may be provided, for example, in an operation code of the configuration command or as associated operand data. The application logic 917 responds to the configuration commands by storing the indicated rate select and/or phase offset values within the configuration circuit 919, and issuing corresponding rate select signals 905 and/or phase offset signals 906 to the clock generator 913. At system power up the IC 901 may default to a predetermined rate select and/or phase offset setting to enable reliable communication of configuration commands and associated rate select and/or phase offset values. Alternatively, out of band signaling (e.g., by a separate path or protocol) may be used to communicate the rate select and/or phase offset values to the IC 901. Note that the configuration circuit 919 may be located elsewhere in the IC 901 in alternative embodiments.

Although two ICs 901 and 903 are shown in FIG. 29, the circuits within each of the ICs may alternatively be implemented in a single IC (e.g., in a system-on-chip or similar construct), with signal paths 902 and 904 being routed via one or more metal layers or other signal conducting structures fabricated within the IC. Also, if distinct ICs are used as shown in FIG. 29, the ICs may be packaged in separate IC packages (e.g., plastic or ceramic encapsulation, bare die package, etc.) or in a single IC package (e.g., multi-chip module, paper thin package (PTP), etc.).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. An integrated circuit device comprising:
   a clock generating circuit to generate a plurality of first clock signals each having a first frequency and a respective one of a plurality of different phase angles;
   a frequency divider circuit coupled to receive the plurality of first clock signals and configured to generate a plurality of second clock signals each having a second frequency and a respective one of the plurality of different phase angles; and
   a plurality of multiplexers each having a first input coupled to receive a respective one of the first clock signals and a second input coupled to receive a respective one of the second clock signals having substantially the same phase angle as the one of the first clock signals.

2. The integrated circuit device of claim 1 wherein the clock generating circuit comprises a plurality of inverter stages coupled in a ring.

3. The integrated circuit device of claim 1 wherein the frequency divider circuit comprises a plurality of divide-by-two circuits each to generate at least one of the plurality of second clock signals.

4. The integrated circuit device of claim 1 wherein each of the first clock signals is phase offset from a reference phase by a respective time interval, and wherein each phase angle of the respective phase angles of the first clock signals is defined by a ratio of the respective time interval and a cycle time defined by the first frequency.

5. The integrated circuit device of claim 4 wherein each of the second clock signals is phase offset from the reference phase by a respective time interval, and wherein each phase angle of the respective phase angles of the second clock signals is defined by a ratio of the corresponding time interval and a cycle time defined by the second frequency.

6. The integrated circuit device of claim 5 wherein the one of the first clock signals received at a first input of one of the plurality of multiplexers is phase offset from the reference phase by a first time interval and the one of the second clock signals received at the second input of the one of the plurality of multiplexers is phase offset from the reference phase by a second time interval.

7. The integrated circuit device of claim 6 wherein the first frequency is substantially equal to twice the second frequency and wherein the first time interval is substantially equal to half the second time interval.

8. The integrated circuit device of claim 6 wherein the first frequency is substantially equal to four times the second frequency and wherein the first time interval is substantially equal to one-fourth the second time interval.

9. The integrated circuit device of claim 1 wherein each of the plurality of multiplexers is configured to output, according to a control signal state, either the first clock signals or the second clock signals.

10. The integrated circuit device of claim 1 wherein the frequency divider circuit is further configured to generate a plurality of third clock signals each having a third frequency and a respective one of the plurality of different phase angles, and wherein each of the plurality of multiplexers further has a third input coupled to receive a respective one of the third clock signals having substantially the same phase angle as the one of the third clock signals.

11. An integrated circuit device comprising:
    a first clock generator to generate a plurality of reference clock signals;
    a first plurality of interpolators coupled to receive respective pairs of the reference clock signals and configured to generate respective interpolated clock signals;
    a plurality of divider circuits coupled respectively to receive the interpolated clock signals and configured to frequency-divide the interpolated clock signals to generate respective reduced-frequency clock signals; and
    a plurality of multiplexer circuits each coupled to receive a respective one of the reference clock signals and a plurality of the reduced-frequency clock signals.

12. The integrated circuit device of claim 11 further comprising a second plurality of interpolators, each having first and second clock signal inputs coupled in common to receive a respective one of the reference clock signals and each configured to generate a delayed version of the respective one of the reference clock signals.

13. The integrated circuit device of claim 12 wherein the respective one of the reference clock signals received by each of the plurality of multiplexer circuits is the delayed version of the respective one of the reference clock signals.

14. The integrated circuit device of claim 11 wherein a first interpolator of the first plurality of interpolators is configured to combine the received pair of reference clock signals in accordance with an interpolation control value to generate an interpolated clock signal having a phase angle that falls in a range bounded by phase angles of the received pair of reference clock signals.

15. The integrated circuit device of claim 14 further comprising a rate control circuit coupled to the first plurality of interpolators and configured to set the interpolation control value to one of a plurality of values based, at least in part, on a state of a rate select signal.

16. The integrated circuit device of claim 15 wherein the rate control circuit is further configured to set the interpolation control value based, in part, on the state of a phase offset signal, the phase offset signal indicating a desired phase offset of at least one of the reduced-frequency clock signals.

17. The integrated circuit device of claim 14 further comprising a rate control circuit coupled to the first plurality of interpolators and configured to select, according to a state of a rate select signal, one of a plurality of values to be the interpolation control value.

18. A method of operation within an integrated circuit device, the method comprising:
    generating a plurality of first clock signals having a first frequency and respective phase angles;
    generating a plurality of second clock signals having a second frequency and respective phase angles that substantially match the phase angles of the first clock signals; and
    selecting, according to the state of a rate select signal, the either the first clock signals or the second clock signals to be output as a selected set of clock signals.

19. The method of claim 18 wherein said generating the plurality of second clock signals comprises frequency-dividing a subset of the first clock signals.

20. The method of claim 19 wherein said frequency-dividing the subset of the first clock signals comprises dividing a first one of the first clock signals having frequency, F, and phase angle, A, by a divisor value, N, to generate one of the second clock signals having frequency, F/N, and phase angle, A/N.

21. The method of claim 20 wherein said selecting either the first clock signals or the second clock signals to be output as a selected set of clock signals comprises selecting between a second one of the first clock signals having frequency, F, and phase angle, A/N, and the one of the second clock signals having frequency F/N, and phase angle, A/N.

22. A method of generating an output clock signal, the method comprising:
   receiving a first signal that indicates a divisor value;
   receiving a second signal that indicates a desired phase angle of the output clock signal;
   multiplying the divisor value and the phase angle to generate a divisor-multiplied phase angle;
   interpolating between first and second reference clock signals to generate an interpolated clock signal having the divisor-multiplied phase angle; and
   frequency-dividing the interpolated clock signal according to the divisor value to generate the output clock signal.

23. The method of claim 22 wherein receiving a first signal that indicates a divisor value comprises receiving a rate select signal that indicates one of a plurality of output clock signal frequencies.

24. The method of claim 22 wherein multiplying the divisor value and the phase offset to generate a divisor-multiplied phase angle comprises left shifting the phase angle in accordance with the first signal.

25. The method of claim 22 further comprising selecting the first and second reference clock signals from a set of more than two reference clock signals based on the value of the divisor-multiplied phase angle.

26. Computer-readable media having stored therein
   a data structure that includes a description of an apparatus, the data structure comprising:
   data representing a first clock generator to generate a plurality of reference clock signals;
   data representing first plurality of interpolators coupled to receive respective pairs of the reference clock signals and configured to generate respective interpolated clock signals;
   data representing a plurality of divider circuits coupled respectively to receive the interpolated clock signals and configured to frequency-divide the interpolated clock signals to generate respective reduced-frequency clock signals; and
   data representing a plurality of multiplexer circuits each coupled to receive a respective one of the reference clock signals and a plurality of the interpolated clock signals.

27. An integrated circuit device comprising:

means for generating a plurality of first clock signals having a first frequency and respective phase angles;

means for generating a plurality of second clock signals having a second frequency and respective phase angles that substantially match the phase angles of the first clock signals; and means for selecting, according to a state of a rate select signal, the either the first clock signals or the second clock signals to be output as a selected set of clock signals.

* * * * *